US011392042B2

United States Patent
Shimoyama

(10) Patent No.: US 11,392,042 B2
(45) Date of Patent: *Jul. 19, 2022

(54) EXPOSURE APPARATUS AND EXPOSURE METHOD, AND FLAT PANEL DISPLAY MANUFACTURING METHOD

(71) Applicant: NIKON CORPORATION, Tokyo (JP)

(72) Inventor: Takachika Shimoyama, Yokohama (JP)

(73) Assignee: NIKON CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/733,822

(22) Filed: Jan. 3, 2020

(65) Prior Publication Data

US 2020/0142320 A1 May 7, 2020

Related U.S. Application Data

(63) Continuation of application No. 15/763,579, filed as application No. PCT/JP2016/078809 on Sep. 29, 2016, now Pat. No. 10,585,355.

(30) Foreign Application Priority Data

Sep. 30, 2015 (JP) .............................. JP2015-194828

(51) Int. Cl.
*G03F 7/20* (2006.01)
*G02F 1/13* (2006.01)

(52) U.S. Cl.
CPC ........ *G03F 7/70191* (2013.01); *G02F 1/1303* (2013.01); *G03F 7/70775* (2013.01)

(58) Field of Classification Search
CPC ...... G02F 1/1303; G03F 7/20; G03F 7/70191; H01L 21/68
See application file for complete search history.

(56) References Cited

U.S. PATENT DOCUMENTS 5,610,715 A 3/1997 Yoshii et al.
5,729,331 A 3/1998 Tanaka et al.
(Continued)

FOREIGN PATENT DOCUMENTS

CN 104838469 A 8/2015
TW 201100976 A 1/2011
(Continued)

OTHER PUBLICATIONS

Dec. 27, 2016 International Search Report issued in International Patent Application No. PCT/JP2016/078809.
(Continued)

*Primary Examiner* — Deoram Persaud
(74) *Attorney, Agent, or Firm* — Oliff PLC

(57) ABSTRACT

A liquid crystal exposure apparatus has a measurement system having scales arranged apart from each other in the X-axis direction provided at a substrate stage holding a substrate and heads each irradiating the scales with a measurement beam; and a measurement device that measures positions of head units in the Y-axis direction. The measurement system measures a position of the substrate holder in directions of three degrees of freedom within a plane, based on measurement information of at least three heads. Each of the heads move off of one scale while the substrate holder is moved in the X-axis direction and moves to irradiate another scale adjacent to the one scale, and correction information to control movement of the substrate holder using the head moving to irradiate another scale is acquired, based on measurements of at least three heads.

7 Claims, 20 Drawing Sheets

(56) References Cited

U.S. PATENT DOCUMENTS

| | | |
|---|---|---|
| 6,552,775 B1 | 4/2003 | Yanagihara et al. |
| 6,639,686 B1 | 10/2003 | Ohara |
| 7,161,659 B2 | 1/2007 | Van Den Brink et al. |
| 7,256,871 B2 | 8/2007 | Loopstra et al. |
| 7,561,280 B2 | 7/2009 | Schluchter et al. |
| 8,493,547 B2 | 7/2013 | Shibazaki |
| 8,792,079 B2 | 7/2014 | Shibazaki |
| 9,360,772 B2 | 6/2016 | Shibazaki |
| 10,048,600 B2 | 8/2018 | Shirato |
| 2007/0052976 A1 | 3/2007 | Pril et al. |
| 2007/0076218 A1* | 4/2007 | Van Empel ......... G03F 7/70891 356/509 |
| 2008/0030702 A1 | 2/2008 | Kawamura |
| 2008/0094592 A1 | 4/2008 | Shibazaki |
| 2008/0129762 A1 | 6/2008 | Shiomi |
| 2010/0018950 A1 | 1/2010 | Aoki et al. |
| 2010/0157263 A1* | 6/2010 | Van Eijk ............... G03F 7/7085 355/53 |
| 2010/0266961 A1 | 10/2010 | Kawamura et al. |
| 2011/0096311 A1 | 4/2011 | Butler et al. |
| 2012/0057140 A1 | 3/2012 | Aoki |
| 2014/0307246 A1* | 10/2014 | Schuster ................. G03F 1/62 355/72 |
| 2015/0286147 A1 | 10/2015 | Shibazaki |
| 2018/0284619 A1 | 10/2018 | Shirato et al. |
| 2018/0348652 A1 | 12/2018 | Hara |
| 2018/0356739 A1 | 12/2018 | Aoki et al. |

FOREIGN PATENT DOCUMENTS

| | | |
|---|---|---|
| WO | 2010/131485 A1 | 11/2010 |
| WO | 2014/054690 A1 | 4/2014 |

OTHER PUBLICATIONS

Dec. 27, 2016 Written Opinion issued in International Patent Application No. PCT/JP2016/078809.

Apr. 3, 2019 Office Action issued in U.S. Appl. No. 15/763,579.

Nov. 25, 2019 Office Action issued in Chinese Patent Application No. 201680057223.9.

Oct. 4, 2019 Notice of Allowance issued in U.S. Appl. No. 15/763,579.

Jul. 17, 2020 Office Action issued in Taiwanese Patent Application No. 105131972.

Sep. 18, 2020 Office Action issued in Chinese Patent Application No. 201680057223.9.

Sep. 21, 2021 Office Action issued in Japanese Patent Application No. 2021-007039.

* cited by examiner

EXPOSURE APPARATUS AND EXPOSURE METHOD, AND FLAT PANEL DISPLAY MANUFACTURING METHOD

This is a Continuation of U.S. application Ser. No. 15/763,579 filed Aug. 9, 2018, which is a 371 of International Application No. PCT/JP2016/078809 filed Sep. 29, 2016, which claims the benefit of Japanese Patent Application No. 2015-194828 filed Sep. 30, 2015. The disclosures of the prior applications are hereby incorporated by reference herein in their entireties.

TECHNICAL FIELD

The present invention relates to exposure apparatuses and exposure methods, and flat panel display manufacturing methods, and more particularly, to an exposure apparatus and an exposure method used in a lithography process for producing micro-devices such as a liquid crystal display device, and a flat panel display manufacturing method using the exposure apparatus and the exposure method.

BACKGROUND ART

Conventionally, in a lithography process for producing electronic devices (micro-devices) such as a liquid crystal display device or a semiconductor device (such as an integrated circuit), exposure apparatuses are used such as an exposure apparatus of a step-and-scan method (a so-called scanning stepper (also called a scanner)) that transfers a pattern formed on a mask irradiated with an energy beam, while a mask (photomask) or a reticle (hereinafter collectively called a "mask") and a glass plate or a wafer (hereinafter collectively called a "substrate") are moved synchronously along a predetermined scanning direction (scan direction).

As this type of exposure apparatus, an exposure apparatus equipped with an optical interferometer system is known that obtains position information within a horizontal plane of a substrate subject to exposure using a bar mirror (long mirror) that a substrate stage device has (refer to PTL 1).

Here, in the case of obtaining position information of the substrate using the optical interferometer system, influence of the so-called air fluctuation cannot be ignored. While the influence of air fluctuation mentioned above can be reduced using an encoder system, due to the increasing size of substrates in recent years, it is becoming difficult to prepare a scale that can cover the entire moving range of the substrate.

CITATION LIST

Patent Literature

[PTL 1] U.S. Patent Application Publication No. 2010/0266961

SUMMARY OF INVENTION

According to a first aspect of the present invention, there is provided an exposure apparatus that irradiates an object with an illumination light via an optical system, comprising: a movable body arranged below the optical system that holds the object; a drive system that can move the movable body in a first direction and a second direction orthogonal to each other within a predetermined plane orthogonal to an optical axis of the optical system; a measurement system that has a grating member with a plurality of grating areas arranged mutually apart in the first direction, a plurality of heads each irradiating the grating member with a measurement beam that can move in the second direction, and a measurement device that measures position information of the plurality of heads in the second direction, in which one of the grating member and the plurality of heads is provided at the movable body, along with the other of the grating member and the plurality of heads being provided facing the movable body, and the measurement system, measuring position information of the movable body in at least directions of three degrees of freedom within the predetermined plane, based on measurement information of at least three heads of the plurality of heads irradiating at least one of the plurality of grating areas with the measurement beam and measurement information of the measurement device; and a control system that controls the drive system based on position information measured by the measurement system, wherein the measurement beam of each of the plurality of heads moves off of one of the plurality of grating areas, and moves to irradiate another grating area adjacent to the one grating area while the movable body is being moved in the first direction, and the control system acquires correction information to control movement of the movable body using, of the plurality of heads, a head whose measurement beam has moved off of the one grating area and moves to irradiate the another grating area and is a different head from the at least three heads, based on measurement information of the at least three heads, or position information of the movable body measured using the at least three heads.

According to a second aspect of the present invention, there is provided an exposure apparatus that irradiates an object with an illumination light via an optical system, comprising: a movable body arranged below the optical system that holds the object; a drive system that can move the movable body in a first direction and a second direction orthogonal to each other within a predetermined plane orthogonal to an optical axis of the optical system; a measurement system, having a grating member with a plurality of first grating areas arranged mutually apart in the first direction and a plurality of second grating areas arranged mutually apart in the first direction at positions different from the plurality of first grating areas in the second direction, a plurality of heads irradiating the grating member with a measurement beam from each of the heads that can move in the second direction, and a measurement device that measures position information of the plurality of heads in the second direction, in which one of the grating member and the plurality of heads is provided at the movable body, along with the other of the grating member and the plurality of heads being provided facing the movable body, and the measurement system measuring position information of the movable body in at least directions of three degrees of freedom within the predetermined plane, based on measurement information of at least three heads of the plurality of heads irradiating at least two of the plurality of first grating areas and the plurality of second grating areas with the measurement beam and measurement information of the measurement device; and a control system that controls the drive system based on position information measured by the measurement system, wherein the measurement beam of each of the plurality of heads moves off of one grating area of the plurality of first grating areas or the plurality of second grating areas, and moves to irradiate one grating area of another first grating area or another second grating area adjacent to the one grating area of the first grating area or the second grating area while the movable body is being moved in the first direction, and the control system acquires correction information to control movement of the movable body using, of the plurality of heads, a head whose measurement beam has moved off of one grating area of the plurality of first grating areas or the plurality of second grating areas and moves to irradiate the another first grating area or the another second grating area and is a different head from the at least three heads, based on measurement information of the at least three heads, or position information of the movable body measured using the at least three heads.

According to a third aspect of the present invention, there is provided a flat panel display manufacturing method, comprising: exposing a substrate using the exposure apparatus according to one of the first aspect and the second aspect; and developing the substrate that has been exposed.

According to a fourth aspect of the present invention, there is provided an exposure method irradiating an object with an illumination light via an optical system, comprising: measuring position information of a movable body that holds the object at least in directions of three degrees of freedom within a predetermined plane by a measurement system having a grating member with a plurality of grating areas arranged mutually apart in a first direction within the predetermined plane orthogonal to an optical axis of the optical system, a plurality of heads irradiating the grating member with a measurement beam from each of the heads that can move in a second direction orthogonal to the first direction within the predetermined plane, and a measurement device that measures position information of the plurality of heads in the second direction, in which one of the grating member and the plurality of heads is provided at the movable body, along with the other of the grating member and the plurality of heads being provided facing the movable body, based on measurement information of at least three heads of the plurality of heads irradiating at least one of the plurality of grating areas with the measurement beam and measurement information of the measurement device; and moving the movable body based on position information measured by the measurement system, wherein the measurement beam of each of the plurality of heads moves off of one of the plurality of grating areas, and moves to irradiate another grating area adjacent to the one grating area while the movable body is being moved in the first direction, and correction information to control movement of the movable body using a head different from the at least three heads of the plurality of heads whose measurement beams have moved off of the one grating area and move to irradiate the another grating area is acquired, based on measurement information of the at least three heads or position information of the movable body measured using the at least three heads.

According to a fifth aspect of the present invention, there is provided an exposure method irradiating an object with an illumination light via an optical system, comprising: measuring position information of the movable body at least in directions of three degrees of freedom within a predetermined plane orthogonal to an optical axis of the optical system by a measurement system having a grating member with a plurality of first grating areas arranged mutually apart in the first direction within the predetermined plane and a plurality of second grating areas arranged mutually apart in the first direction at positions different from the plurality of first grating areas in the second direction, a plurality of heads irradiating the grating member with a measurement beam from each of the heads that can move in the second direction, and a measurement device that measures position information of the plurality of heads in the second direction, in which one of the grating member and the plurality of heads is provided at the movable body, along with the other of the grating member and the plurality of heads being provided facing the movable body, based on measurement information of at least three heads of the plurality of heads irradiating at least two of the plurality of first grating areas and the plurality of second grating areas with the measurement beam and measurement information of the measurement device; and moving the movable body based on position information measured by the measurement system, wherein the measurement beam of each of the plurality of heads moves off of one grating area of the plurality of first grating areas or the plurality of second grating areas, and moves to irradiate one grating area of another first grating area or another second grating area adjacent to the one grating area of the first grating area or the second grating area while the movable body is being moved in the first direction, and correction information to control movement of the movable body using a head different from the at least three heads of the plurality of heads whose measurement beams have moved off of one of the first grating area and the second grating area and move to irradiate the another of the first grating area and the second grating area is acquired, based on measurement information of the at least three heads or position information of the movable body measured using the at least three heads.

According to a fifth aspect of the present invention, there is provided a flat panel display manufacturing method, comprising: exposing a substrate using the exposure method according to one of the fourth aspect and the fifth aspect; and developing the substrate that has been exposed.

DESCRIPTION OF EMBODIMENTS

First Embodiment

Hereinafter, a first embodiment will be described, using FIGS. 1 to 11F.

Figure 1:
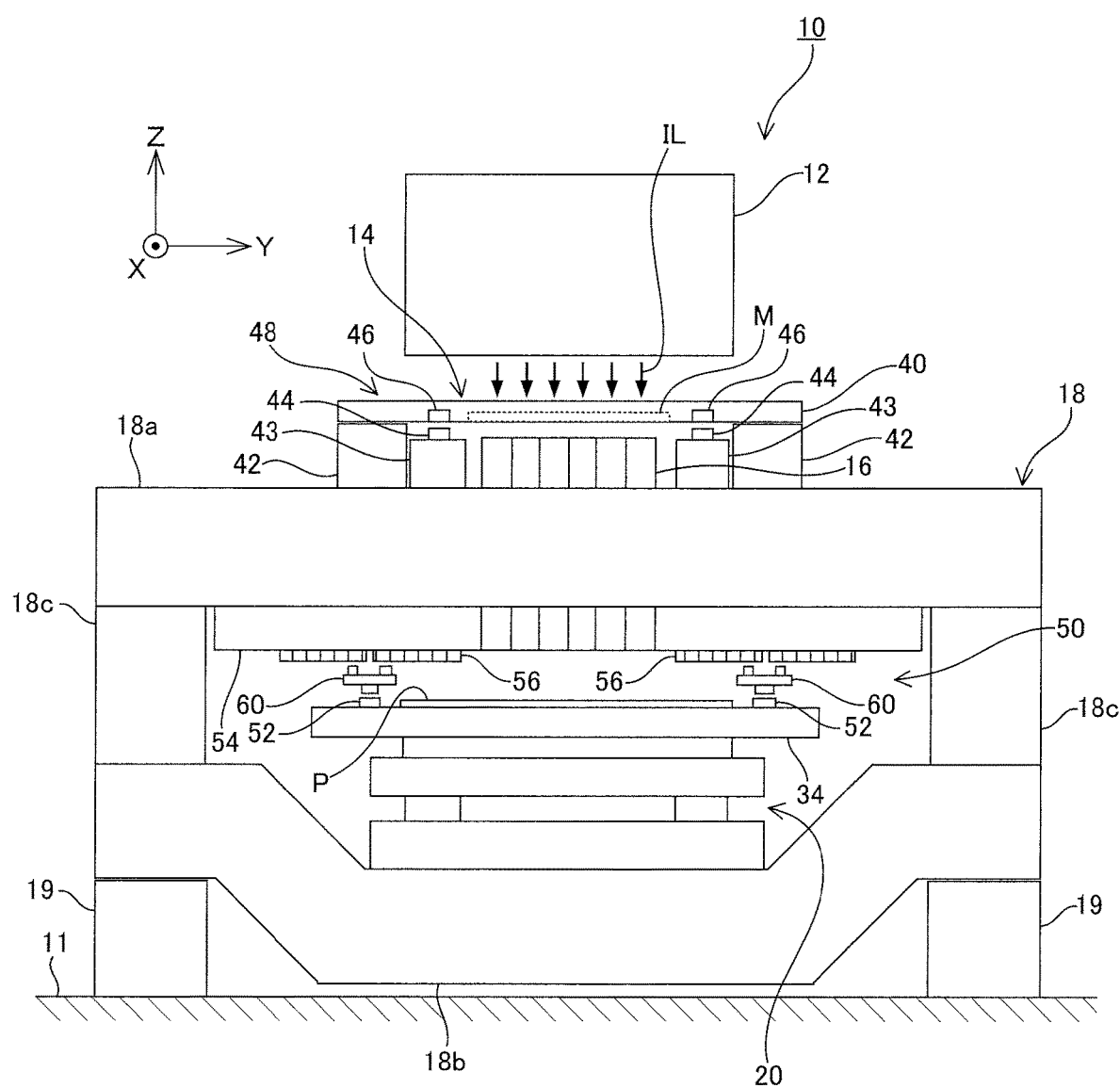
FIG. 1 is a view schematically showing a structure of a liquid crystal exposure apparatus according to a first embodiment.

FIG. 1 schematically shows a structure of a liquid crystal exposure apparatus 10 according to the first embodiment. Liquid crystal exposure apparatus 10 is a projection exposure apparatus of a step-and-scan method, or a so-called scanner whose exposure target is a rectangular (square-shaped) glass substrate P (hereinafter simply referred to as substrate P) used in, for example, a liquid crystal display device (flat panel display) or the like.

Liquid crystal exposure apparatus 10 has an illumination system 12, a mask stage device 14 that holds a mask M on which a circuit pattern and the like is formed, a projection optical system 16, an apparatus main section 18, a substrate stage device 20 that holds substrate P whose surface (a surface facing a +Z side in FIG. 1) is coated with a resist (sensitive agent), a control system for these parts and the like. In the description below, a direction in which mask M and substrate P are relatively scanned with respect to illumination light IL at the time of scanning exposure will be described as an X-axis direction within a predetermined plane orthogonal to an optical axis of projection optical system 16 (coincides with an optical axis of illumination system 12), a direction orthogonal to the X-axis within a horizontal plane will be described as a Y-axis direction, and a direction orthogonal to the X-axis and the Y-axis will be described as a Z-axis direction, and each of the rotation directions around the X-axis, the Y-axis, and the Z-axis will be described as θx, θy, and θz directions, respectively. Also, positions in the X-axis, the Y-axis, and the Z-axis directions will each be described as an X position, a Y position, and a Z position, respectively.

Illumination system 12 is structured similarly to the illumination system disclosed in, U.S. Pat. No. 5,729,331 and the like. Illumination system 12 irradiates mask M with a light emitted from a light source not shown (a mercury lamp) serving as an exposure illumination light (illumination light) IL, via parts not shown such as a reflection mirror, a dichroic mirror, a shutter, a wavelength selection filter, and various kinds of lenses. As illumination light IL, a light including at least one of an i-line (wavelength 365 nm), a g-line (wavelength 436 nm), and an h-line (wavelength 405 nm) (in the embodiment, a synthetic light of the i-line, the g-line, and the h-line described above) is used. Illumination system 12 has a plurality of optical systems that irradiates a plurality of illumination areas whose positions in the Y-axis direction are different with illumination light IL, respectively, and the number of this plurality of optical systems is the same as the number of a plurality of optical systems of projection optical system 16 to be described later on.

Mask stage device 14 includes a mask holder (also called a slider, or a movable member) 40 that holds mask M by vacuum chucking, a mask driving system 91 (not illustrated in FIG. 1, refer to FIG. 6) that drives mask holder 40 in a scanning direction (the X-axis direction) in predetermined long strokes as well as finely drive mask holder 40 appropriately in the Y-axis direction and the θz direction, and a mask position measurement system that measures at least position information (position information in directions of three degrees of freedom including the X-axis direction, the Y-axis direction, and the θz direction, and the θz direction includes rotation (yawing) information; the same hereinafter) of mask holder 40 within the XY plane. Mask holder 40 consists of a frame shaped member in which an opening section in a rectangular shape in a planar view is formed, as is disclosed in U.S. Patent Application Publication No. 2008/0030702. Mask holder 40 is mounted on a pair of mask guides 42 fixed to an upper mount section 18a, which is a part of apparatus main section 18, via an air bearing (not shown). Mask drive system 91 includes a linear motor (not shown). While the description below is made with mask holder 40 being moved, a table or a stage having a holding section of mask M may be moved. That is, the mask holder holding the mask does not necessarily have to be provided separately with the mask table or the mask stage and the mask may be held by vacuum suction or the like on the mask table or the mask stage, and in such a case, the mask table or the mask stage holding the mask is to be moved in directions of three degrees of freedom within the XY plane.

The mask position measurement system is equipped with a mask encoder system 48 in which one of a pair of encoder head units 44 (hereinafter simply referred to as a head unit 44) and a plurality of encoder scales 46 (overlapping in a depth direction of the page surface in FIG. 1, refer to FIG. 2A) irradiated with a measurement beam via head unit 44 is provided at mask holder 40, and the other of encoder heads 44 and the plurality of encoder scales 46 is provided facing mask holder 40. In the embodiment, encoder head 44 is provided at upper mount section 18a via an encoder base 43, and the plurality of encoder scales 46 is provided on the lower surface side of mask holder 40 so that the each of the encoder scales faces the pair of encoder heads 44. Note that encoder heads 44 may be provided, not at upper mount section 18*a* but at, for example, the upper end side of projection optical system 16. The structure of mask encoder system 48 will be described in detail, later on.

Projection optical system 16 is supported by upper mount section 18*a*, and is placed below mask stage device 14. Projection optical system 16 is a so-called multi-lens projection optical system having a structure similar to the projection optical system disclosed in U.S. Pat. No. 6,552, 775 and the like, and is equipped with a plurality of (11 in the embodiment; refer to FIG. 2A) optical systems which forms an upright normal image with a double telecentric equal magnifying system.

In liquid crystal exposure apparatus 10, when an illumination area on mask M supported by upper mount section 18*a* is illuminated with illumination light IL from illumination system 12, by the illumination light having passed mask M, a projection image (partial upright image) of the circuit pattern of mask M within the illumination area is formed on an irradiation area (exposure area) of the illumination light on substrate P conjugate with the illumination area, via projection optical system 16. And, by substrate P being relatively moved in the scanning direction with respect to the exposure area (illumination light IL) along with mask M being relatively moved in the scanning direction with respect to the illumination area (illumination light IL), scanning exposure of a shot area on substrate P is performed, and the pattern formed on mask M is transferred onto the shot area.

Apparatus main section 18 (also referred to such as a main section or a frame structure) supports mask stage device 14, projection optical system 16, and substrate stage device 20 described above, and is installed on a floor 11 of a clean room via a plurality of vibration isolation devices 19. Apparatus main section 18 is structured similarly to the apparatus main section disclosed in U.S. Patent Application Publication No. 2008/0030702. In the embodiment, the apparatus main section has upper mount section 18*a* (also called an optical surface plate) that supports projection optical system 16 described above, a lower mount section 18*b* where substrate stage device 20 is arranged, and a pair of middle mount sections 18*c*.

Substrate stage device 20 is a device used to position substrate P with high precision with respect to a plurality of partial images (exposure light IL) of the mask pattern of substrate P projected via projection optical system 16 in scanning exposure, and moves substrate P in directions of six degrees of freedom (the X-axis, the Y-axis, and the Z-axis directions, and the θx, the θy, and the θz directions). While the structure of substrate stage device 20 is not limited in particular, a stage device of a so-called coarse/fine movement structure can be used, including a gantry type two-dimensional coarse movement stage and a fine movement stage finely moved with respect to the two-dimensional coarse movement stage, as is disclosed in U.S. Patent Application Publication No. 2008/129762, U.S. Patent Application Publication No. 2012/0057140 and the like. In this case, substrate P can be moved in directions of three degrees of freedom within the horizontal plane by the coarse movement stage, and substrate P can also be finely moved in directions of six degrees of freedom by the fine movement stage.

Substrate stage device 20 is equipped with a substrate holder 34. Substrate holder 34 consists of a plate-like member having a rectangular shape in a planar view, and substrate P is mounted on its upper surface. Note that the substrate holder that holds the substrate does not necessarily have to be provided separately from the table or stage where the holding section of the substrate is provided, in this case, fine movement stage 32, and the substrate may be held by vacuum suction or the like on the table or the stage. Substrate holder 34 is moved in the X-axis direction and/or the Y-axis direction with respect to projection optical system 16 in predetermined long strokes and is also finely moved in directions of six degrees of freedom, by a plurality of linear motors (voice coil motors) structuring a part of a substrate drive system 93 (not shown in FIG. 1, refer to FIG. 6). The structure of substrate stage device 20 described so far (however excluding the measurement system) is disclosed in U.S. Patent Application Publication No. 2012/0057140.

Figure 6:
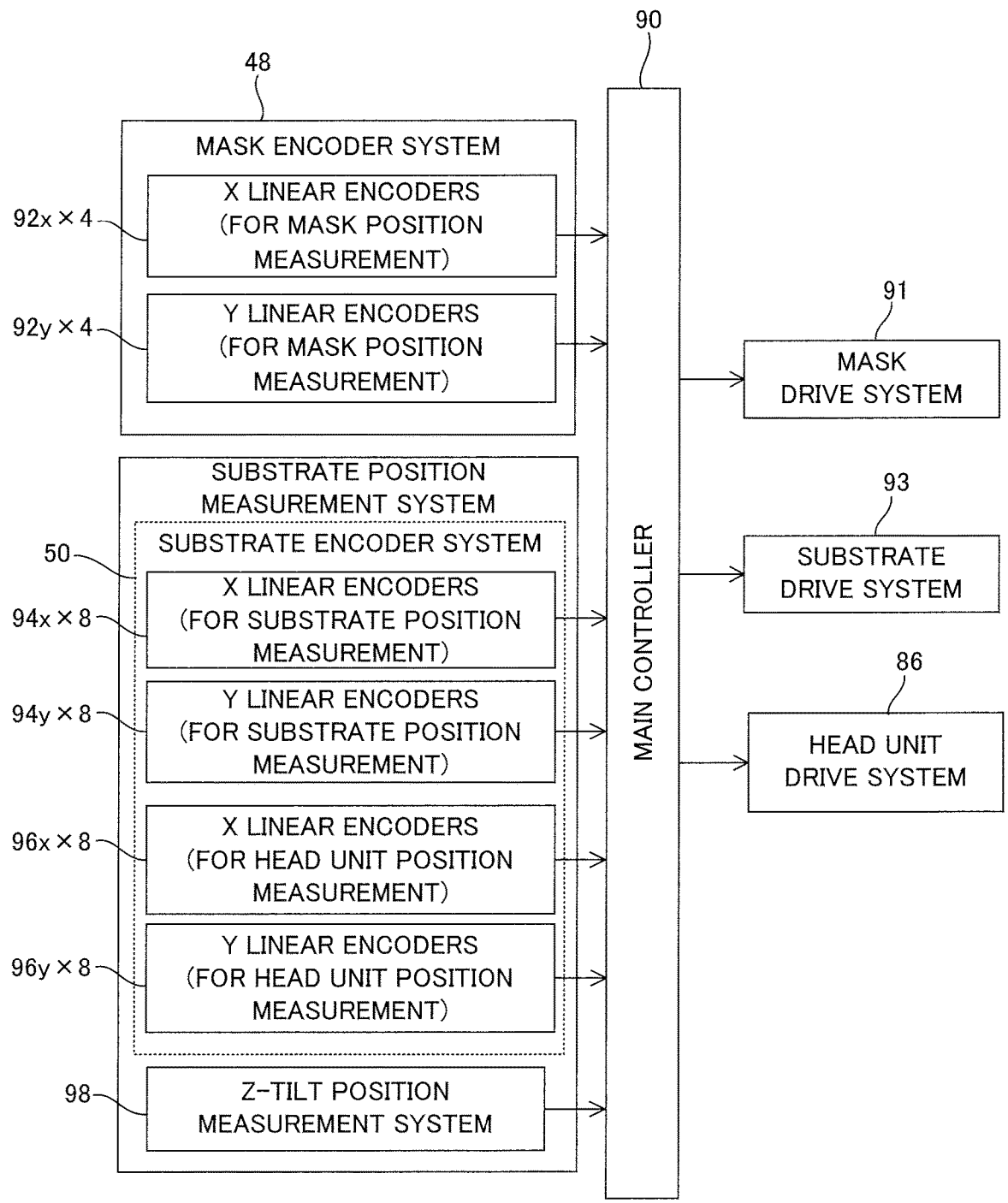
FIG. 6 is a block diagram showing an input/output relation of a main controller that mainly structures the control system of the liquid crystal exposure apparatus.

Also, liquid crystal exposure apparatus 10 has a substrate position measurement system for measuring position information of substrate holder 34 (namely, substrate P) in directions of six degrees of freedom. The substrate position measurement system includes a Z tilt position measurement system 98 for acquiring position information of substrate P in the Z-axis, the θx, and θy directions (hereinafter referred to as Z tilt direction), and a substrate encoder system 50 for acquiring position information of substrate P in the XY plane in directions of three degrees of freedom, as is shown in FIG. 6. While the structure of Z tilt position measurement system 98 is not limited in particular, a measurement system can be used that obtains position information of substrate P in the Z tilt direction with apparatus main section 18 (lower mount section 18*b*) serving as a reference, using a plurality of sensors attached to a system including substrate holder 34, as is disclosed in U.S. Patent Application Publication No. 2010/0018950 and the like. The structure of substrate encoder system 50 will be described later in the description.

Figure 2A:
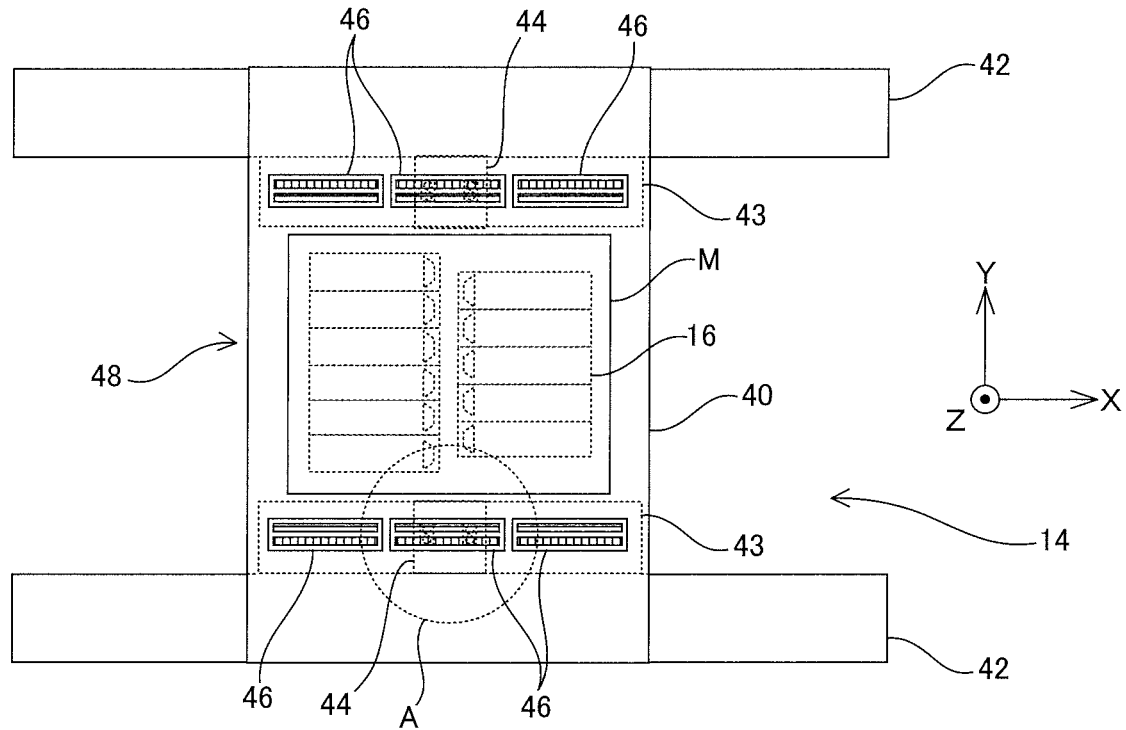
FIG. 2A is a view schematically showing a structure of a mask encoder system.

Next, the structure of mask encoder system 48 will be described, using FIGS. 2A and 2B. As is typically shown in FIG. 2A, in areas on the +Y side and the −Y side of mask M (more specifically, an opening section not shown for housing mask M) in mask holder 40, a plurality of encoder scales 46 (also referred to as grating members, grating section, grid members and the like; however, will be simply referred to as scales 46 below) is placed. Although FIG. 2A illustrates the plurality of scales 46 in a solid line placed on the upper surface of mask holder 40 to facilitate understanding, the plurality of scales 46 is actually placed at the lower surface side of mask holder 40 so that the Z position of the lower surface of each of the plurality of scales 46 coincides with the Z position of the lower surface (pattern surface) of mask M, as is shown in FIG. 1.

Each of the plurality of scales 46 has a grating area (grating section) in which a reflective two-dimensional grating or two reflective one-dimensional gratings with different (e.g. orthogonal) arrangement directions (periodic directions) are formed, and the plurality of scales 46 is provided at the lower surface side of mask holder 40 on both sides of the mounting area (including the opening section described earlier) of mask M in the Y-axis direction so that the grating areas are arranged apart in the X-axis direction. Note that while the grating may be formed in the X-axis and the Y-axis directions to cover the entire area of scales 46, since it is difficult to form the grating with good precision at the edge of scales 46, in the embodiment, the grating is formed so that the periphery of the grating area in scales 46 becomes a margin part. Therefore, spacing between grating areas is larger than the spacing between a pair of scales 46 adjacent in the X-axis direction, and the period while an area other than the grating areas is irradiated with the measurement beam is to be a non-measurement period (also called a non-measurement section; however, hereinafter referred to collectively as non-measurement period) in which position measurement cannot be performed.

In mask holder 40 of the embodiment, in the areas on the +Y side and the −Y side of the mounting area of mask M, three scales 46 are arranged in the X-axis direction at a predetermined spacing. That is, mask holder 40 has a total of six scales 46. Each of the plurality of scales 46 is substantially identical, except for the point that the scales are arranged symmetrically in the vertical direction of the page surface on the +Y side and the −Y side of mask M. Scale 46 consists of a plate-shaped (strip-shaped) member rectangular in a planar view extending in the X-axis direction, made of quartz glass. Mask holder 40 is formed of ceramics, and the plurality of scales 46 is fixed to mask holder 40. In the embodiment, instead of the plurality of scales 46 arranged apart in the X-axis direction, one (single) scale may be used as a mask holder scale. In this case, the grating area may also be one, or a plurality of grating areas may be formed set apart in the X-axis direction on one scale.

Figure 2B:
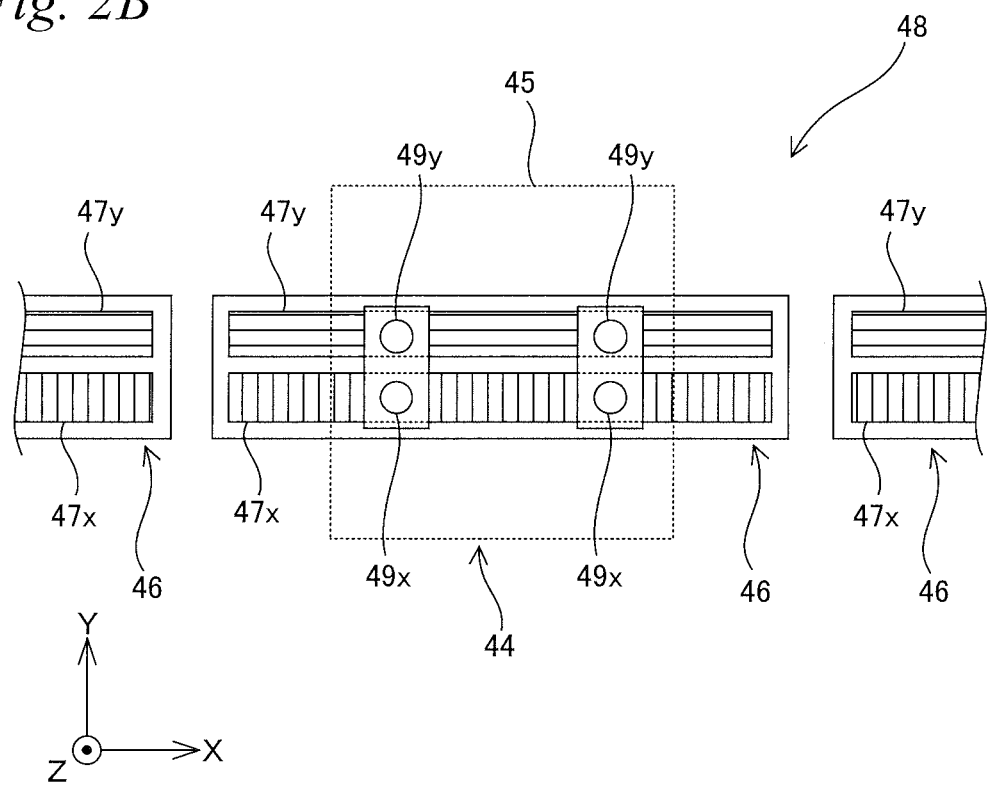
FIG. 2B is an enlarged view of a part of the mask encoder system (part A in FIG. 2A).

As is shown in FIG. 2B, on the lower surface (a surface facing the −Z side in the embodiment) of scale 46 at an area on one side in the width direction (the −Y side in FIG. 2B), an X scale 47x is formed. Also, on the lower surface of scale 46 at an area on the other side in the width direction (the +Y side in FIG. 2B), a Y scale 47y is formed. X scale 47x is structured by a reflective diffraction grating (an X grating) having a plurality of grid lines extending in the Y-axis direction formed at a predetermined pitch in the X-axis direction (the X-axis direction serving as a periodic direction). Similarly, Y scale 47y is structured by a reflective diffraction grating (a Y grating) having a plurality of grid lines extending in the X-axis direction formed at a predetermined pitch in the Y-axis direction (the Y-axis direction serving as a periodic direction). In X scale 47x and Y scale 47y of the embodiment, the plurality of grid lines is formed at a spacing of 10 nm or less. Note that in FIGS. 2A and 2B, for convenience of illustration, the spacing (pitch) between the grids is shown much wider than the actual spacing. The same applies to other drawings as well.

Also, as is shown in FIG. 1, a pair of encoder bases 43 is fixed on the upper surface of upper mount section 18a. The pair of encoder bases 43 is placed so that one of the pair is at the −X side of mask guide 42 on the +X side, and the other is at the +X side of mask guide 42 on the −X side (that is, placed in the area between the pair of mask guides 42). Also, a part of projection optical system 16 described above is arranged in between the pair of encoder bases 43. Encoder base 43, as is shown in FIG. 2A, consists of a member extending in the X-axis direction. Encoder head unit 44 (hereinafter simply referred to as head unit 44) is fixed in the center in the longitudinal direction to each of the pair of encoder bases 43. That is, head unit 44 is fixed to apparatus main section 18 (refer to FIG. 1), via encoder base 43. Since the pair of head units 44 is substantially identical, except for the point that the head units are arranged symmetrically in the vertical direction of the page surface on the +Y side and the −Y side of mask M, the description below is on only one of the head units (on the −Y side).

As is shown in FIG. 2B, head unit 44 has a plurality of heads whose position of a measurement beam, irradiated on at least one of the plurality of scales 46 arranged in the X-axis direction, is different in at least one of the X-axis direction and the Y-axis direction, and a unit base 45 consisting of a plate-shaped member having a rectangular shape in a planar view. Fixed to unit base 45 are a pair of X heads 49x arranged separately to each other that irradiates a measurement beam at a spacing larger than the spacing of a pair of X scales 47x (grating areas) adjacent in the X-axis direction, and a pair of Y heads 49y arranged separately to each other that irradiates a measurement beam at a spacing larger than the spacing of the pair of Y scales 47y (grating areas) adjacent in the X-axis direction. That is, mask encoder system 48 has a total of four X heads 49x; one pair each on both sides of the mounting area of mask M of mask holder 40 in the Y-axis direction, along with a total of four Y heads 49y; one pair each on both sides of the mounting area of mask M in the Y-axis direction. Note that the pair of X heads 49x or the pair of Y heads 49y does not necessarily have to be arranged separate larger than the spacing of the pair of X scales 49x or the pair of Y scales 49y, and may be arranged at a spacing around the same or smaller scale spacing or may be arranged in contact with each other, as long as a pair of measurement beams is arranged larger than the scale spacing in the X-axis direction. Also, in FIG. 2B, while one of X head 49x and one of Y head 49y are housed together in a housing and the other of X head 49x and the other of Y head 49y are housed together in another housing, the pair of X heads 49x and the pair of Y heads 49y may each be arranged independently. Also, in FIG. 2B, to facilitate understanding, while the pair of X heads 49x and the pair of Y heads 49y are illustrated to be arranged above (the +Z side of) scale 46, the pair of X heads 49x is actually arranged below X scale 47y and the pair of Y heads 49y is actually arranged below Y scale 47y (refer to FIG. 1). Also, the spacing (length in the Y-axis direction) between X head 49x and Y head 49y whose X positions are the same is set shorter than the width (length in the Y-axis direction) of scale 49.

The pair of X heads 49x and the pair of Y heads 49y are fixed to unit base 45 so that a position (especially the position in a measurement direction (the X-axis direction)) of at least one of the pair of X heads 49x (measurement beam) or head (measurement beam) spacing, and a position (especially the position in a measurement direction (the Y-axis direction)) of at least one of the pair of Y heads 49y (measurement beam) or head (measurement beam) spacing do not change due to vibration or the like. Also, unit base 45 itself is also formed of a material whose coefficient of thermal expansion is lower than scale 46 (or is about the same as scale 46), so that the position or spacing of the pair of X heads 49x and the position or spacing of the pair of Y heads 49y do not change due to temperature change or the like.

X head 49x and Y head 49y are encoder heads of a so-called diffraction interference method as is disclosed in U.S. Patent Application Publication No. 2008/0094592 that irradiate corresponding scales (X scale 47x, Y scale 47y) with measurement beams, and by receiving the beams from the scales, supply displacement amount information of mask holder 40 (namely mask M, refer to FIG. 2A) to main controller 90 (refer to FIG. 6). That is, in mask encoder system 48, four X heads 49x and X scale 47x (differs depending on the X position of mask holder 40) facing the X heads 49x structure four X linear encoders 92x (not shown in FIG. 2B, refer to FIG. 6) for obtaining position information of mask M in the X-axis direction, and four Y heads 49y and Y scale 47y (differs depending on the X position of mask holder 40) facing the Y heads 49y structure four Y linear encoders 92y (not shown in FIG. 2B, refer to FIG. 6) for obtaining position information of mask M in the Y-axis direction. In the embodiment, while a head is used whose measurement direction is in one of two different directions (coincides with the X-axis direction and the Y-axis direction) within the XY plane, a head may be used whose measurement direction differs from one of the X-axis direction and the Y-axis direction. For example, a head may be used whose measurement direction is in a direction rotated by an angle of 45 degrees with respect to the X-axis direction or the Y-axis direction within the XY plane. Also, instead of a one-dimensional head (an X head or a Y head) whose measurement direction is in one of the two different directions within the XY plane, for example, a two-dimensional head (an XZ head or a YZ head) whose measurement direction is in two directions such as; one of the X-axis direction and the Y-axis direction, and the Z-axis direction, may be used. In this case, it also becomes possible to measure position information of mask holder 40 in directions of three degrees of freedom (including the Z-axis direction, the θx direction, and the θy direction, and θx direction is rolling information, θy direction is pitching information) different from the directions of three degrees of freedom described above (the X-axis direction, the Y-axis direction, and the θz direction).

Main controller 90, as is shown in FIG. 6, obtains position information of mask holder 40 (refer to FIG. 2A) in the X-axis direction and the Y-axis direction, based on an output of four X linear encoders 92x and four Y linear encoders 92y, at a resolution of 10 nm or less. Also, main controller 90 obtains θz position information (rotation amount information) of mask holder 40, based on an output of at least two of the four X linear encoders 92x (or four Y linear encoders 92y). Main controller 90 controls the position in the XY plane of mask holder 40 using mask drive system 91, based on position information in directions of three degrees of freedom within the XY plane of mask holder 40 obtained from measurement values of mask encoder system 48 described above.

Here, as is shown in FIG. 2A, in mask holder 40 as is described above, in each of the areas on the +Y side and the −Y side of mask M, three scales 46 are arranged in the X-axis direction at a predetermined spacing. Also, at least in scanning exposure of substrate P, of the three scales 46 arranged in the X-axis direction at a predetermined spacing described above, mask holder 40 is moved in the X-axis direction between a position where head unit 44 (all the pair of X heads 49x and the pair of Y heads 49y (each refer to FIG. 3B)) faces scale 46 furthest to the +X side and a position where head unit 44 faces scale 46 furthest to the −X side. Note that in at least one of an exchange operation and a pre-alignment operation of mask M, in the case mask holder 40 is moved away from the illumination area illuminated with illumination light IL in the X-axis direction and at least one head of head unit 44 moves off of scale 46, at least one head may be provided arranged away from head unit 44 in the X-axis direction so that position measurement of mask holder 40 by mask encoder system 48 can be continued even in the exchange operation or the pre-alignment operation.

And, in mask stage device 14 of the embodiment, as is shown in FIG. 2B, the spacing between each of the pair of X heads 49x and the pair of Y heads 49y that one head unit 44 has is set larger than a pair of scales 46 adjacent to each other of the plurality of scales 46. This allows at least one head of the pair of X heads 49x to constantly face X scale 47x and at least one head of the pair of Y heads 49y to constantly face Y scale 47y in mask encoder system 48. Accordingly, mask encoder system 48 can supply position information of mask holder 40 (refer to FIG. 2A) to main controller 90 (refer to FIG. 6) without the position information being cut off.

To describe this specifically, in the case mask holder 40 (refer to FIG. 2A) moves to the +X side, mask encoder system 48 goes through; a first state (the state shown in FIG. 2B) in which the pair of heads 49x both face X scale 47x on the +X side of the adjacent pair of X scales 47x, a second state in which X head 49x on the −X side faces an area between the above adjacent pair of X scales 47x (facing neither of the X scales 47x) and X head 49x on the +X side faces X scale 47x on the +X side, a third state in which X head 49x on the −X side faces X scale 47x on the −X side and X head 49x on the +X side faces X scale 47x on the +X side, a fourth state in which X head 49x on the −X side faces X scale 47x on the −X side and X head 49x on the +X side faces an area between a pair of X scales 47x (facing neither of the X scales 47x), and a fifth state in which the pair of heads 49x both face X scale 47x on the −X side, in the order described above. Accordingly, at least one of the X heads 49x constantly faces X scale 47x.

Main controller 90 (refer to FIG. 6), in the first state, the third state, and the fifth state described above, obtains X position information of mask holder 40, based on an average value of the output of the pair of X heads 49x. Also, main controller 90, in the second state described above, obtains X position information of mask holder 40, based on only the output of X head 49x on the +X side, and in the fourth state described above, obtains X position information of mask holder 40, based on only the output of X head 49 on the −X side. Accordingly, measurement values of mask encoder system 48 are not cut off. Note that the X position information may also be obtained using the output of only one of the pair of X heads 49x also in the first state, the third state, and the fifth state. However, in the second state and the fourth state, in both the pair of head units 44 one of the pair of X heads 49x and one of the Y heads 49y move off of scale 46 so that position information in the θz direction (rotation information) of mask holder 40 can no longer be acquired. Therefore, it is preferable to arrange the three scales 46 arranged on the +Y side and the three scales 46 arranged on the −Y side with respect to the mounting area of mask M shifted from one another so that the spacing between adjacent pair of scales 46 do not overlap in the X-axis direction, and that even when X head 49x and Y head 49y move off of scale 46 in one of the three scales 46 arranged on the +Y side and the three scales 46 arranged on the −Y side, X head 49x and Y head 49y do not move off in the other of the scales 46. Or, the pair of head units 44 may be arranged shifted in the X-axis direction only by a distance larger than the spacing of an adjacent pair of scales 46 (width in a non-grating area). This avoids the non-measurement period when measurement beams move off (cannot measure) the grating area of scale 46 in the X-axis direction from overlapping in a total of four heads; the pair of X heads 49x arranged on the +Y side and the pair of X heads 49x arranged on the −Y side, and makes it possible to constantly measure position information in the θz direction of mask holder 40 at least during scanning exposure. Note that in at least one of the pair of head units 44, at least one head may be arranged which is arranged apart in the X-axis direction with respect to at least one of the pair of X heads 49x and the pair of Y heads 49y, so that two heads face scale 46 in at least one of X head 49x and Y head 49y, also in the second state and in the fourth state.

Also, with mask encoder system 48 of the embodiment, in order to avoid the measurement values of mask encoder system 48 from being cut off, a linkage process is performed on the output of the heads when the state moves between the first, the third and the fifth states described above, namely the state in which both heads of the pair face the scale and the output is supplied from each of the heads of the pair, and the second and the fourth states, namely the state in which only one of the heads of the pair faces the scale and the output is supplied from only one of the heads of the pair. The linkage process of the heads will be described below, using FIGS. 3A to 3E. Note that to simplify the description, in FIGS. 3A to 3E, a two-dimensional grating (grating) is to be formed on scale 46. Also, the outputs of each of the heads 49$x$ and 49$y$ are to be ideal values. Also, in the description below, while the linkage process of the pair of X heads 49$x$ that are adjacent (to be referred to as 49$x_1$ and 49$x_2$ for convenience) will be described, a similar linkage process is performed also on the pair of Y heads 49$y$ that are adjacent (to be referred to as 49$y_1$ and 49$y_2$ for convenience).

Figure 3A:
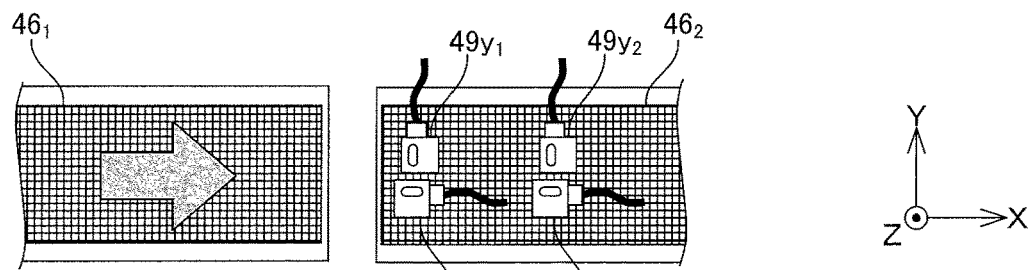
FIGS. 3A to 3E are views (No. 1 to No. 5) used to explain a linkage process of head outputs in the mask encoder system and a substrate encoder system.
Figure 3B:
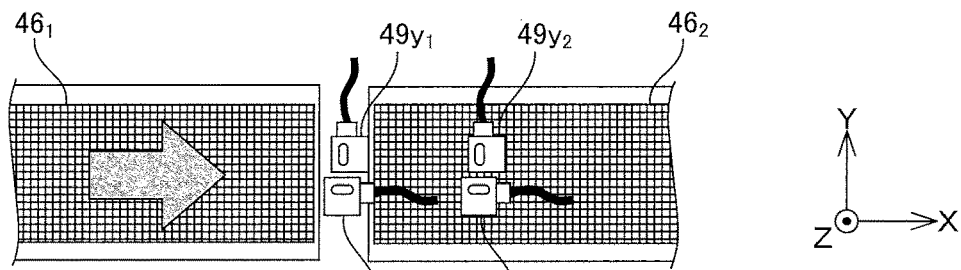

As is shown in FIG. 3A, in the case each of the pair of X heads 49$x_1$ and 49$x_2$ obtain X position information of mask holder 40 (refer to FIG. 2A) using, of the pair of scales 46 that are adjacent (referred to as 46$_1$ and 46$_2$ for convenience), scale 46$_2$ on the +X side, the pair of X heads 49$x_1$ and 49$x_2$ both output X coordinate information. Here, the outputs of the pair of X heads 49$x_1$ and 49$x_2$ become the same value. Next, because X head 49$x_1$ moves outside the measurement range of scale 46$_2$ when mask holder 40 is moved in the +X direction as is shown in FIG. 3B, the output of X head 49$x_1$ is invalidated before X head 49$x_1$ moves outside the measurement range. Accordingly, the X position information of mask holder 40 is obtained based only on the output of X head 49$x_2$.

Figure 3C:
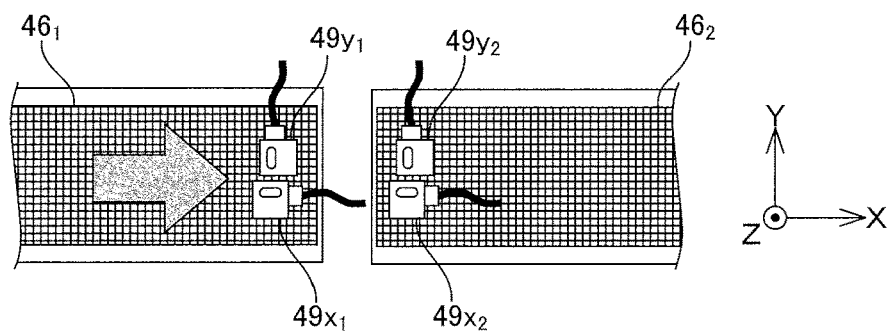

Also, when mask holder 40 (refer to FIG. 2A) is moved further in the +X direction as is shown in FIG. 3C, X head 49$x_1$ faces scale 46$_1$ on the −X side. While X head 49$x_1$ outputs the X position information of mask holder 40 immediately after measurement becomes possible using scale 46$_1$, because counting is resumed from an undefined value (or zero) for the output of X head 49$x_1$, the output cannot be used for calculating the X position information of mask holder 40. Accordingly, in this state, linkage process of each of the outputs of the pair of X heads 49$x_1$ and 49$x_2$ becomes required. As the linkage process, specifically, a process is performed to correct the output of X head 49$x_1$ regarded as an undefined value (or zero) (so that the output becomes the same value as that of X head 49$x_2$), using the output of X head 49$x_2$. The linkage process is completed before mask holder 40 further moves in the +X direction and X head 49$x_2$ moves outside the measurement range of scale 46$_2$, as is shown in FIG. 3D.

Figure 3D:
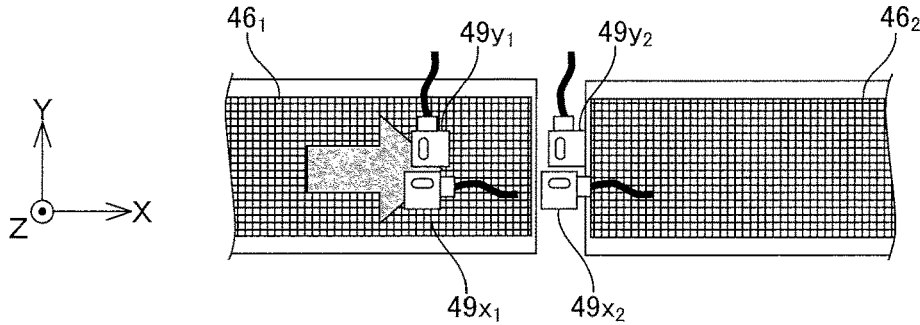
Figure 3E:
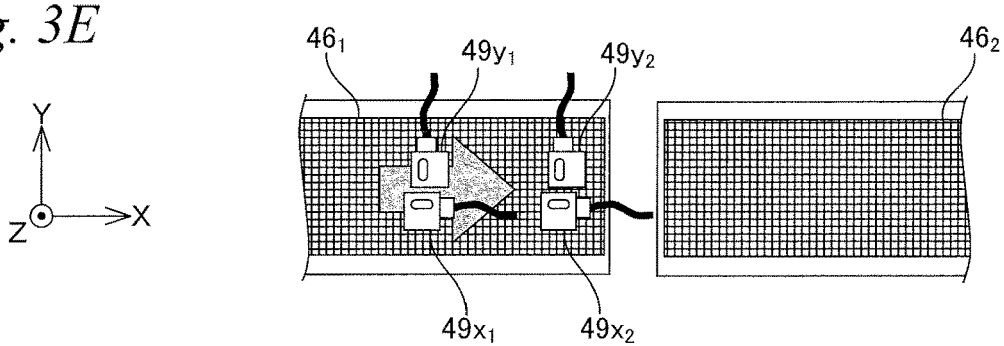

Similarly, as is shown in FIG. 3D, in the case X head 49$x_2$ moves outside the measurement range of scale 46$_2$, the output of X head 49$x_2$ is invalidated before X head 49$_2$ moves outside the measurement range. Accordingly, the X position information of mask holder 40 (refer to FIG. 2A) is obtained based only on the output of X head 49$x_1$. Then, the linkage process using the output of X head 49$x_1$ is performed with respect to X head 49$x_2$, immediately after mask holder 40 is moved further in the +X direction and measurement becomes possible with each of the pair of X heads 49$x_1$ and 49$x_2$ using scale 46$_1$ as is shown in FIG. 3E. Hereinafter, the X position information of mask holder 40 is obtained, based on the outputs of each of the pair of X heads 49$x_1$ and 49$x_2$.

The linkage process above described so far is performed on the premise that the positional relation of the four heads (two X heads 49$x$ and two Y heads 49$y$) that one head unit 44 has is known. The positional relation between each of the heads can be obtained in a state where the four heads described above face a common scale and using the scale is the state, or by using a measurement device (such as a laser interferometer or a distance sensor) placed in between each of the heads.

Note that while the linkage process described above was performed based on the output of X head 49$x_2$ which forms a pair with X head 49$x_1$ in the case X head 49$x_1$ moves into an invalidated (deactivated) state, the linkage is not limited to this, and the linkage process may be performed, based on the outputs of more heads (such as three or four). Also, the linkage process may be performed using an average value of the outputs of more heads. A modified example of the linkage process will be described specifically below, using FIGS. 10A to 10C. Note that for convenience, in FIGS. 10A to 10C, the description will be made with four X heads 49$x$ represented by codes 49$x_1$ to 49$x_4$, and four Y heads 49$y$ represented by reference codes 49$y_1$ to 49$y_4$. Also, the description will be made with the pair of scales 46 which are adjacent subject to the linkage process represented by codes 46$_1$ and 46$_2$.

Figure 10A:
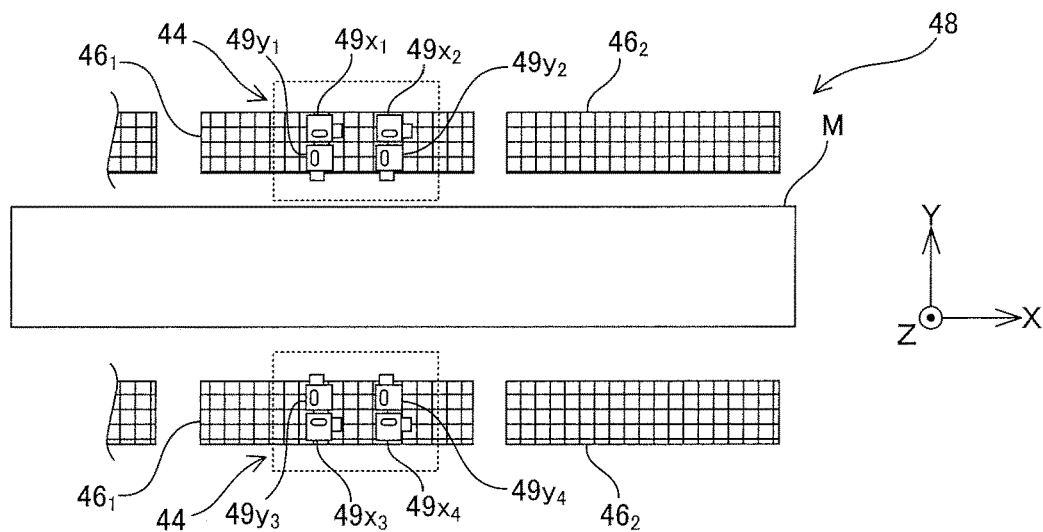
FIGS. 10A to 10C are views (No. 1 to No. 3) used to explain a modified example (No. 1) of the linkage process of head outputs.
Figure 10B:
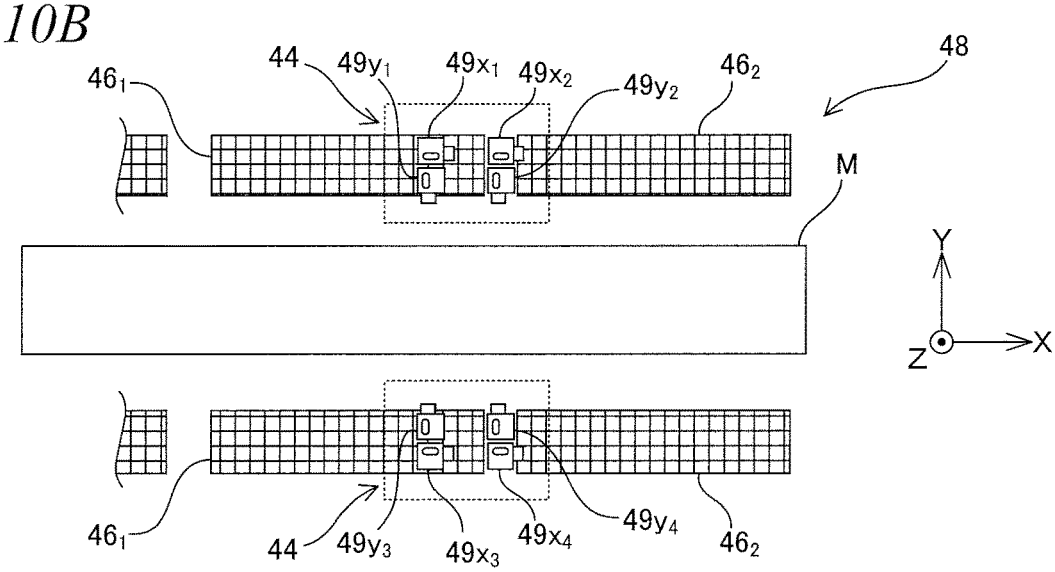
Figure 10C:
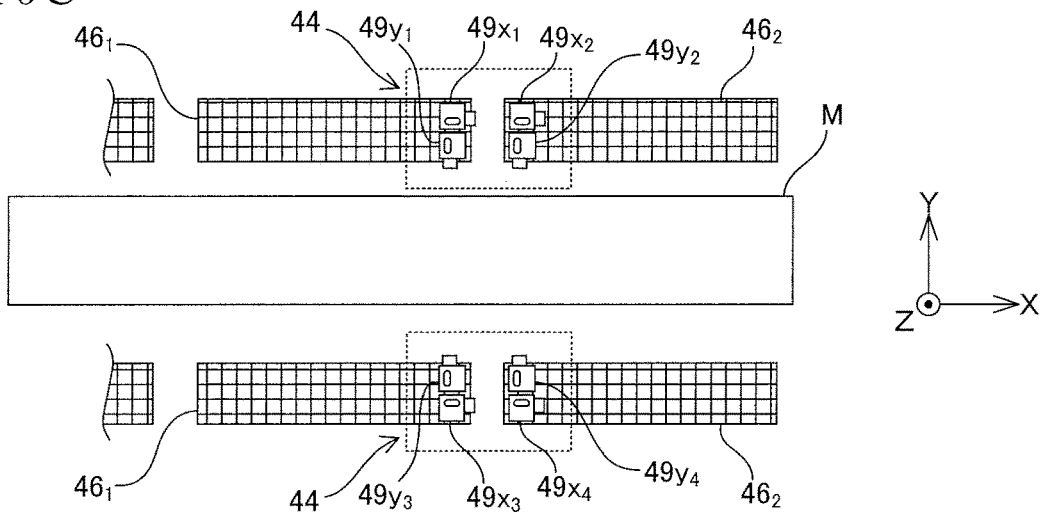

With mask encoder system 48, since the plurality of scales 46 is arranged separately placed in the X-axis direction, when mask M is moved in the −X direction from a state shown in FIG. 10A where the eight heads (X heads 49$x_1$ to 49$x_4$, Y heads 49$y_1$ to 49$y_4$) are in a state facing one of the scales 46$_1$, a state occurs in which four heads (X heads 49$x_2$, 49$x_4$ and Y heads 49$y_2$, 49$y_4$) of the eight heads that the pair of head units 44 has whose X positions are the same simultaneously move off of scale 49 (are deactivated), as is shown in FIG. 10 B. As is described above, a control is performed on the outputs of each of the heads that move off of scale 49 so that the outputs become undefined values (or zero).

Main controller 90 (refer to FIG. 6) performs a restoring process (linkage process using the output values of the other heads) of the output values of the deactivated heads before the four heads (X heads 49$x_2$, 49$x_4$, Y heads 49$y_2$, 49$y_4$) that have moved into a deactivated state (a state in which the output values are undefined) described above as is shown in FIG. 10C face the other scale 46$_2$. In the case of restoring the output value of head 49$y_2$ in the deactivated state, of the four heads (X heads 49$x_1$, 49$x_3$, Y heads 49$y$, 49$y_3$) in an active state, by using three arbitrary outputs (of e.g., X head 49$x_1$, Y heads 49$y_1$, 49$y_3$), position relation between the three active heads and the deactivated head 49$y_2$ subject to the linkage process is obtained. As is described above, the positional relation between these heads is to be known. Here, since the head which is intended to move into a deactivated state next can be predicted in advance from the movement direction of mask M, calculation for the linkage process described above is performed before the four heads subject to the linkage process actually move into the deactivated state (the state shown in FIG. 10A). Also, since the head which is intended to move into the deactivated state next can be predicted similarly in advance, in the state shown in FIG. 10C just before a part of the heads move into the deactivated state, measurement of position information of mask M (position control of mask M) is performed, using the outputs of the heads whose active state continue (X heads 49$x_2$, 49$x_4$, Y heads 49$y_2$, 49$y_4$ in FIG. 10C), without using the outputs of the heads which are intended to move into the deactivated state (X heads 49$x_1$, 49$x_3$, Y heads 49$y_1$, 49$y_3$ in FIG. 10C).

Main controller 90 (refer to FIG. 6) obtains position information (position information in each of the X, the Y, and the θz directions) of the deactivated Y head 49$y_2$ from the output values of the three active heads described above, calculates (estimates) the output value of Y head 49$y_2$ based on the position information and uses this as the output value of Y head $49y_2$ that has been activated again. The same applies to the linkage process performed on other heads (X heads $49x_2$, $49x_4$, Y head $49y_4$) shown in FIG. 10B which are in the deactivated state.

Next, a structure of substrate encoder system 50 will be described. Substrate encoder system 50, as is shown in FIG. 1, is equipped with a plurality of encoder scales 52 (overlapping in the depth of the page surface in FIG. 1, refer to FIG. 4A) arranged at substrate stage device 20, a plurality of (two, in the embodiment) encoder bases 54 fixed to the lower surface of upper mount section 18a, a plurality of encoder scales 56 fixed to the lower surfaces of encoder bases 54, and a plurality of (two for one encoder base 54, in the embodiment) encoder head units 60 (hereinafter simply referred to as head units 60). Note that since the two encoder bases 54 are overlapping in a depth direction of the page surface (the X-axis direction) in FIG. 1, encoder base 54 on the +X side is hidden in the depth side of the page surface. Similarly, the two head units 60 corresponding to encoder base 54 on the −X side are hidden in the depth side of the page surface of the two head units 60 corresponding to encoder base 54 on the +X side.

As is shown modeled in FIG. 4A, in substrate stage device 20 of the embodiment, in each of the areas on the +Y side and on the −Y side of substrate P (substrate mounting area), four encoder scales 52 (hereinafter simply referred to as scales 52) are arranged at a predetermined spacing in the X-axis direction. That is, substrate stage device 20 has a total of eight scales 52. Each of the plurality of scales 52 is substantially identical, except for the point that the scales are arranged symmetrically in the vertical direction of the page surface on the +Y side and the −Y side of substrate P. Scale 52, similarly to scale 46 (each refer to FIG. 2A) of mask encoder system 48 described above, consists of a rectangular plate-shaped (strip-shaped) member in a planar view extending in the X-axis direction, made of quartz glass. Also, each of the plurality of scales 52 has a grating area (grating section) in which a reflective two-dimensional grating or two reflective one-dimensional gratings with different (e.g. orthogonal) arrangement directions (periodic directions) are formed, and four scales 52 are provided on both sides of the substrate mounting area in the Y-axis direction so that the grating areas are arranged apart in the X-axis direction.

Note that in the embodiment, while the case is described when the plurality of scales 52 is fixed to the upper surface of substrate holder 34, the position arranged of the plurality of scales 52 is not limited to this and may be arranged separately (however, moving integrally with substrate holder 34 in directions of six degrees of freedom) on outer side of substrate holder 34 in a state with a predetermined gap between substrate holder 34. Note that the plurality of scales 52 may be arranged on an upper surface of a substrate table that has substrate holder 34 and can be finely drive in at least the Z-axis direction, the θx direction, and the θy direction, or on an upper surface of a substrate stage that supports the substrate table in a finely movable manner.

Figure 4B:
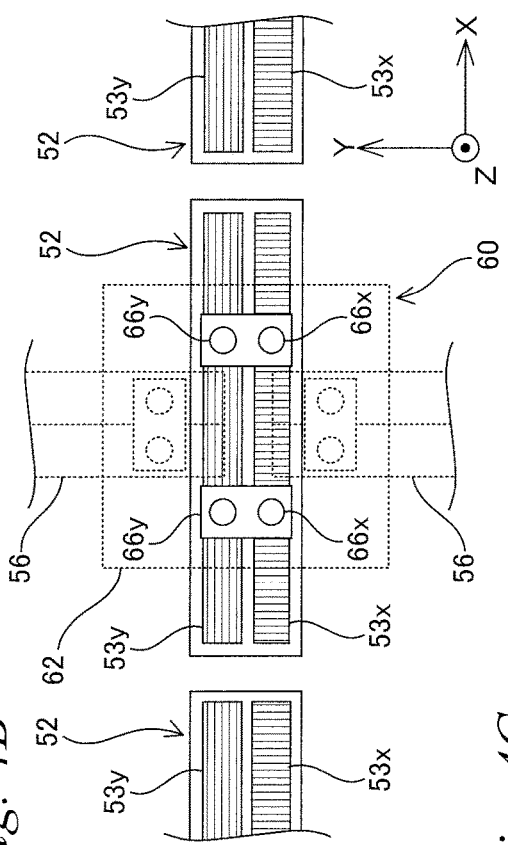
FIGS. 4B and 4C are enlarged views of a part of the substrate encoder system (part B in FIG. 4A).

As shown in FIG. 4B, X scales $53x$ are formed on one side (the −Y side in FIG. 4B) of the width direction in areas on the upper surface of scales 52. Also, Y scales $53y$ are formed on the other side (the +Y side in FIG. 4B) of the width direction in areas on the upper surface of scales 52. Since the structure of X scales $53x$ and Y scales $53y$ is the same as X scales $47x$ and Y scales 47 $y$ (each refer to FIG. 2B) formed on scales 46 (each refer to FIG. 2A) of mask encoder system 48 described above, the description thereabout will be omitted. Note that in the embodiment, while X scales $53x$ and Y scales $53y$ are formed in the same length in the X-axis direction within scales 52 formed on substrate holder 34, the X scales and Y scales may be made to have a length different from each other. Also, the X scales $53x$ and Y scales $53y$ may be arranged, relatively shifted in the X-axis direction.

Referring back to FIG. 4A, the two encoder bases 54 (and the corresponding two head units 60) are placed apart in the X-axis direction. Since the structure of the two encoder bases 54 is substantially the same except for the point that the arrangement is different, in the description below, one of the encoder base 54 and the pair of head units 60 corresponding to encoder base 54 will be described.

Encoder base 54 consists of a plate-like member extending in the Y-axis direction, and as is shown in FIG. 1, is fixed to the lower surface of upper mount section 18a. In the embodiment, as is shown in FIG. 4A, while the X positions of the two encoder bases 54 partly overlap the X position of projection optical system 16, encoder bases 54 and projection optical system 16 are arranged mechanically separated (in a non-contact state). Note that encoder bases 54 may be arranged separately on the +Y side and the −Y side of projection optical system 16.

To the lower surfaces of encoder bases 54, a plurality of encoder scales 56 (hereinafter simply referred to as scales 56) is fixed. In the embodiment, as is shown in FIG. 4A, two scales 56 are arranged in an area further to the +Y side of projection optical system 16 and two scales 56 are arranged in an area further to the −Y side of projection optical system 16, with the two scales each arranged separately in the Y-axis direction. That is, to encoder base 54, a total of four scales 56 are fixed. Scales 56, which consist of plate-like (strip-shaped) members with a rectangular-shape in a planar view extending in the Y-axis direction, are made of quartz glass, similarly to scales 52 arranged on substrate stage device 20. Each of the plurality of scales 56 has a grating area (grating section) in which a reflective two-dimensional grating or two reflective one-dimensional gratings with different (e.g. orthogonal) arrangement directions (periodic directions) are formed, and in the embodiment, similar to scale 46 and scale 52, scale 56 has an X scale on which a one-dimensional grating whose arrangement direction (periodic direction) is in the X-axis direction is formed and a Y scale on which a one-dimensional grating whose arrangement direction (periodic direction) is in the Y-axis direction is formed, and two scales each are arranged on both sides of projection optical system 16 in the Y-axis direction, with the grating areas of the two scales set apart from each other in the Y-axis direction. Note that to facilitate understanding, while the plurality of scales 56 illustrated in solid lines are illustrated as if the scales were arranged on the upper surface of encoder base 54 in FIG. 4A, the plurality of scales 56 are actually arranged at the lower surface side of encoder base 54, as shown in FIG. 1. Note that while two each of scales 56 are provided at the +Y side and the −Y side of projection optical system 16 in the embodiment, the number of scales 56 provided does not have to be two, but may be one, three, or more. Also, while scale 56 is to be provided with the grating surface facing downward (so that the grating area becomes parallel to the XY plane) in the embodiment, scale 56 may be provided, for example, so that the grating area becomes parallel to the YZ plane.

Figure 4C:
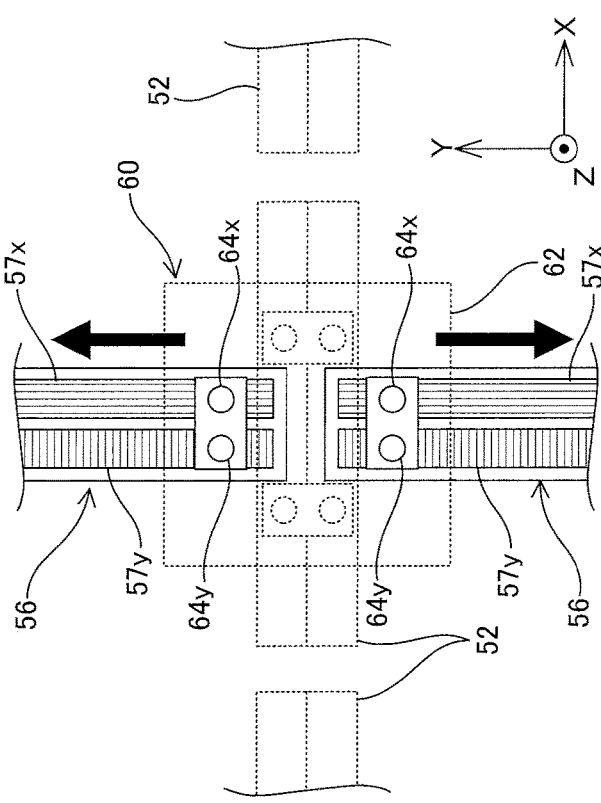

As shown in FIG. 4C, X scales $57x$ are formed in areas on one side (the +X side in FIG. 4C) in the width direction at the lower surface of scales 56. Also, Y scales $57y$ are formed in areas on the other side (the −X side in FIG. 4C) in the width direction at the lower surface of scales 56. Since the structure of X scales $57x$ and Y scales $57y$ is the same as X scales 47x and Y scales 47y (each refer to FIG. 2B) formed on scales 46 (each refer to FIG. 2A) of mask encoder system 48 described above, the description thereabout will be omitted.

Referring back to FIG. 1, the two head units 60 are arranged apart in the Y-axis direction below encoder base 54. Since each of the two head units 60 is substantially the same except for the point that the units are placed symmetrically in the lateral direction f the page surface in FIG. 1, hereinafter only one of the units (at the −Y side) will be described. Head unit 60, as it can be seen from FIGS. 4B and 4C, is equipped with Y slide table 62, a pair of X heads 64x, a pair of Y heads 64y, a pair of X heads 66x, and a pair of Y heads 66y. Note that the pair of head units 60 in the embodiment has the same structure as the pair of head units 44 of mask encoder system 48, except for the point that the pair of head units is rotated by 90 degrees.

Y slide table 62, which consists of a plate-like member having a rectangular-shape in a planar view, is placed below encoder base 54 via a predetermined clearance with respect to encoder base 54. Also, the Z position of Y slide table 62 is set to be on the +Z side than that of substrate holder 34 which substrate stage device 20 has (each refer to FIG. 1), regardless of the Z tilt position of substrate holder 34.

Y slide table 62 is moved in long strokes in the Y-axis direction by head unit drive system 86 (refer to FIG. 6) that includes an actuator such as a linear motor. A mechanical linear guide device is provided for guiding Y slide table 62 straightly in the Y-axis direction, in between Y slide table 62 and encoder base 54. Also, relative movement in the X-axis direction of Y slide table 62 is limited with respect to encoder base 54 by the operation of the linear guide device described above.

Main controller 90 (refer to FIG. 6) synchronously moves, as appropriate, one of the head units 60 (the +Y side) placed further to the +Y side than projection optical system 16 below two scales 56, and the other of the head units 60 (the −Y side) placed further to the −Y side than projection optical system 16 below two scales 56, in predetermined strokes in the Y-axis direction. Here, while the pair of head units 60 may be moved synchronously with the movement of substrate stage device 20 in the Y-axis direction, in the embodiment, the pair of head units 60 is moved so that with each of the pair of head units 60, not all measurement beams of the pair of X heads 66 and the pair of Y heads 66y move off of the grating area of scale 52 (at least irradiation of one measurement beam on the grating area is maintained) in the Y-axis direction. Note that while a linear motor is used as the actuator for moving Y slide table 62 in the embodiment, the embodiment is not limited to this, and the actuator may be other driving devices such as a belt driver, a feed screw device or the like. Note that in the embodiment, while the structure is employed in which Y slide table 62 is provided at the lower surface (refer to FIG. 4) of upper mount section 18a of apparatus main section 18, Y slide table 62 may be provided at lower mount section 18b or at middle mount section 18b.

X head 64x, Y head 64y, X head 66x, and Y head 66y are each an encoder head of the so-called diffraction interference method similar to X head 49x and Y head 49y (each refer to FIG. 2B) that mask encoder system 48 describe above has, and are fixed to Y slide table 62. Here, with head units 60, the pair of Y heads 64y, the pair of X heads 64x, the pair of Y heads 66y, and the pair of X heads 66x are fixed to Y slide table 62, so that the distance between the heads of each pair does not change due to vibration or the like. Also, Y slide table 62 itself is formed of a material having a thermal expansion coefficient lower than scales 52 and 56 (or equal to scales 52 and 56), so that the mutual distance between; the pair of Y heads 64y, the pair of X heads 64x, the pair of Y heads 66y, and the pair of X heads 66x, does not change due to temperature change or the like. Also, the spacing (length in the X-axis direction) between X head 64x and Y head 64y whose Y positions are the same is set shorter than the width (length in the X-axis direction) of scale 56. Similarly, the spacing (length in the Y-axis direction) between X head 66x and Y head 66y whose X positions are the same is set shorter than the width (length in the Y-axis direction) of scale 52.

Figure 5:
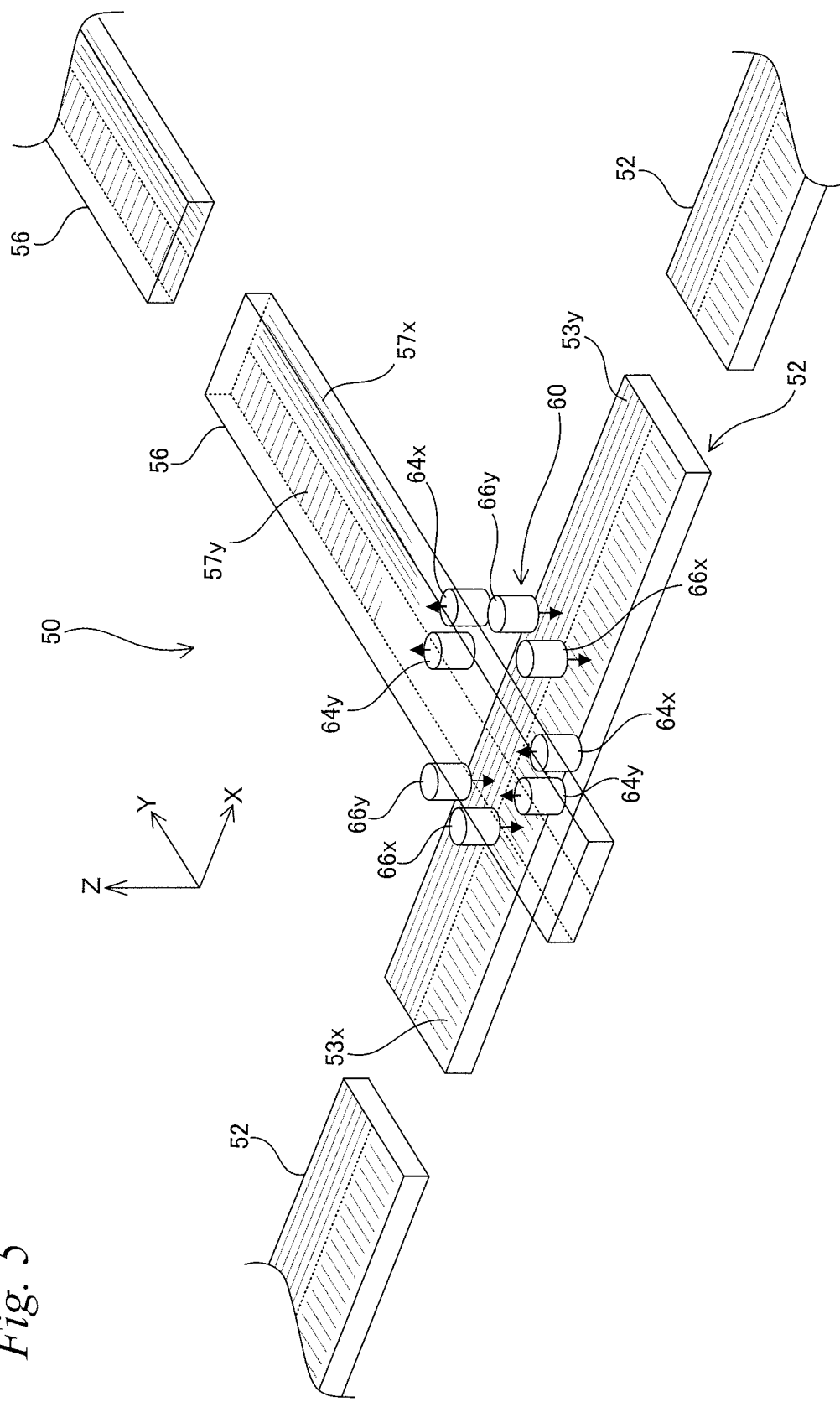
FIG. 5 is a schematic view of the substrate encoder system.

As shown in FIG. 5, each of the pair of X heads 64x irradiates two places (two points) separate from each other in the Y-axis direction on X scale 57x with a measurement beam, and each of the pair of Y heads 64y irradiates two places (two points) separate from each other in the Y-axis direction on Y scale 57y with a measurement beam. At substrate encoder system 50, by receiving beams from scales corresponding to the X heads 64x and Y heads 64y described above, information on displacement quantity of Y slide table 62 (not shown in FIG. 5; refer to FIGS. 4B and 4C) is supplied to main controller 90 (refer to FIG. 6).

That is, in substrate encoder system 50, by eight (2×4) X heads 64x and X scales 57x (different depending on the Y position of Y slide table 62) facing the X heads 64x, eight X linear encoders 96x (not shown in FIG. 5; refer to FIG. 6) are structured, used for acquiring position information in the Y-axis direction of each of the four Y slide tables 62 (that is, the four head units 60 (refer to FIG. 1)), and by eight (2×4) Y heads 64y and Y scales 57y (different depending on the Y position of Y slide table 62) facing the Y heads 64y, eight Y linear encoders 96y (not shown in FIG. 5; refer to FIG. 6) are structured, used for acquiring position information in the Y-axis direction of each of the four Y slide tables 62.

Main controller 90, as shown in FIG. 6, acquires position information of each of the four head units 60 (refer to FIG. 1) in the X-axis direction and the Y-axis direction, based on the output of the eight X linear encoders 96x and the eight Y linear encoders 96y, at a resolution of 10 nm or less. Also, main controller 90 obtains θz position information (rotation amount information) of one head unit 60, based on outputs of the two X linear encoders 96x (or the two Y linear encoders 96y) corresponding to the one head unit 60. Main controller 90 controls the position of head units 60 in the XY plane using head unit drive system 86 (refer to FIG. 6), based on the position information of each of the four head units 60 within the XY plane.

Figure 4A:
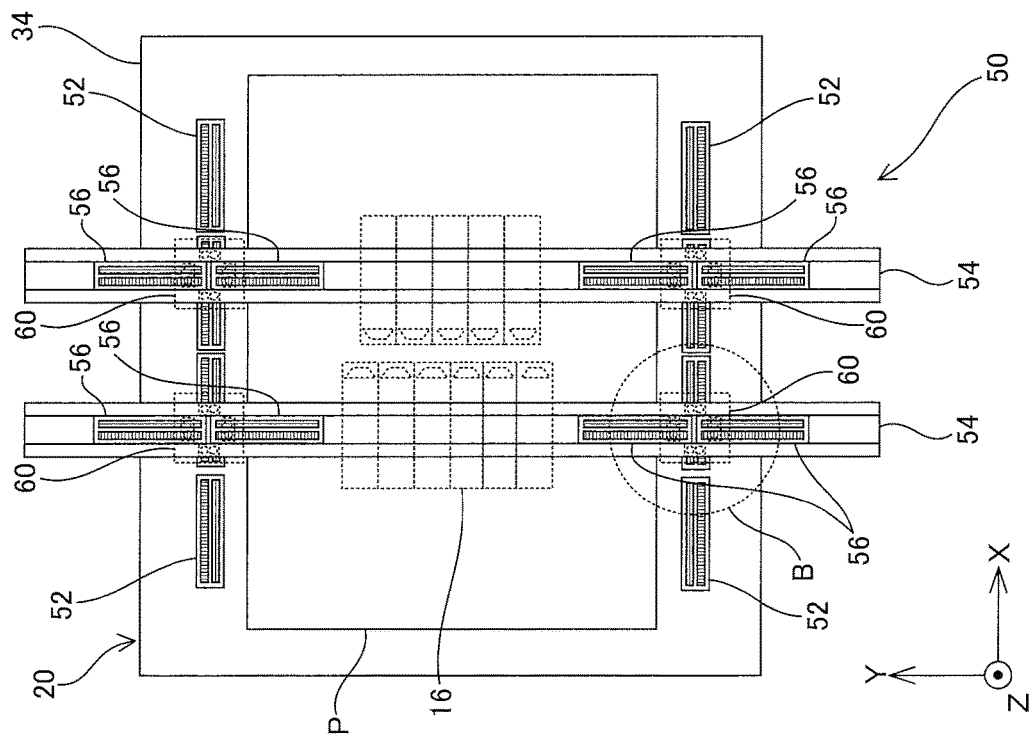
FIG. 4A is a view schematically showing a structure of a substrate encoder system.

Now, as shown in FIG. 4A, at encoder base 54, two scales 56 are arranged at a predetermined spacing in the Y-axis direction in areas at the +Y side and −Y side of projection optical system 16, as is described above.

Similarly to the above mask encoder system 48, also in substrate encoder system 50, the spacing between each head of the pair of X heads 64x and each head of the pair of Y head 64y that one head unit 60 has is set wider than the spacing between the adjacent scales 56, as shown in FIG. 4C. This allows at least one head of the pair of X heads 64x to constantly face X scale 57x and at least one head of the pair of Y heads 64y to constantly face Y scale 57y, in substrate encoder system 50. Substrate encoder system 50, therefore, is able to acquire position information of Y slide table 62 (head units 60) without interrupting the measurement values. Accordingly, linkage process (refer to FIGS. 3A to 3E, or to FIGS. 10A to 10C) of the outputs of the heads similar to the linkage process of the outputs of the heads in mask encoder system 48 described above is performed here as well.

Main controller 90, as is shown in FIG. 6, obtains position information in the X-axis direction and the Y-axis direction of substrate holder 34 (refer to FIG. 1) with respect to apparatus main section 18 (refer to FIG. 1) at a resolution of 10 nm or less, based on outputs of the eight X linear encoders 94$x$, the eight Y linear encoders 94$y$, and outputs of the eight X linear encoders 96$x$, and the eight Y linear encoders 96$y$ (that is, position information of each of the four head units 60 in the XY plane). Also, main controller 90 obtains θz position information (rotation quantity information) of substrate holder 34, based on at least two outputs of eight X linear encoders 94$x$ (or, eight Y linear encoders 94$y$). Main controller 90 controls the position of substrate holder 34 within the XY plane using substrate driving system 93, based on position information of substrate holder 34 within the XY plane obtained from the measurement values of the above substrate encoder system 50.

Also, since substrate P is moved rotationally at a fine angle in the θz direction also during exposure operation, to make obtaining position information of substrate P in the θz direction possible, in substrate encoder system 50, of the total of 16 heads facing downward (eight X heads 66$x$ and eight Y heads 66$y$), spacing between each of the heads and spacing between each of the scales are set so that at least three heads constantly face either of the scales. This allows a state to be maintained in which position information in directions of three degrees of freedom (X, Y, 8$z$) within the horizontal plane of substrate holder 34 can be obtained constantly during the exposure operation.

Also, as is shown in FIG. 3A, substrate holder 34, as is described above, has four scales 52 which are placed at a predetermined spacing in the X-axis direction in each of the areas on the +Y side and the −Y side of substrate P.

Similarly to the above mask encoder system 48, the spacing between the heads of the pair of X heads 66$x$ and heads of the pair of Y heads 66$y$ that one head unit 60 has is set wider than the spacing between adjacent scales 52, as shown in FIG. 4B. This allows at least one head of the pair of X heads 66$x$ to constantly face X scale 53$x$ and at least one head of the pair of Y heads 66$y$ to constantly face Y scale 53$y$, in substrate encoder system 50. Substrate encoder system 50, therefore, is able to obtain position information of substrate holder 34 (refer to FIG. 4A) without interrupting the measurement values. Accordingly, linkage process (refer to FIGS. 3A to 3E, or to FIGS. 10A to 10C) of the outputs of the heads similar to the linkage process of the outputs of the heads in mask encoder system 48 described above is performed here as well.

Note that all descriptions (including explanatory notes) on heads and scales structuring mask encoder system 48 previously described may be applied similarly, as for the pair of Y heads 64$y$, the pair of X heads 64$x$, the pair of Y heads 66$y$, and the pair of X heads 66$x$ that each of the pair of head units 60 of substrate encoder system 50 has and scales 56 and 52 irradiated with the measurement beams from these heads.

Figure 11A:
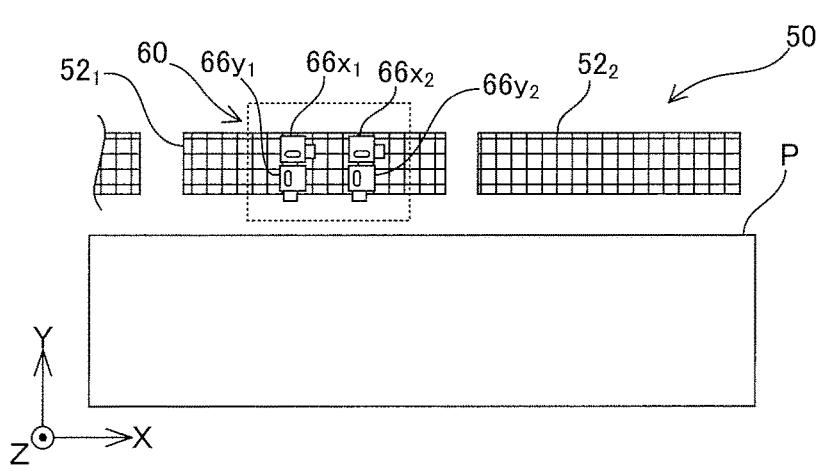
FIGS. 11A to 11F are views (No. 1 to No. 6) used to explain a modified example (No. 2) of the linkage process of head outputs.
Figure 11B:
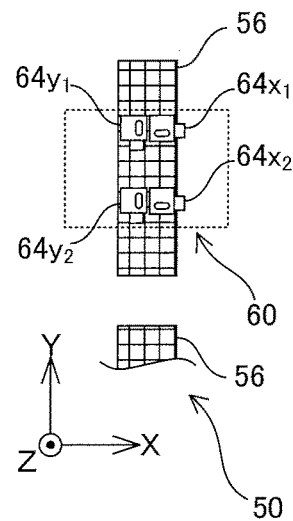
Figure 11C:
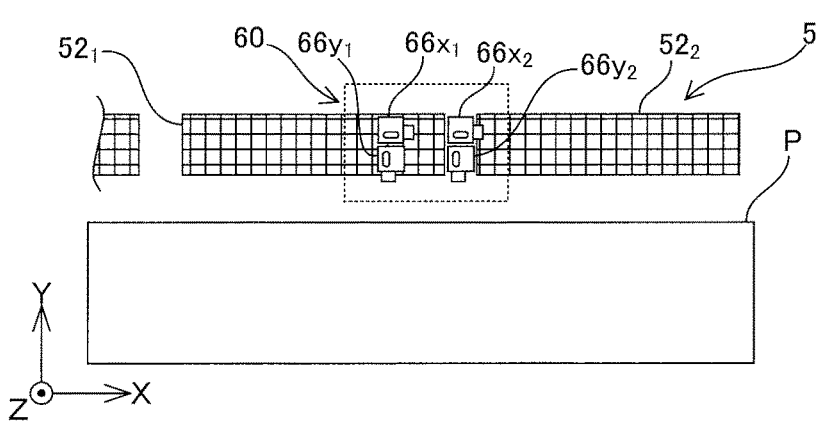
Figure 11D:
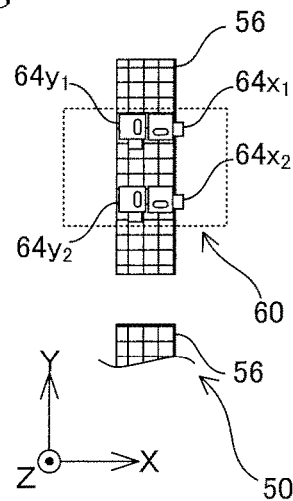
Figure 11E:
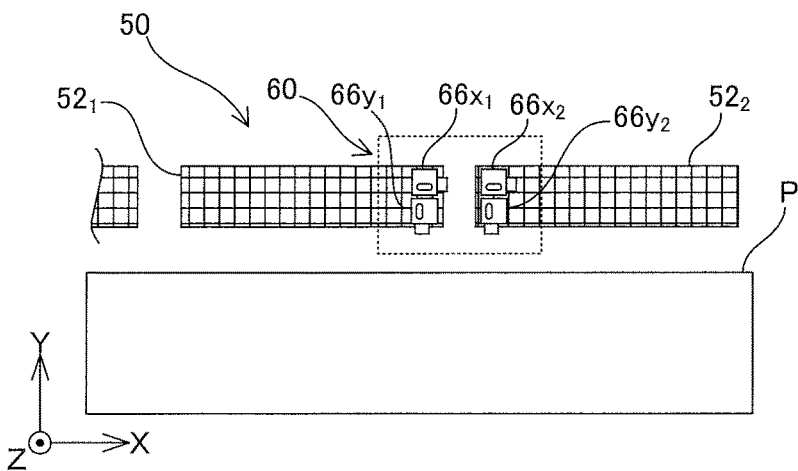
Figure 11F:
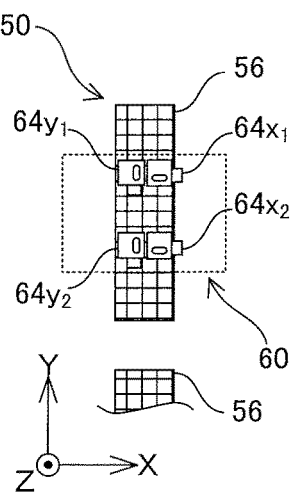

Note that in the first modified example (refer to FIGS. 10A to 10C) of the linkage process described above, while the linkage process was performed using the four heads (that is, a total of eight heads) that each of the pair of head units 44 (or head units 60) has arranged on the +Y side and the −Y side of mask M (or substrate P), as for the linkage process of the heads facing downward (X heads 66$x$, Y heads 66$y$) for obtaining position information of substrate holder 34, a linkage process shown in FIGS. 11A to 11F can also be performed. A second modified example of the linkage process will be described specifically below, using FIGS. 11A to 11F. Note that for convenience, in FIGS. 11A to 11F, the description will be made with the four heads facing downward represented by codes X heads 66$x_1$, 66$x_2$, and Y heads 66$y_1$, 66$y_2$, along with the four heads facing upward represented by reference codes X heads 64$x_1$, 64$x_2$, and Y heads 64$y_1$, 64$y_2$. Also, the description will be made with the pair of scales 52 which are adjacent subject to the linkage process represented by codes 52$_1$ and 52$_2$. Also, FIGS. 11B, 11D, and 11F are views corresponding to FIGS. 11A, 11C, and 11E, respectively.

Also in the second modified example of the linkage process, head unit 60 has four encoder heads facing downward (X heads 66$x_1$, 66$x_2$, and Y heads 66$y$, 66$y_2$) as is shown in FIG. 11A, and the linkage process is performed on the assumption that the positional relation between these four heads is known. Furthermore, head unit 60, as is shown in FIG. 11B, also has four encoder heads facing upward (X heads 64$x_1$, 64$x_2$, and Y heads 64$y_1$, 64$y_2$), and the linkage process is performed on the assumption that the positional relation between these four heads is also known. Positional relation between these heads can be obtained in a state by using corresponding scales (scales 52 or scales 56) when each of the four heads facing upward or each of the four heads facing downward faces the corresponding scales, or by using a measurement device (such as a laser interferometer) arranged between each of the heads. Here, in the linkage process of the modified example, the linkage process is performed on the assumption that during the linkage process, the four heads facing upward (X heads 64$x_1$, 64$x_2$, and Y heads 64$y_1$, 64$y_2$) do not move off of scale 56 fixed to apparatus main section 18 (refer to FIG. 1). Furthermore, the linkage process is performed also on the assumption that grid error between scale 56 (fixed) and scale 52 (movable) on the substrate holder (refer to FIG. 4A) is known.

In the first modified example (refer to FIGS. 10A to 10C) described above, while output values of heads that have been deactivated are restored of the total of eight heads, using the total of eight heads that the pair of head units 44 has, in the second modified example, in the case two heads move into a deactivated state of the four heads facing downward (X heads 66$x_1$, 66$x_2$, and Y heads 66$y_1$, 66$y_2$) that one head unit 60 has, output values of the deactivated heads described above are restored, using output values of the four heads (X heads 64$x_1$, 64$x_2$, and Y heads 64$y_1$, 64$y_2$) facing upward.

To describe this specifically, with substrate encoder system 50, as is shown in FIG. 11A, since scales 52$_1$ and 51$_2$ are arranged separately placed in the X-axis direction, when substrate P is moved in the −X direction from a state where the four heads (X heads 66$x_1$, 66$x_2$, and Y heads 66$y$, 66$y_2$) face one of the scales 52$_1$, a state occurs in which of the four heads that head unit 60 has, two heads (X head 49$x_2$ and Y head 49$y_2$) whose X positions are the same simultaneously move off of scales 52$_1$ and 51$_2$ (are deactivated), as is shown in FIG. 11C. As is described above, a control is performed on the outputs of each of the heads that move off of scales 52$_1$ and 52$_2$ so that the outputs become undefined values (or zero). Also, as is described above, when substrate P is moved in the X-axis direction, head unit 60 is controlled (refer to FIGS. 11B, 11D, and 11F), so that the position within respect to scale 56 which is fixed does not change.

Main controller 90 (refer to FIG. 6) performs a restoring process (linkage process using the output values of the other heads) of the output values of the deactivated heads before the two heads (X head 66$x_2$ and Y head 66$y_2$) that have moved into a deactivated state (a state in which the output values are undefined) described above as is shown in FIG. 11E face the other scale $52_2$. In the case of restoring the output value of head $66y_2$ in the deactivated state, of the six heads (X heads $66x_1$, $64x_1$, $64x_2$ and Y heads $66y$, $64y_1$, $64y_2$) in an active state, by using three arbitrary outputs (of e.g., X head $66x_1$, Y heads $66y_1$, $64y_1$), position relation between the three active heads and the deactivated head $66y_2$ subject to the linkage process is obtained. As is described above, the positional relation between these heads is to be known. Also, the active three heads used in the linkage process described above includes at least one head (one of X head $66x_1$, X heads $64x_1$, and $64x_2$ in the example above) whose measurement direction is in the X-axis direction and at least one head (one of Y head $66y_1$, Y heads $64y_1$, and $64y_2$ in the example above) whose measurement direction is in the Y-axis direction.

Main controller 90 (refer to FIG. 6) obtains position information (position information in each of the X, the Y, and the θz directions) of the deactivated Y head $66y_2$ from the output values of the three active heads described above, calculates (estimates) the output value of Y head $66y_2$ based on the position information, and uses this as the output value of Y head $66y_2$ that has been activated again. The same applies to the linkage process performed on X head $66x_2$ shown in FIG. 11C which is in the deactivated state.

FIG. 6 is a block diagram showing an input/output relation of main controller 90, which mainly structures a control system of liquid crystal exposure apparatus 10 (refer to FIG. 1) and has overall control over each section. Main controller 90, which includes a work station (or a microcomputer) or the like, has overall control over each section of liquid crystal exposure apparatus 10.

In liquid crystal exposure apparatus 10 (refer to FIG. 1) having the structure described above, under the control of main controller 90 (refer to FIG. 6), a mask loader not shown performs loading of mask M onto mask stage device 14, and a substrate loader not shown performs loading of substrate P onto substrate stage device 20 (substrate holder 34). Main controller 90 then executes alignment measurement (detection of a plurality of alignment marks on substrate P) using an alignment detection system not shown, and then, when the alignment measurement has been completed, sequentially performs an exposure operation of a step-and-scan method on a plurality of shot areas set on substrate P. Note that position information of substrate holder 34 is measured by substrate encoder system 50 also in the alignment measurement operation.

Next, an example of an operation of mask stage device 14 and substrate stage device 20 at the time of exposure operation will be described, using FIGS. 7A to 9B. Note that, in the description below, while the case of setting four shot areas on one substrate P (in the case of a four-piece setting) will be described, the number and placement of the shot areas set on one substrate P can be appropriately changed.

Figure 7A:
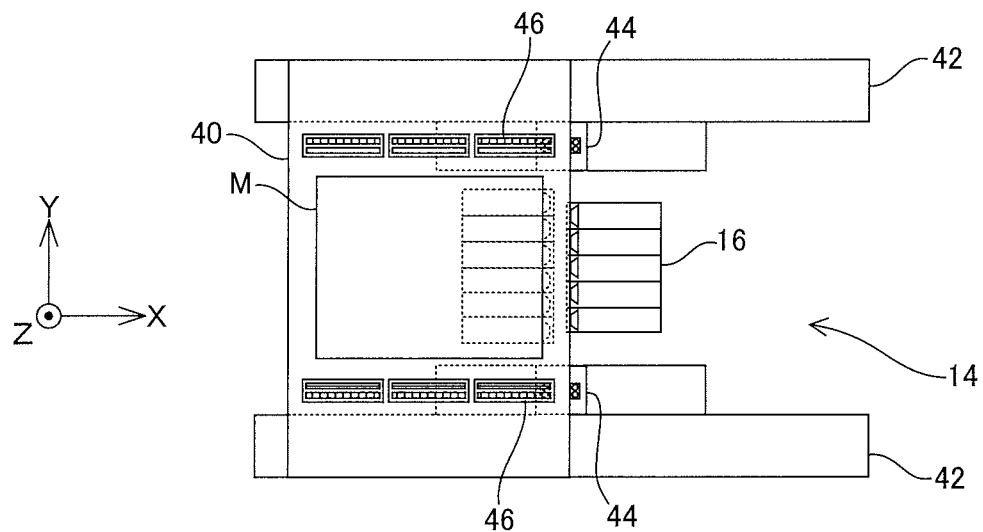
FIG. 7A is a view (No. 1) showing an operation of the mask encoder system at the time of exposure operation.
Figure 7B:
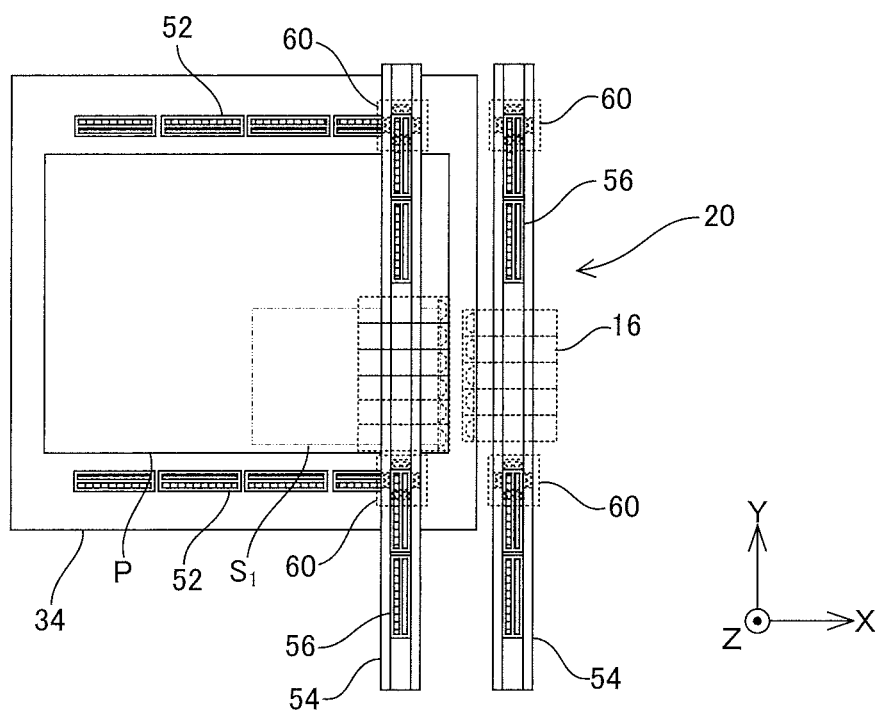
FIG. 7B is a view (No. 1) showing an operation of the substrate encoder system at the time of exposure operation.

FIG. 7A shows mask stage device 14 which has completed alignment operation, and FIG. 7B shows substrate stage device 20 (members other than substrate holder 34 are not shown. The same applies to the description below) which has completed alignment operation. Exposure processing, as an example, is performed from a first shot area S1 which is set at the −Y side and also the +X side of substrate P, as shown in FIG. 7B. In mask stage device 14, positioning of mask M is performed based on the output of mask encoder system 48 (refer to FIG. 6), so that the edge at the +X side of mask M is positioned slightly to the −X side than the illumination area (in the state shown in FIG. 7A, however, illumination light IL is not irradiated yet on mask M) of illumination light IL irradiated from illumination system 12 (refer to FIG. 1 for each section), as shown in FIG. 7A.

To be more specific, the edge at the +X side of mask M is placed to the −X side with respect to the illumination area, only by an entrance length necessary to perform scanning exposure at a predetermined speed (that is, acceleration distance necessary to reach the predetermined speed), and at the position, scales 46 are arranged so that the position of mask M can be measured with mask encoder system 48. Main controller 90 (refer to FIG. 6) also performs position control of mask holder 40 within a range in which at least three heads (three heads of four heads 49x and four heads 49y) do not move off (do not move outside the measurement range) of scales 46.

Also, in substrate stage device 20, positioning of substrate P is performed based on the output of substrate encoder system 50 (refer to FIG. 6), so that the edge at the +X side of the first shot area 81 is positioned slightly to the −X side than the exposure area (in the state shown in FIG. 7B, however, illumination light IL is not irradiated yet on substrate P) on which illumination light IL (refer to FIG. 1) from projection optical system 16 is irradiated, as shown in FIG. 7B. To be more specific, the edge at the +X side of the first shot area S1 of substrate P is placed to the −X side with respect to the exposure area, only by an entrance length necessary to perform scanning exposure at a predetermined speed (that is, acceleration distance necessary to reach the predetermined speed), and at the position, scales 52 are arranged so that the position of substrate P can be measured with substrate encoder system 50. Main controller 90 (refer to FIG. 6) also performs position control of substrate holder 34 within a range in which at least three (three of eight heads 66x and eight heads 66y) heads do not move off (do not move outside the measurement range) of scales 52.

Note that also when scanning exposure of the shot areas has been completed and mask M and substrate P are decelerated, scales 46 and 52 are arranged similarly so that mask encoder system 48 and substrate encoder system 50 can measure the position of mask M and substrate P, respectively, until mask M and substrate P has finished moving further by a deceleration distance necessary for deceleration to a predetermined speed from the speed at the time of scanning exposure. Alternatively, the position of mask M and substrate P may each be measured by measurement systems different from mask encoder system 48 and substrate encoder system 50, during at least one of the operations of acceleration and deceleration.

Figure 8A:
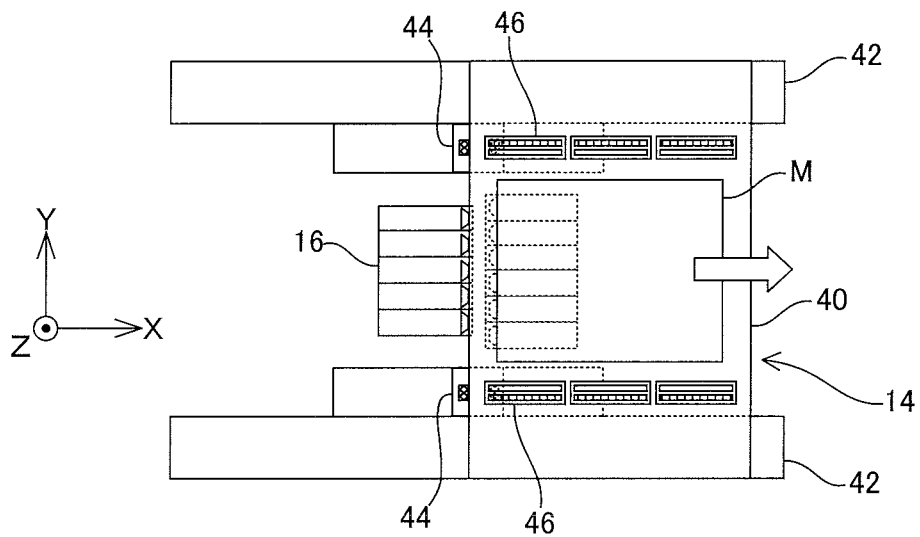
FIG. 8A is a view (No. 2) showing an operation of the mask encoder system at the time of exposure operation.
Figure 8B:
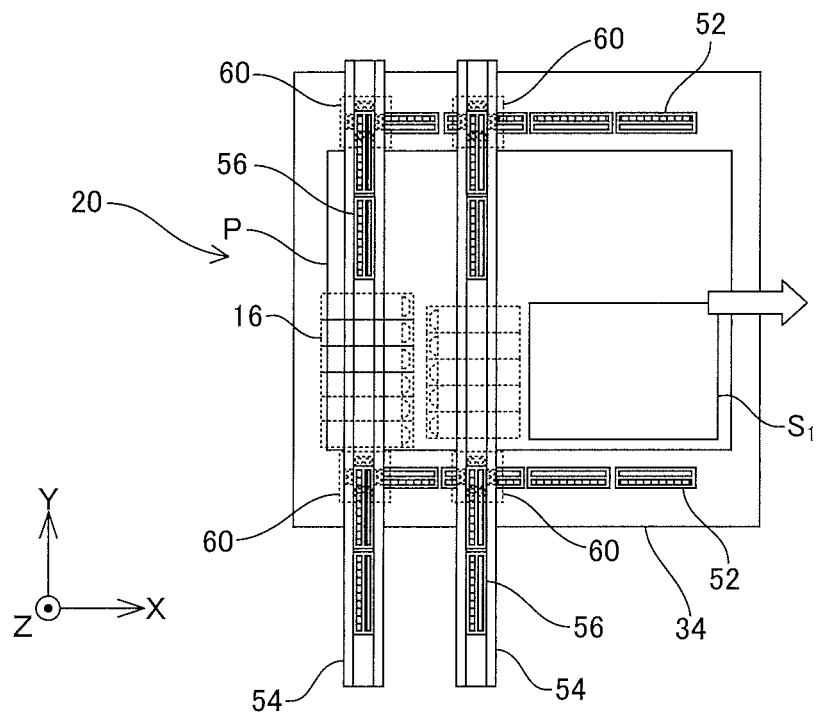
FIG. 8B is a view (No. 2) showing an operation of the substrate encoder system at the time of exposure operation.

Next, mask holder 40 is moved in the +X direction (acceleration, constant speed drive, and deceleration) as shown in FIG. 8A, and synchronously with mask holder 40, substrate holder 34 is moved in the +X direction (acceleration, constant speed drive, and deceleration) as shown in FIG. 8B. When mask holder 40 is moved, main controller 90 (refer to FIG. 6) performs position control of mask M based on the output of mask encoder system 48 (refer to FIG. 6) as well as perform position control of substrate P based on the output of substrate encoder system 50 (refer to FIG. 6). When substrate holder 34 is moved in the X-axis direction, the four head units 60 are to be in a stationary state. While mask holder 40 and substrate holder 34 are moved at a constant speed in the X-axis direction, illumination light IL (refer to FIG. 1 for each part) that has passed through mask M and projection optical system 16 is irradiated on substrate P, and by this operation, the mask pattern that mask M has is transferred to shot area S1. Note that since substrate holder 34 is moved in fine strokes in the Y-axis direction at the time of scanning exposure, in the case measurement beams from each of the heads 66s and 66y may possibly move off of the corresponding scales 53x and 53y, head unit 60 may be moved in fine strokes in the Y-axis direction synchronously with substrate holder 34 at the time of scanning operation.

Figure 9A:
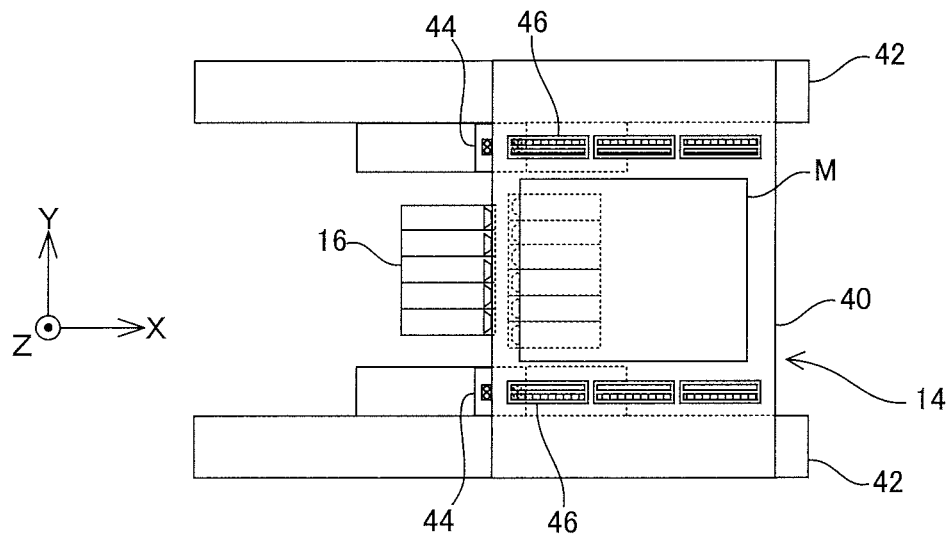
FIG. 9A is a view (No. 3) showing an operation of the mask encoder system at the time of exposure operation.
Figure 9B:
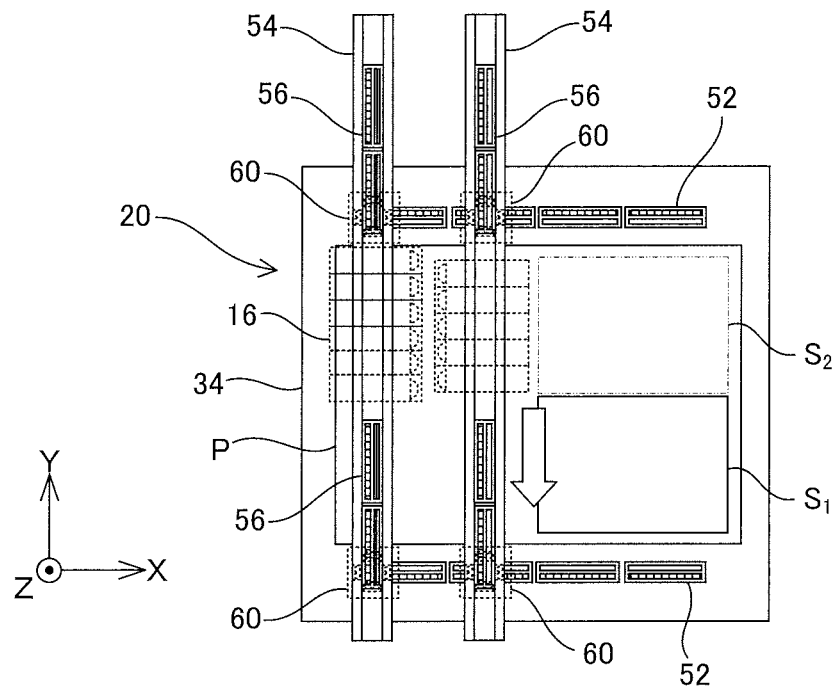
FIG. 9B is a view (No. 3) showing an operation of the substrate encoder system at the time of exposure operation.

When transfer of the mask pattern to the first shot area on substrate P is been completed, in substrate stage device 20, substrate holder 34 is moved (Y step) based on the output of substrate encoder system 50 (refer to FIG. 6) in the −Y direction by a predetermined distance (a distance almost half of the dimension in the width direction of substrate P), for exposure operation of a second shot area S2 set at the +Y side of the first shot area S1, as shown in FIG. 9B. In the above Y stepping operation of substrate holder 34, mask holder 40 is stationary in a state where the edge of mask M at the −X side is positioned slightly to the +X side than the illumination area (in the state shown in FIG. 9A, however, mask M is not illuminated), as shown in FIG. 9A.

In the above Y stepping operation of substrate holder 34, as shown in FIG. 9B, at substrate stage device 20, the four head units 60 are moved in the Y-axis direction synchronously with substrate holder 34. That is, as is shown in FIG. 6, main controller 90, of substrate encoder system 50, moves the four head units 60 in the Y-axis direction via the head unit drive system 86, based on the output of Y linear encoders 96y, while moving substrate holder 34 in the Y-axis direction to a target position via substrate driving system 93, based on the output of Y linear encoders 94y. On this operation, main controller 90 moves the four of head units 60 synchronously with substrate holder 34 (so that the four head units 60 follow substrate holder 34). Also, main controller 90 performs position control of Y slide table 62 within a range in which at least one head of the plurality of heads 64x and 64y does not move off (does not move outside the measurement range) of scales 56.

Accordingly, each of the measurement beams irradiated from X heads 66x and Y heads 66y (refer to FIG. 5 for each head) does not move away from X scales 53x and Y scales 53y (refer to FIG. 5 for each scale), regardless of the Y position of substrate holder 34 (including when substrate holder 34 is moving). In other words, the four head units 60 should move synchronously with substrate holder 34 in the Y-axis direction, at a degree in which each of the measurement beams irradiated from X heads 66x and Y heads 66y while substrate holder 34 is moved in the Y-axis direction (during the Y stepping operation) do not move away from X scales 53x and Y scales 53y, that is, at a degree in which measurement by the measurement beams from X heads 66x and Y heads 66y is not interrupted (measurement can be continued).

On this operation, movement of Y slide table 62 (X heads 64x, 66x, Y heads 64y, 66y) in the step direction may be started prior to substrate holder 34, before movement of substrate holder 34 in the step direction (the Y-axis direction) is started. This allows acceleration of each of the heads to be suppressed, and furthermore, allows tilt (inclining forward in the advancing direction) of each of the heads to be suppressed. Also, instead of this, movement of Y slide table 62 in the step direction may be started later than substrate holder 34.

In the description below, although it is not illustrated, when the Y stepping operation of substrate holder 34 is completed, mask holder 40 is moved in the −X direction based on the output of mask encoder system 48 (refer to FIG. 6), and synchronously with mask holder 40, substrate holder 34 is moved in the −X direction based on the output of substrate encoder system 50 (refer to FIG. 6). This allows the mask pattern to be transferred to the second shot area S2. The four head units 60 is to be in a stationary state also on this operation. Hereinafter, by appropriately repeating the scanning operation of mask holder 40, the Y stepping operation of substrate holder 34, and the scanning operation of substrate holder 34 described above, the mask pattern is sequentially transferred with respect to the plurality of shot areas on substrate P. In the exposure operation described above, the pair of head units 60 is moved in the same direction by the same distance as substrate holder 34 each time substrate holder 34 is stepped in the +Y direction and the −Y direction, so that the state facing scales 56 is maintained.

Here, as is described above, at the time of Y stepping operation of substrate holder 34 described above, in substrate stage device 20, four Y sliders 76 are moved in the Y-axis direction synchronously with substrate holder 34. That is, main controller 90 (refer to FIG. 6), moves Y sliders 76 in the Y-axis direction based on an output of a Y slider position measurement system 80 (refer to FIG. 4; an encoder system in this case), while moving substrate holder 34 in the Y-axis direction to a target position based on the output of the encoder system. On this operation, main controller 90 moves Y sliders 76 synchronously with substrate holder 34 (so that Y sliders 76 follow substrate holder 34). Also, main controller 90 performs position control of Y sliders 76 within a range in which at least one head of a plurality of heads 384x and 384y does not move off (does not move outside the measurement range) of a scale plate 340.

Accordingly, each of the measurement beams irradiated from X heads 384x and Y heads 384y (refer to FIG. 20 for each head) does not move away from X scales 342x and Y scales 342y (refer to FIG. 20 for each scale), regardless of the Y position of substrate holder 34 (including when substrate holder 34 is moving). In other words, for example, two Y sliders 76 should move synchronously with substrate holder 34 in the Y-axis direction, at a degree in which each of the measurement beams irradiated from X heads 384x and Y heads 384y while substrate holder 34 is moved in the Y-axis direction (during the Y stepping operation) do not move away from X scales 342x and Y scales 342y, that is, at a degree in which measurement by the measurement beams from X heads 384x and Y heads 384y is not interrupted (measurement can be continued). That is, the movement of the pair of head units 60 and substrate holder 34 in the Y-axis direction does not have to be synchronous, or a follow-up movement.

On this operation, movement of Y slider 76 (X heads 384x, 386x, Y heads 384y, 386y) in the step direction may be started prior to substrate holder 34, before movement of substrate holder 34 in the step direction (the Y-axis direction) is started. This allows acceleration of each of the heads to be suppressed, and furthermore, allows tilt (inclining forward in the advancing direction) of each of the heads to be suppressed. Also, instead of this, movement of Y slider 76 in the step direction may be started later than substrate holder 34.

Also, when the Y stepping operation of substrate holder 34 is completed, mask M (refer to FIG. 1) is moved in the −X direction based on the output of mask stage position measurement system 54 (refer to FIG. 4), and synchronously with mask M, by substrate holder 34 being moved in the −X direction based on the output of a position measurement system within the horizontal plane of the substrate stage (refer to FIG. 4; encoder system in this case), the mask pattern is transferred onto the shot area of substrate P. On this operation, for example, the two sliders 76 are to be in a stationary state. With liquid crystal exposure apparatus 10, by appropriately repeating the scanning operation of mask M, the Y stepping operation of substrate holder 34, and the scanning operation of substrate holder 34 described above, the mask pattern is sequentially transferred with respect to the plurality of shot areas on substrate P. In the exposure operation described above, for example, the two Y sliders 76 are moved in the same direction by the same distance as substrate holder 34 each time substrate holder 34 is stepped in the +Y direction and the −Y direction, so that the state facing target 338 (scale plate 340) is maintained.

Figure 20:
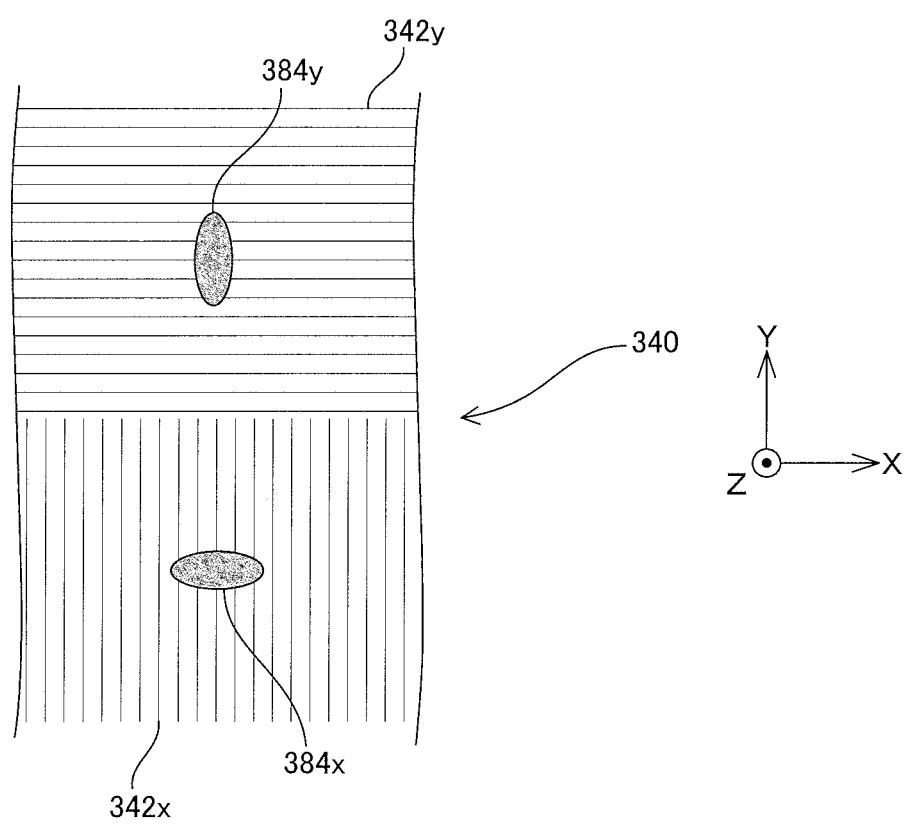
FIG. 20 is a view showing an irradiation point of a measurement beam on an encoder scale.

Here, as is described above, Y scale 53y has a plurality of grid lines extending in the X-axis direction. Also, as is shown in FIG. 20, an irradiation point 66y (the same code as the Y head is used for convenience) of the measurement beam from Y head 66y irradiated on Y scale 53y is elliptic, with the long axis direction being in the Y-axis direction. With Y linear encoder 94y (refer to FIG. 6), when Y head 66y and Y scale 53y are relatively moved in the Y-axis direction and the measurement beam crosses over the grid lines, the output from Y head 66y changes, based on phase change of $\pm 1^{st}$ order diffracted light from the irradiation point.

Meanwhile, main controller 90 (refer to FIG. 6) controls position (Y position) in the step direction of head unit 60 during the scanning exposure operation described above, so that Y head 66y that head unit 60 (refer to FIG. 4B) has does not cross over the plurality of grid lines forming Y scale 53y, that is, the output from Y head 66y does not change (the change remains zero), when substrate holder 34 is moved in the scanning direction (the X-axis direction).

Specifically, the Y position of Y head 66y is measured by a sensor having resolution higher than the pitch between the grid lines that structure Y scale 53, and just before the irradiation point of the measurement beam from Y head 66y crosses the grid lines (when the output of Y head 66y is about to change), the Y position of Y head 66y is controlled via head unit drive system 86 (refer to FIG. 6). Note that this is not limited, and for example, in the case the output of Y head 66y changes by the measurement beam from Y head 66y crossing over the grid lines, by controlling the drive of Y head 66y according to the change, the change of the output from Y head 66y may be substantially canceled. In this case the sensor to measure the Y position of Y head 66y is not required.

As is described so far, with liquid crystal exposure apparatus 10 according to the present embodiment, because mask encoder system 48 for acquiring the position information of mask M within the XY plane and substrate encoder system 50 for acquiring the position information of substrate P within the XY plane (refer to FIG. 1 for each system) each has a short optical path length of the measurement beams irradiated on the corresponding scales, the influence of air fluctuation can be reduced when compared to conventional interferometer systems. Therefore, the positioning accuracy of mask M and substrate P improves. Also, since the influence of air fluctuation is small, partial air-conditioning unit which is indispensable when using a conventional interferometer system can be omitted, which allows cost reduction.

Furthermore, in the case of using the interferometer system, large and heavy bar mirrors had to be equipped in mask stage device 14 and substrate stage device 20, however, with mask encoder system 48 and substrate encoder system 50 according to the present embodiment, the above bar mirrors will not be necessary; therefore, the system including mask holder 40 (e.g. mask stage device) and the system including substrate holder 34 (e.g. substrate stage device) each becomes more compact and light, as well as the weight balance being improved, which improves position controllability of mask M and substrate P. Also, places that require adjustment are less than the case using the interferometer system, which allows cost reduction of mask stage device 14 and substrate stage device 14, and furthermore improves maintainability. Adjustment at the time of assembly also becomes easy (or unnecessary).

Also, in substrate encoder system 50 according to the embodiment, since the structure is employed of measuring the Y position information of substrate P by moving the four head units 60 in the Y-axis direction on movement (e.g. stepping operation) of substrate P in the Y-axis direction, there is no need to place a scale extending in the Y-axis direction or to increase the width in the Y-axis direction of the scale extending in the X-axis direction at the substrate stage device 20 side (or no need to arrange a plurality of heads in the Y-axis direction at the apparatus main section 18 side). This simplifies the structure of the substrate position measurement system, which allows cost reduction.

Also, in mask encoder system 48 according to the present embodiment, since the structure is employed of acquiring the position information of mask holder 40 in the XY plane while appropriately switching the output of the pair of adjacent encoder heads (X head 49x, Y head 49y) according to the X position of mask holder 40, the position information of mask holder 40 can be acquired without interruption, even if a plurality of scales 46 are arranged at a predetermined spacing (spaced apart from one another) in the X-axis direction. Accordingly, there is no need to prepare a scale having a length equal to the moving strokes of mask holder 40 (a length around three times of scale 46 of the present embodiment) in the system, which allows cost reduction, and this makes it suitable especially for liquid crystal exposure apparatus 10 that uses a large mask M as in the present embodiment. Also similarly, in substrate encoder system 50 according to the present embodiment, since a plurality of scales 52 are placed in the X-axis direction and a plurality of scales 56 are placed in the Y-axis direction each at a predetermined spacing, scales having a length equal to the moving strokes of substrate P do not have to be prepared, which makes it suitable for application in liquid crystal exposure apparatus 10 which uses a large substrate P.

Note that in the first embodiment described above, while the case has been described in which each of the four head units 60 has four heads (a pair of X heads 66x and a pair of Y heads 66y) used to measure the position of substrate holder 34, and a total of 16 heads are provided for position measurement of the substrate holder, the number of heads for position measurement of the substrate holder may be less than 16. Hereinafter, such an embodiment will be described.

Second Embodiment

Next, a second embodiment will be described, based on FIGS. 14 to 17C. Since the structure of the liquid crystal exposure apparatus according to the second embodiment is the same as the above first embodiment, except for the structure of a part of substrate encoder system 50, only the difference will be described below, and components having the same structure and function as the first embodiment will have the same reference signs as the first embodiment, and the descriptions thereabout will be omitted.

Figure 14:
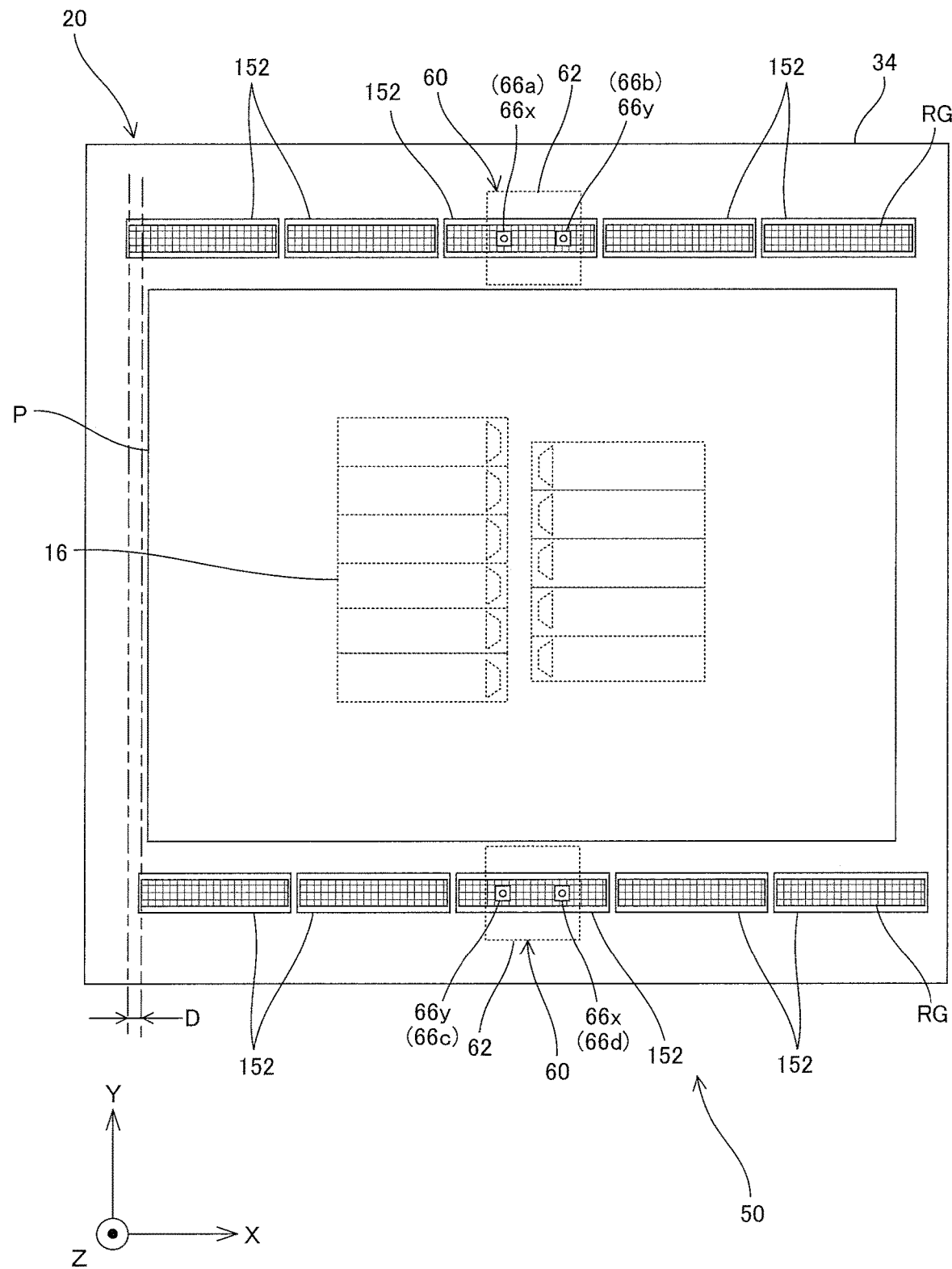
FIG. 14 is a planar view showing a substrate holder and a pair of head units of a substrate encoder system that a liquid crystal exposure apparatus according to a second embodiment has, along with a projection optical system.

FIG. 14 shows a planar view of substrate holder 34 and a pair of head units 60 of substrate encoder system 50 according to the second embodiment, along with projection optical system 16. In FIG. 14, to facilitate understanding of the description, illustration of encoder base 54 or the like is omitted. Also, in FIG. 14, head units 60 (Y slide table 62) are illustrated in dotted lines, while illustration of X head 64x and Y head 64y provided on the upper surface of Y slide table 62 is omitted. Here, while substrate encoder system 50 in the first embodiment described above has a pair of encoder bases 54, along with a total of four head units 60 (refer to FIG. 4 and the like) corresponding to the pair of encoder bases 54, with substrate encoder system 50 according to the second embodiment, only one encoder base 54 (not shown in FIG. 14) is provided and head units 60 are arranged one each on the +Y side and the −Y side of projection optical system 16.

In the liquid crystal exposure apparatus according to the second embodiment, as is shown in FIG. 14, in each of the areas on the +Y side and the −Y side with substrate mounting area of substrate holder 34 arranged in between, five encoder scales 152 (hereinafter simply referred to as scales 152) are arranged in the X-axis direction at a predetermined spacing so that grating areas are spaced apart from one another in the X-axis direction. With the five scales 152 arranged on the +Y side of the substrate mounting area and the five scales 152 arranged on the −Y side, the spacing between adjacent scales 152 (grating area) is the same, however, the arrangement positions of the five scales 152 on the −Y side, as a whole, are shifted to the +X side by a predetermined distance D (a distance slightly larger than the spacing between adjacent scales 152 (grating area)) with respect to the five scales 152 on the +Y side. This arrangement is employed to avoid a state from occurring in which of the total of four heads; two X heads 66x and two Y heads 66y to be described later on for measuring position information of substrate holder 34, two or more of the heads do not face any of the scales (that is, a non-measurement period in which the measurement beam moves off of the scale does not overlap among the four heads).

Each of the scales 152 consists of a plate-shaped (strip-shaped) member rectangular in a planar view extending in the X-axis direction, made of quartz glass. On the upper surface of each of the scales 152, a reflective two-dimensional diffraction grating (two-dimensional grating) RG is formed whose periodic direction is in the X-axis direction and the Y-axis direction in a predetermined pitch (1 μm). Hereinafter, the grating area described earlier will also be called simply as two-dimensional grating RG. Note that in FIG. 14, the spacing (pitch) between the grids of two-dimensional grating RG is illustrated remarkably wider than the actual spacing, for convenience of illustration. The same applies also to other drawings that will be described below. In the description below, the five scales 152 arranged in the area on the +Y side of substrate holder 34 will be referred to as a first grating group, and the five scales 152 arranged in the area on the −Y side of substrate holder 34 will be referred to as a second grating group.

To the lower surface (surface on the −Z side) of Y slide table 62 of one of the head units 60 positioned at the +Y side, X head 66x and Y head 66y are fixed apart by a predetermined distance (a distance slightly larger than the spacing between adjacent scales 152) in the X-axis direction, in a state facing scales 152, respectively. Similarly, to the lower surface (surface on the −Z side) of Y slide table 62 of the other head unit 60 positioned at the −Y side, Y head 66y and X head 66x are fixed apart by a predetermined distance in the X-axis direction, in a state facing scales 152, respectively. That is, X head 66x and Y head 66y facing the first grating group and X head 66x and Y head 66y facing the second grating group each irradiates scales 152 with a measurement beam at a spacing wider than the spacing of the grating area of adjacent scales 152. In the description below, for convenience of explanation, X head 66x and Y head 66y that one of the head units 60 has will be referred to as head 66a and head 66b, and X head 66x and Y head 66y that the other head unit 60 has will be referred to as head 66c and head 66d.

In this case, head 66a and head 66c are arranged at the same X position (on the same straight line parallel to the Y-axis direction), and head 66b and head 66d are arranged at the same X position (on the same straight line parallel to the Y-axis direction) which is different from the X position of head 66a and head 66c. By heads 66a and 66d and two-dimensional grating RG facing each of the heads, a pair of X linear encoders is structured, and by heads 66b and 66c and two-dimensional grating RG facing each of the heads, a pair of Y linear encoders is structured.

In the liquid crystal exposure apparatus according to the second embodiment, the structure of other parts including the remaining parts of head unit 60 is similar to liquid crystal exposure apparatus 10 according to the first embodiment described earlier, except for drive control (position control) of substrate holder 34 using the substrate encoder system by main controller 90.

Figure 15A:
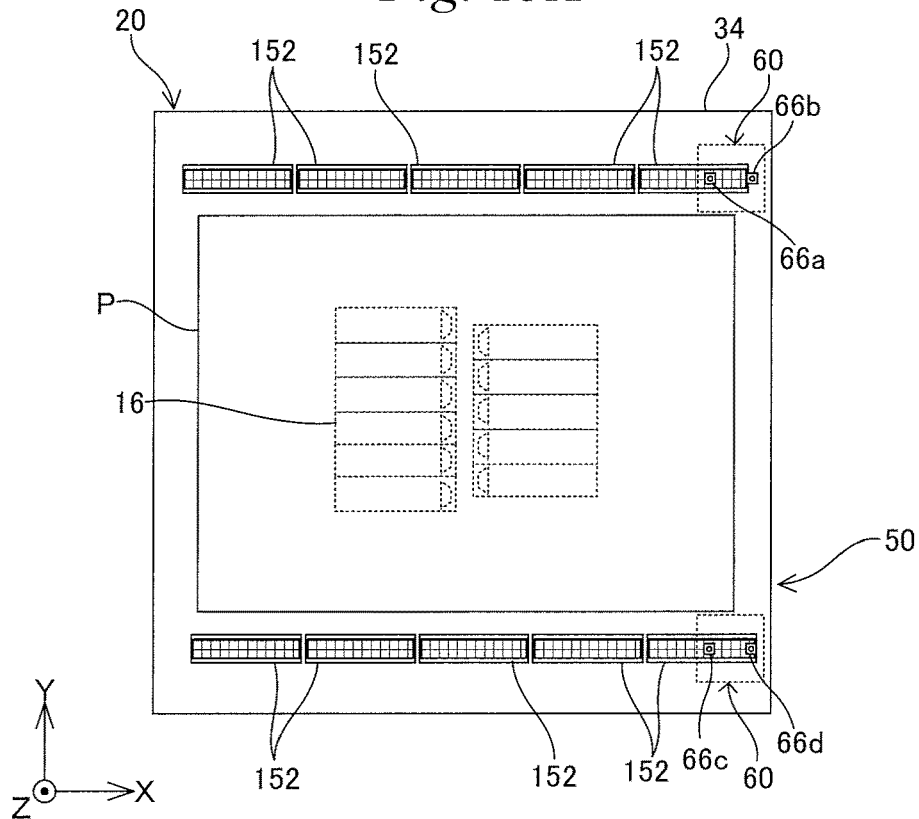
FIGS. 15A and 15B are views used to explain a movement range in the X-axis direction of the substrate holder when position measurement of the substrate holder is performed.
Figure 15B:
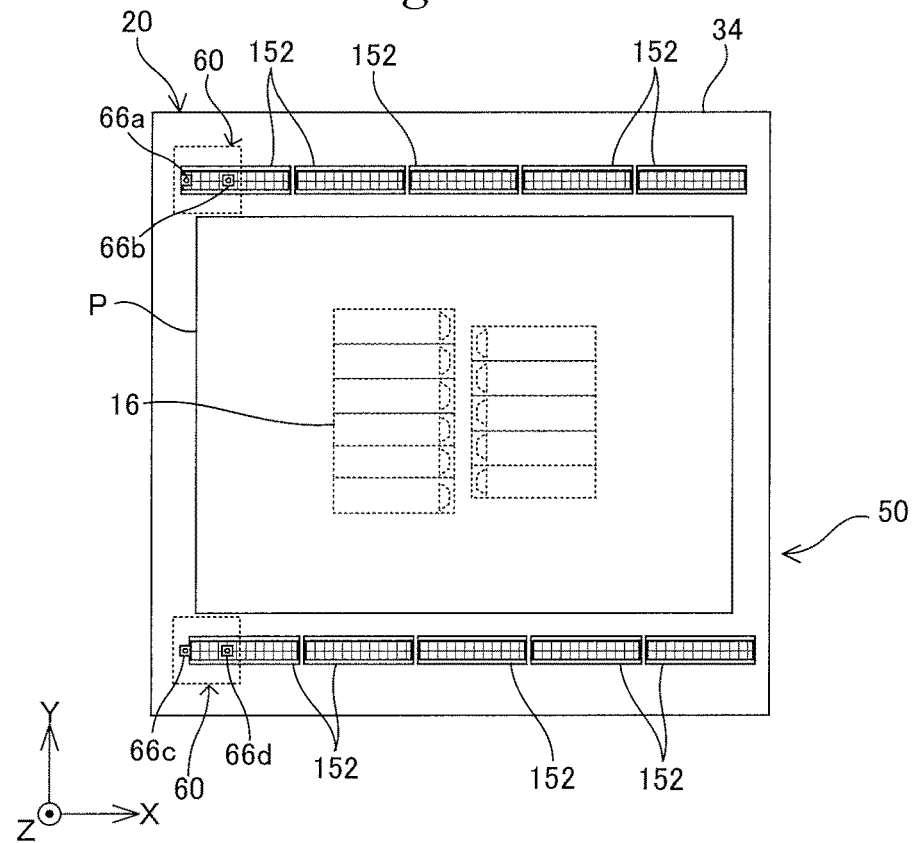

In the liquid crystal exposure apparatus according to the second embodiment, between a first position where a pair of head units 60 faces the +X edge of substrate holder 34 as is shown in FIG. 15A and a second position where a pair of head units 60 faces the −X edge of substrate holder 34 as is shown in FIG. 15B within a range in which substrate holder 34 moves in the X-axis direction, position measurement of substrate holder 34 can be performed by heads 60a to 60d of the pair of head units 60, that is, by the pair of X linear encoders and the pair of Y linear encoders. FIG. 15A shows a state in which only head 66b faces none of scales 152, and FIG. 15B shows a state in which only head 66c faces none of scales 152.

In the process in which substrate holder 34 is moved in between the first position shown in FIG. 15A and the second position shown in FIG. 15B, positional relation between the pair of head units 60 and scales 152 shifts between five states; between a first state to a fourth state shown in FIGS. 16A to 16D, respectively, and a fifth state in which all four heads 66a to 66d face two-dimensional grating RG of any one of the scales 152 (that is, the measurement beam of all four heads 66a to 66d irradiates two-dimensional grating RG. Hereinafter, instead of using the expressions; face two-dimensional grating RG of the scale, or the measurement beam is irradiated on two-dimensional grating RG of scale 152, these will be expressed simply as; heads face the scales.

Figure 16A:
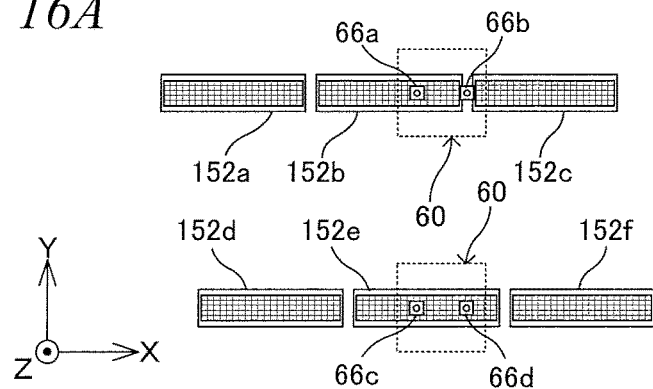
FIGS. 16A to 16D are views used to explain a first state to a fourth state in a state change of positional relation between a pair of head units and a scale in the process when the substrate holder moves in the X-axis direction in the second embodiment.

Here, the six scales 152 will be taken up for convenience of explanation, and codes a to f are to be used to identify each scale, using the expressions scales 152a to 152f (refer to FIG. 16A).

Figure 16B:
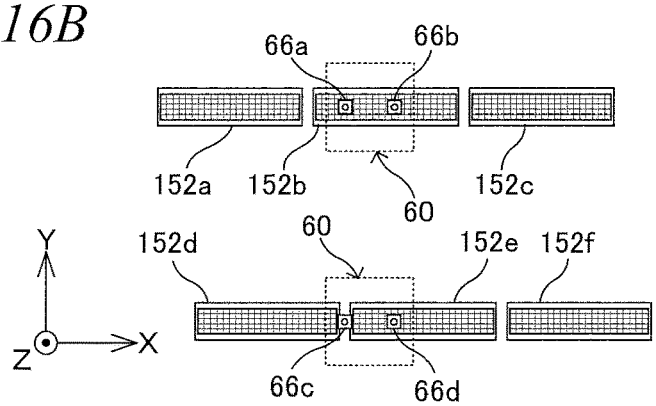

The first state shown in FIG. 16A shows a state in which head 66a faces scale 152b, heads 66c, 66d face scale 152e, and only head 66b faces none of the scales, and the second state shown in FIG. 16B shows a state in which substrate holder 34 moves in the +X direction by a predetermined distance from the state shown in FIG. 16A so that heads 66a, 66b face scale 152b, head 66d faces scale 152e, and only head 66c no longer faces any of the scales. In the process of shifting from the state in FIG. 16A to the state in FIG. 16B, the heads go through the fifth state in which heads 66a, 66b face scale 152b and heads 66c, 66d face scale 152e.

Figure 16C:
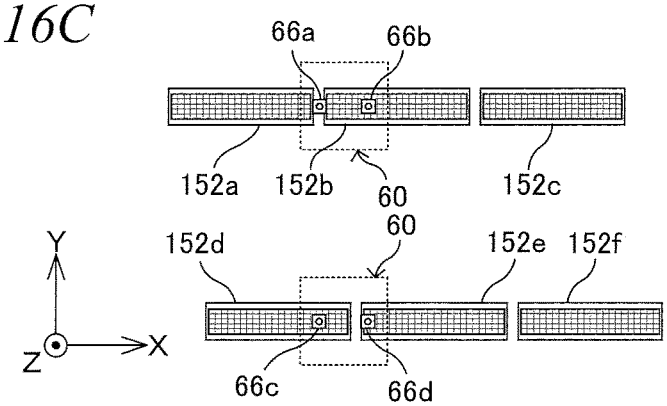

The third state in FIG. 16C shows a state in which substrate holder 34 has been moved in the +X direction by a predetermined distance from the state in FIG. 16B, and only head 66a no longer faces any of the scales. In the process of shifting from the state in FIG. 16B to the state in FIG. 16C, the heads go through the fifth state in which heads 66a, 66b face scale 152b, head 66c faces scale 152d, and head 66d faces scale 152e.

Figure 16D:
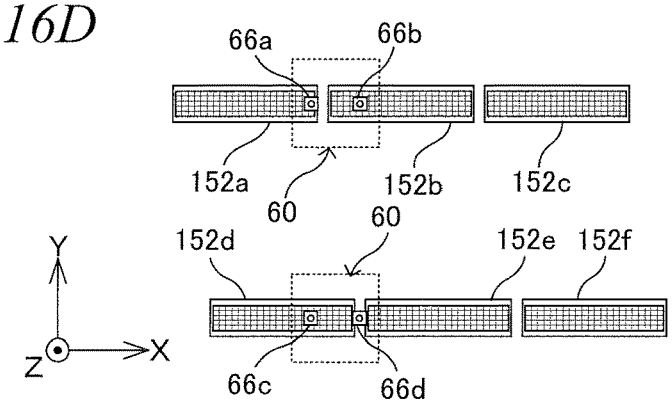

The fourth state in FIG. 16D shows a state in which substrate holder 34 has been moved in the +X direction by a predetermined distance from the state in FIG. 16C, and only head 66d no longer faces any of the scales. In the process of shifting from the state in FIG. 16C to the state in FIG. 16D, the heads go through the fifth state in which head 66a faces scale 152a, head 66b faces scale 152b, head 66c faces scale 152d, and head 66d faces scale 152e.

When substrate holder 34 is moved in the +X direction by a predetermined distance from the state in FIG. 16D, after going through the fifth state in which head 66a faces scale 152a, head 66b faces scale 152b, and heads 66c, 66d face scale 152d, the heads then move into the first state in which head 66a faces scale 152a, heads 66c, 66d face scale 152d, and only head 66b faces none of the scales.

While the description above is on the shift of the state (positional relation) between three each of scales 152 of the five scales 152 each arranged on the ±Y sides of substrate holder 34 and the pair of head units 60, also between the ten scales 152 and the pair of head units 60, when looking at three each of scales 152 that are adjacent of the five scales arranged each on the ±Y sides of substrate holder 34, the positional relation with the pair of head units shifts in a similar order as is described above.

In this way, in the second embodiment, at least three heads of the total of four heads; two X heads 66x, that is 66a, 66d, and two Y heads 66y, that is 66b, 66c, constantly face any of the scales 152 (two-dimensional grating RG) even when substrate holder 34 is moved in the X-axis direction. Furthermore, even when substrate holder 34 is moved in the Y-axis direction, since the pair of Y slide table 62 is moved in the Y-axis direction so that the measurement beams of the four heads do not move off of scales 152 (two-dimensional grating RG) in the Y-axis direction, at least three of the four heads face any of the scales 152. Accordingly, main controller 90 can constantly control position information of substrate holder 34 in the X-axis direction, the Y-axis direction, and the θz direction, using three heads of heads 66a to 66d. This point will be described further below.

When measurement values of X head 66x and Y head 66y are to be CX and CY, respectively, measurement values CX and CY can be expressed in the following equations (1a) and (1b), respectively.

$$CX=(pi-X)\cos \theta z+(qi-Y)\sin \theta z \quad (1a)$$

$$CY=-(pi-X)\sin \theta z+(qi-Y)\cos \theta z \quad (1b)$$

Here, X, Y, and θx show the position of substrate holder 34 in the X-axis direction, the Y-axis direction, and the θz direction, respectively. Also, pi and qi are the X position coordinate values and the Y position coordinate values of each of the heads 66a to 66d. In the embodiment, the X coordinate values and the Y coordinate values (pi, qi) (i=1, 2, 3, 4) of each of the heads 66a, 66b, 66c, and 66d can be calculated easily from the position information in the X-axis direction and the Y-axis direction (position of the center of Y slide table 62 in the X-axis direction and the Y-axis direction) of each of the pair of head units 60 (refer to FIG. 1) calculated from the output of the four X linear encoders 96x and the four Y linear encoders 96y, based on a known relation of each head with respect to the center of Y slide table 62.

Accordingly, when substrate holder 34 and the pair of head units 60 have a positional relation as is shown in FIG. 15A and the position of substrate holder 34 within the XY plane in directions of three degrees of freedom is (X, Y, θz), then measurement values of the three heads 66a, 66c, and 66d can theoretically be expressed by the following equations, (2a) to (2c) (also called an affine transformation relation).

$$C1=(p1-X)\cos \theta z+(q1-Y)\sin \theta z \quad (2a)$$

$$C3=-(p3-X)\sin \theta z+(q3-Y)\cos \theta z \quad (2b)$$

$$C4=(p4-X)\cos \theta z+(q4-Y)\sin \theta z \quad (2c)$$

In a reference state where substrate holder 34 is at a coordinate origin (X, Y, θz)=(0, 0, 0), by simultaneous equations (2a) to (2c), C1=p1, C3=q3, and C4=p4. The reference state is a state in which the center of substrate holder 34 (almost coincides with the center of substrate P) coincides with the center of the projection area by projection optical system 16 and the θz rotation is zero. Accordingly, in the reference state, the Y position of substrate holder 34 can also be measured by head 66b, and measurement value C2 by head 66b, according to equation (1b), is C2=q2.

Accordingly, when the measurement values of the three heads 66a, 66c, and 66d are to be initially set to p1, q3, and p4 in the reference state, hereinafter, the three heads 66a, 66c, and 66d are to present theoretical values given by the equations (2a) to (2c) with respect to displacements (X, Y, θz) of substrate holder 34.

Note that in the reference state, instead of one of the heads 66a, 66c, and 66d, such as 66c, measurement value C2 of head 66b may be initially set as q2.

In this case, hereinafter, the three heads 66a, 66b, and 66d are to present theoretical values given by the equations (2a), (2c), and (2d) with respect to displacements (X, Y, θz) of substrate holder 34.

$$C1=(p1-X)\cos \theta z+(q1-Y)\sin \theta z \quad (2a)$$

$$C4=(p4-X)\cos \theta z+(q4-Y)\sin \theta z \quad (2c)$$

$$C2=-(p2-X)\sin \theta z+(q2-Y)\cos \theta z \quad (2d)$$

In simultaneous equations (2a) to (2c) and simultaneous equations (2a), (2c), and (2d), three equations are given with respect to three variables (X, Y, θz). Therefore, conversely, if dependent variables C1, C3, and C4 in simultaneous equations (2a) to (2c), or dependent variables C1, C4, and C2 in simultaneous equations (2a), (2c), and (2d) are given, variables X, Y, and θz can be obtained. Here, the equations can be solved easily when an approximate sin θz≈θz is applied, or when a higher approximate is applied. Accordingly, positions (X, Y, θz) of wafer stage WST can be calculated from measurement values C1, C3, and C4 (or C1, C2, and C4) of heads 66a, 66c, and 66d (or heads 66a, 66b, and 66d).

Next, a linkage process, namely, initial setting of measurement values, at the time when switching heads of the substrate encoder system that measures position information of substrate holder 34 performed in the liquid crystal exposure apparatus according to the second embodiment, will be described centering on the operation of main controller 90.

Figure 17A:
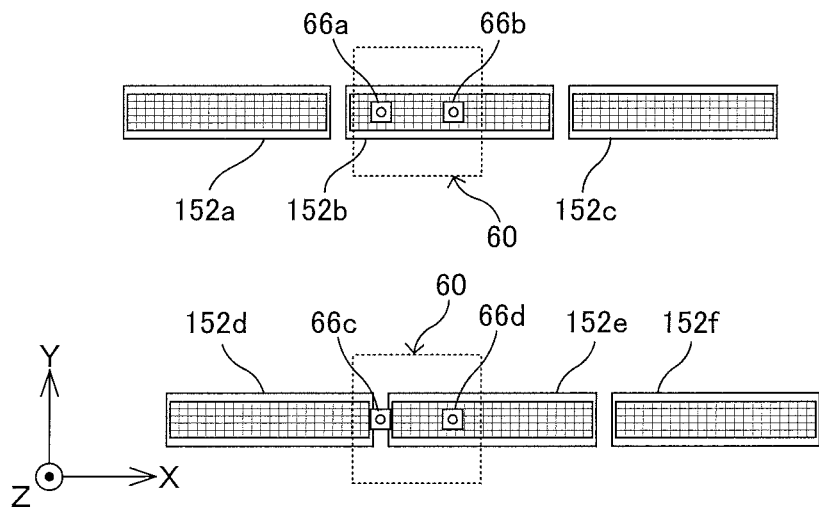
FIGS. 17A to 17C are views used to explain a linkage process at the time of switching heads of the substrate encoder system that measures position information of the substrate holder performed in the liquid crystal exposure apparatus according to the second embodiment.
Figure 17B:
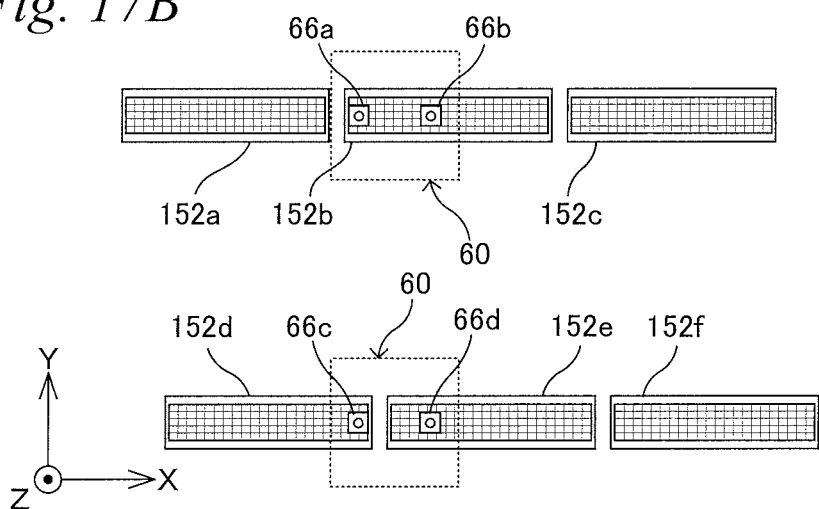
Figure 17C:
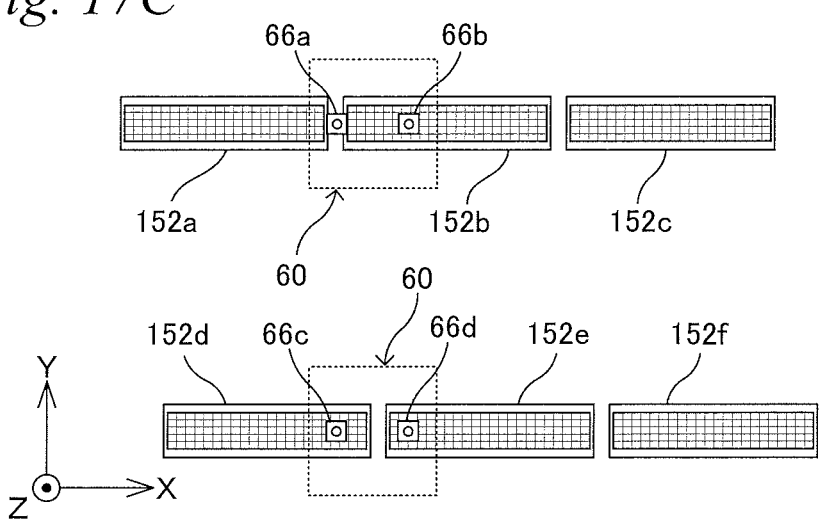

In the second embodiment, as is previously described, three encoders (X heads and Y heads) are constantly measuring the position information of substrate holder 34 in an effective stroke range of substrate holder 34, and on performing the switching process of the encoders (X head or Y head), as is shown in FIG. 17B, each of the four heads 66a to 66d faces any of the scales 52 and moves into a state (the fifth state described earlier) so that the position of substrate holder 34 can be measured. FIG. 17B shows an example of the fifth state that appears during the change of state from the state shown in FIG. 17A in which the position of substrate holder 34 is measured with heads 66a, 66b, and 66d and then substrate holder 34 is moved in the +X direction to the state shown in FIG. 17C in which the position of substrate holder 34 is measured with heads 66b, 66c, and 66d. That is, FIG. 17B shows a state in which the three heads used for measuring position information of substrate holder 34 are being switched, from heads 66a, 66b, and 66d to heads 66b, 66c, and 66d.

At the moment when the switching process (linkage) of heads (encoders) used for position control (measurement of position information) of substrate holder 34 within the XY plane, heads 66a, 66b, 66c, and 66d are facing scales 152b, 152b, 152d, and 152e, respectively, as is shown in FIG. 17B. When taking a look at FIGS. 17A to 17C, it may appear that head 66a is about to be switched to head 66c in FIG. 17B, however, as it is obvious from the point that the measurement direction is different in head 66a and head 66c, it is meaningless to give the measurement value (count value) of head 66a without any changes to head 66c as an initial value of the measurement value at the timing when linkage is performed.

Therefore, in the embodiment, main controller 90 is to perform switching from the measurement of position information (and position control) of substrate holder 34 using the three heads 66a, 66b, and 66d to the measurement of position information (and position control) of substrate holder 34 using the three heads 66b, 66c, and 66d. That is, in this method, the concept is different from a normal encoder linkage and the linkage is not from one head to another head, but is a method of linking a combination of three heads (encoders) to another combination of three heads (encoders).

Main controller 90, first of all, solves simultaneous equations (2a), (2c), and (2d) based on measurement values C1, C4, and C2 of heads 66a, 66d, and 66b, and calculates position information (X, Y, θz) of the substrate holder within the XY plane.

Next, main controller 90 substitutes X and θz calculated above into the following affine transformation equation (equation (3)), and obtains the initial value (the value that should be measured by head 66c) of the measurement value of head 66c.

$$C3 = -(p3-X)\sin \theta z + (q3-Y)\cos \theta z \quad (3)$$

In equation (3) above, p3 is the X coordinate value and q3 is the Y coordinate value of head 66c. In the embodiment, as is described earlier, as for coordinate values (p3, q3), the values are used that are calculated from the position of the center of Y slide table 62 in the X-axis direction and the Y-axis direction of each of the pair of head units 60 calculated from the output of the four X linear encoders 96x and the four Y linear encoders 96y, based on the known positional relation of head 66c with respect to the center of Y slide table 62.

By giving initial value C3 described above as the initial value of head 66c, linkage is to be completed without contradictions while maintaining the positions (X, Y, θz) of substrate holder 34 in directions of three degrees of freedom. Thereinafter, the position coordinates (X, Y, θz) of wafer stage WST are calculated by solving the following simultaneous equations (2b) to (2d), using the measurement values C2, C3, and C4 of heads 66b, 66c, and 66d which are used after the switching.

$$C3 = -(p3-X)\sin \theta z + (q3-Y)\cos \theta z \quad (2b)$$

$$C4 = (p4-X)\cos \theta z + (q4-Y)\sin \theta z \quad (2c)$$

$$C2 = -(p2-X)\sin \theta z + (q2-Y)\cos \theta z \quad (2d)$$

Note that while the case has been described above when the switching is from three heads to another three heads including one head different from the three heads, it was described in this way because the values to be measured using the another heads after switching is calculated based on the principle of affine transformation, using the positions (X, Y, θz) of substrate holder 34 obtained from the measurement values of the three heads used before switching, and the calculated values are set as initial values of the another heads used after switching. However, when focusing only on the two heads serving as direct targets of switching and linkage process, without referring to the procedure of calculation and the like of the values to be measured using the another heads used after switching, it may also be said that one head of the three heads used before switching is switched to a different head. In any case, the switching of the heads is performed in a state where the head used for measurement of position information and position control of the substrate holder before switching and the head used after switching both simultaneously face any of the scales 152.

Note that while the description above is an example of switching of heads 66a to 66d, in switching from any three heads to another three heads, or switching from one of the heads to another head, switching of heads is performed in a procedure similarly to the procedure described above.

The liquid crystal exposure apparatus according to the second embodiment described so far has a working effect equivalent to the liquid crystal exposure apparatus according to the first embodiment described earlier. Adding to this, with the liquid crystal exposure apparatus according to the second embodiment, while substrate holder 34 is moved, position information (including θz rotation) of substrate holder 34 within the XY plane is measured by three heads (encoders) including at least one each of X head 66x (X linear encoder) and Y head 66y (Y linear encoder) of substrate encoder system 50. Then, by main controller 90, the head (encoder) used for measuring position information of substrate holder 34 within the XY plane is switched from one of the heads (encoders) of the three heads (encoders) used for position measurement and position control of substrate holder 34 before switching to another head (encoder), so that the position of substrate holder 34 within the XY plane is maintained before and after the switching. Therefore, the position of substrate holder 34 within the XY plane is maintained before and after the switching and an accurate linkage becomes possible, even though switching of the encoders used for controlling the position of substrate holder 34 has been performed. Accordingly, substrate holder 34 (substrate P) can be moved along the XY plane accurately along a predetermined moving route while switching and linkage (linkage process of measurement values) of the heads are performed among a plurality of heads (encoders).

Also, with the liquid crystal exposure apparatus according to the second embodiment, during exposure of the substrate, substrate holder 34 is moved within the XY plane by main controller 90, based on measurement results of position information of substrate holder 34 and position information ((X, Y) coordinate values) within the XY plane of the three heads used for measuring the position information. In this case, main controller 90 moves substrate holder 34 within the XY plane while calculating the position information of substrate holder 34 within the XY plane using the affine transformation relation. This allows the movement of substrate holder 34 (substrate P) to be controlled with good accuracy while switching the heads (encoders) used for control of the movement of substrate holder 34 using the encoder system having each of a plurality of Y heads 66y or a plurality of X heads 66x.

Note that in the second embodiment described above, while the correction information (initial value of the another head previously described) for controlling the movement of the substrate holder using the head (corresponding to the another head described above) whose measurement beam moves off from one of the adjacent pair of scales and moves to irradiate the other scale was acquired, based on the position information measured by the three heads facing at least one scale 152, this correction information should be acquired by the time one of the three heads facing at least one scale 152 moves off of two-dimensional grating RG, after the measurement beam of the another head is moved to irradiate the other scale. Also, in the case of performing position measurement or position control of the substrate holder by switching the three heads facing at least one scale 152 to three different heads including the another head described above, this switching should be performed by the time one of the three heads facing at least one scale 152 moves off of two-dimensional grating RG, after the correction information described above has been acquired. Note that acquiring the correction information and the switching may substantially be performed at the same time.

Note that in the second embodiment described above, each of the five scales 152 of the first grating group and the second grating group is arranged on substrate holder 34 so that the area that has no two-dimensional grating RG of the first grating group (non-grating area) does not overlap the area that has no two-dimensional grating RG of the second grating group (non-grating area) in the X-axis direction (first direction), or in other words, so that the non-measurement period in which the measurement beam moves off of two-dimensional grating RG does not overlap in the four heads. In this case, heads 66a and 66b that head unit 60 on the +Y side has, are arranged at a spacing wider than the width of the area that has no two-dimensional grating RG of the first group in the X-axis direction, and heads 66c and 66d that head unit 60 on the −Y side has, are arranged at a spacing wider than the width of the area that has no two-dimensional grating RG of the second group in the X-axis direction. However, the combination of the grating section including the plurality of two-dimensional gratings and the plurality of heads that can face the grating section is not limited to this. The point is, spacing between heads 66a and 66b and spacing between heads 66c and 66d, position, position and length of the grating section of the first and second grating groups, spacing between the grating sections and their positions should be set, so that the (non-measurable) non-measurement period in which the measurement beam moves off of two-dimensional grating RG does not overlap in the four heads 66a, 66b, 66c, and 66d during the movement of the movable body in the X-axis direction. For example, even if the position and the width of the non-grating area in the X-axis direction is the same in the first grating group and the second grating group, two heads facing at least one scale 152 (two-dimensional grating RG) of the first grating group and two heads facing at least one scale 152 (two-dimensional grating RG) of the second grating group may be arranged shifted only by a distance wider than the width of the non-grating area in the X-axis direction. In this case, the spacing between the head arranged on the +X side of the two heads facing the first grating group and the head arranged on the −X side of the two heads facing the second grating group may be set wider than the width of the non-grating area, or the two heads facing the first grating and the two heads facing the second grating may be arranged alternately in the X-axis direction, with the spacing between adjacent pair of heads being be set wider than the width of the non-grating area.

Also, in the second embodiment described above, while the case has been described in which the first grating group is arranged in an area on the +Y side of substrate holder 34, and the second grating group is arranged in an area on the −Y side of substrate holder 34, instead of one of the first grating group and the second grating group, such as the first grating group, a single scale member on which a two-dimensional grating extending in the X-axis direction is formed, may be used. In this case, one head may be made to constantly face the single scale member. In this case, a structure may be employed in which three heads may be provided to face the second grating group, and by making the spacing (spacing between irradiation positions of the measurement beams) in the X-axis direction of the three heads wider than the spacing between two-dimensional grating RG on adjacent scales 152, at least two of the three heads facing the second grating group can face at least one two-dimensional grating RG of the second grating group regardless of the position of substrate holder 34 in the X-axis direction. Or, a structure may be employed in which at least two heads constantly face the single scale member described above regardless of the position of substrate holder 34 in the X-axis direction, together with at least one head facing at least one two-dimensional grating RG of the second grating group. In this case, each of the measurement beams of the at least two heads moves off of one of the plurality of scales 152 (two-dimensional grating RG) during the movement of substrate holder 34 in the X-axis direction, and is moved to irradiate another scale 152 (two-dimensional grating RG) adjacent to the one scale 152 (two-dimensional grating RG). However, by making the spacing between the at least two heads in the X-axis direction wider than the spacing of two-dimensional grating RG of adjacent scales 152, the non-measurement period does not overlap in the at least two heads, that is, the measurement beam of at least one head constantly irradiates scale 152. In these structures, at least three heads constantly face at least one scale 152, allowing position information in directions of three degrees of freedom to be measured.

Note that the number of scales, spacing between adjacent scales and the like may be different in the first grating group and the second grating group. In this case, in at least two heads facing the first grating group and at least two heads facing the second grating group, spacing between the heads (measurement beams), position and the like may be different.

Note that in the second embodiment described above, the position of heads 66a to 66d in the X-axis direction and the Y-axis direction are calculated from the position of the center of Y slide table 62 in the X-axis direction and the Y-axis direction of each of the pair of head units 60 calculated from the output of the four X linear encoders 96x and the four Y linear encoders 96y, based on the known positional relation of each head with respect to the center of Y slide table 62. That is, the encoder system was to be used for measuring the position of heads 66a to 66d in the X-axis direction and the Y-axis direction. However, the embodiment is not limited to this, and the encoder system and the like may be used to measure position information only in the Y-axis direction of heads 66a to 66d, since heads 66a to 66d (the pair of head units 60) can be moved only in the Y-axis direction. That is, in the second embodiment described above, the four X linear encoders 96x do not necessarily have to be provided. In this case, for heads 66a to 66d, on applying equations (2a) to (2d) described earlier, design values (fixed values) are used for p1 to p4 (X position), and for q1 to q4 (Y position), values calculated from the output of the four linear encoders 96y are used. Note that in the case the affine transformation relation is not used, on measuring position information in the Y-axis direction of substrate holder 34 by heads 66b and 66c, measurement information of the four linear encoders 96y is used, and on measuring position information in the X-axis direction of substrate holder 34 by heads 66a and 66d, measurement information of the four Y linear encoders 96y do not have to be used.

Note that in the second embodiment described above, while the plurality of scales 152 having a single two-dimensional grating RG (grating area) formed on each scale was used, the present invention is not limited to this, and at least one of the first grating group or the second grating group may include a scale 152 that has two or more grating areas formed apart in the X-axis direction.

Note that in the second embodiment described above, while the case has been described in which to measure and control the positions (X, Y, θz) of substrate holder 34 constantly by three heads, the first grating group and the second grating group including five scales 152 each having the same structure are arranged shifted by a predetermined distance in the X-axis direction, the embodiment is not limited to this, and one of the head units 60 and the other of the head units 60 may have heads (heads 66x, 66y) used for measurement of substrate holder 34 arranged differently in the X-axis direction, without the first grating group and the second grating group being shifted in the X-axis direction (the line of scales 152 arranged almost completely facing each other). Also in this case, the positions (X, Y, θz) of substrate holder 34 can constantly be measured and controlled by the three heads.

Note that in the second embodiment described above, while the case of using a total of four heads, heads 66a and 66b and heads 66c and 66d has been described, the embodiment is not limited to this, and five or more heads may also be used. That is, to one of the two heads each facing the first grating group and the second grating group, at least one redundant head may be added. This structure will be described in a third embodiment below.

Third Embodiment

Next, a third embodiment will be described, based on FIG. 18. Since the structure of the liquid crystal exposure apparatus according to the third embodiment is the same as the first and the second embodiments previously described except for the structure of a part of substrate encoder system 50, only the different points will be described below, and for elements having the same structure and function as the first and the second embodiments will have the same reference code as the first and the second embodiments, and the description thereabout will be omitted.

Figure 18:
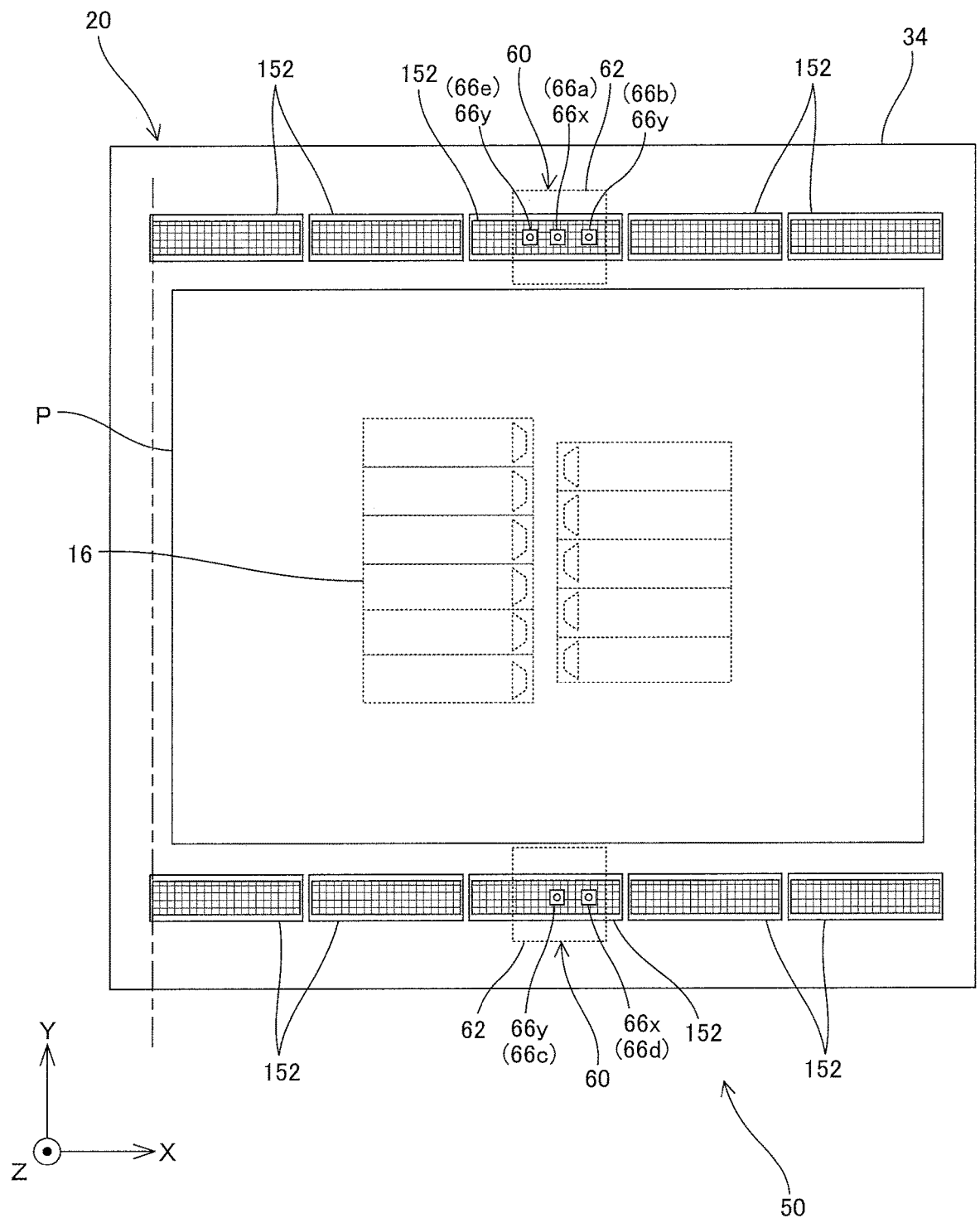
FIG. 18 is a planar view showing a substrate holder and a pair of head units of a substrate encoder system that a liquid crystal exposure apparatus according to a third embodiment has, along with a projection optical system.

FIG. 18 shows substrate holder 34 and the pair of head units 60 of substrate encoder system 50 according to the third embodiment in a planar view, along with projection optical system 16. In FIG. 18, to make the description comprehensive, illustration of encoder base 54 and the like is omitted. Also, in FIG. 18, along with head unit 60 (Y slide table 62) illustrated in a dotted line, illustration of X head 64x and Y head 64y provided on the upper surface of Y slide table 62 is also omitted.

With the liquid crystal exposure apparatus according to the third embodiment, as is shown in FIG. 18, in each of the areas on the +Y side and the −Y side of substrate holder 34 with the substrate mounting area in between, five scales 152 are arranged at a predetermined spacing in the X-axis direction. With the five scales 152 arranged on the +Y side of the substrate mounting area and the five scales 152 arranged on the −Y side, the spacing between adjacent scales 152 is the same, and the five scales 152 on the +Y side of the substrate mounting area and the five scales 152 on the −Y side are arranged at the same X position, facing each other. Accordingly, the position of the spacing between adjacent scales is located on almost the same straight line in the Y-axis direction that has a predetermined width.

To the lower surface (surface on the −Z side) of Y slide table 62 of one of the head units 60 positioned on the +Y side, a total of three heads, Y head 66y, X head 66x, and Y head 66y are fixed apart by a predetermined spacing (a distance larger than the spacing between adjacent scales 152) in the X-axis direction from the −X side, in a state each facing scale 152. To the lower surface (surface on the −Z side) of Y slide table 62 of the other head unit 60 positioned on the −Y side, Y head 66y and X head 66x are fixed apart by a predetermined spacing in the X-axis direction, in a state each facing scale 152. In the description below, for convenience of explanation, three heads that one of the head units 60 has will be referred to as head 66e, head 66a, and head 66b from the −X side, and Y head 66y and X head 66x that the other head unit 60 has will be referred to as head 66c and head 66d, respectively.

In this case, head 66a and head 66c are arranged at the same X position (on the same straight line in the Y-axis direction), and head 66b and head 66d are arranged at the same X position (on the same straight line in the Y-axis direction). Heads 66a, 66d and the two-dimensional gratings RG that face each head structure a pair of X linear encoders, and heads 66b, 66c, and 66e and the two-dimensional gratings RG that face each head structure three Y linear encoders.

With the liquid crystal exposure apparatus according to the third embodiment, the structure of other parts is similar to the liquid crystal exposure apparatus according to the second embodiment described earlier.

In the third embodiment, although the arrangement of scales 152 lined on the +Y side and the −Y side is not shifted in the X-axis direction, as long as the pair of head units 60 moves (or the Y position of substrate holder 4 is maintained at a position where the pair of head units 60 faces the line of scale 152) in the Y-axis direction synchronously with substrate holder 34, three heads of heads 66a to 66e constantly face scale 152 (two-dimensional grating RG) regardless of the X position of substrate holder 34.

The liquid crystal exposure apparatus according to the third embodiment described so far has a working effect equivalent to the liquid crystal exposure apparatus according to the second embodiment described earlier.

Note that in the third embodiment described above, the plurality of heads for measuring position information of substrate holder 34 can also be regarded to include one head 66a in addition to, e.g. heads 66e, 66b, 66c, and 66d necessary for switching of the heads, whose non-measurement period partly overlaps one head 66c of the four heads. And, in the third embodiment, on measuring position information (X, Y, θz) of substrate holder 34, of the five heads including the four heads 66e, 66b, 66c, and 66d and the one head 66c, measurement information is used of at least three heads irradiating at least one of the plurality of grating areas (two-dimensional grating RG) with a measurement beam.

Fourth Embodiment

Figure 19:
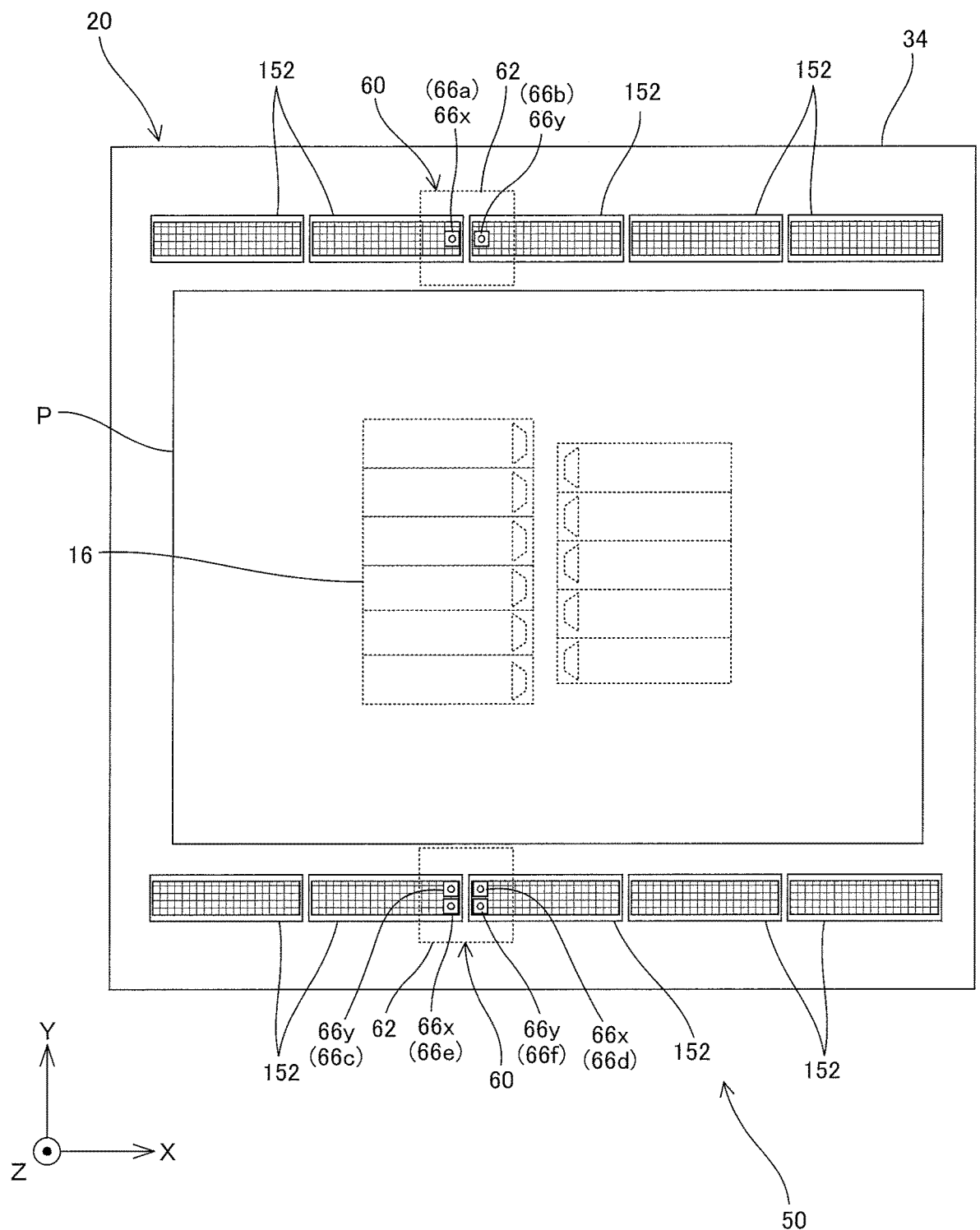
FIG. 19 is a view used to explain a characteristic structure of a liquid crystal exposure apparatus according to a fourth embodiment.

Next, a fourth embodiment will be described, based on FIG. 19. While the structure of the liquid crystal exposure apparatus according to the fourth embodiment is different from the structure of the liquid crystal exposure apparatus according to the second embodiment described earlier on the points that scales 152 lined in each of the areas on both the +Y side and the −Y side of the substrate mounting area of substrate holder 34 are arranged facing each other similarly as in the third embodiment, and that one of the head units 60 positioned on the −Y side has two each of X heads 66x and Y heads 66y similarly to the first embodiment, as is shown in FIG. 19, the structure of other parts is similar to the liquid crystal exposure apparatus according to the second embodiment.

To the lower surface (surface on the −Z side) of Y slide table 62 of one of the head units 60, X head 66x (hereinafter appropriately called head 66e) is provided arranged adjacent to Y head 66y (head 66c) on the −Y side, along with Y head 66y (hereinafter appropriately called head 66f) provided arranged adjacent to X head 66x (head 66d) on the −Y side.

With the liquid crystal exposure apparatus according to the embodiment, in a state when the pair of head units 60 is moving in the Y-axis direction (or when the Y position of substrate holder 34 is maintained at a position where the pair of head units 60 face the scales 152 lined), a case may occur when one of three heads 66a, 66c, and 66e (to be referred to as heads of a first group) and three heads 66b, 66d, and 66f (to be referred to as heads of a second group) do not face any of the scales due to substrate holder 34 moving in the X-axis direction, and when this occurs, the other of the heads of the first group and the heads of the second group face scale 152 (two-dimensional grating RG) without fail. That is, in the liquid crystal exposure apparatus according to the fourth embodiment, although the arrangement of scales 152 lined on the +Y side and the −Y side is not shifted in the X-axis direction, as long as the pair of head units 60 moves (or the Y position of substrate holder 4 is maintained at a position where the pair of head units 60 faces the line of scales 152) in the Y-axis direction, the positions (X, Y, θz) of substrate holder 34 can be measured regardless of the X position of substrate holder 34, by the three heads included in at least one of the heads of the first group and the heads of the second group.

Here, a case will be considered, for example, of restoring (re-start measurement of) the heads of the first group (heads 66a, 66c, and 66e) when the heads face scale 152 again, after heads 66a, 66c, and 66e no longer face any of the scales and have become non-measurable. In this case, at the point before measurement is re-started by the heads of the first group (heads 66a, 66c, and 66e), the positions (X, Y, θz) of substrate holder 34 is being continuously measured and controlled by the heads of the second group (heads 66b, 66d, and 66f). Therefore, main controller 90, as is shown in FIG. 19, at the point when the pair of head units 60 crosses over adjacent two scales 152 arranged on each of the +Y side and the −Y side and the heads of the first group and the heads of the second group face one and the other of the adjacent two scales 152, respectively, calculates the positions (X, Y, θz) of substrate holder 34 by the method described in detail in the second embodiment based on measurement values of the heads of the second group (heads 66b, 66d, and 66f), and by substituting the positions (X, Y, θz) of the substrate holder into the formula of affine transformation described earlier, initial values of the heads of the first group (heads 66a, 66c, and 66e) are calculated and set at the same time. This allows the heads of the first group to be restored and to re-start measurement and control of the position of substrate holder 34 with these heads easily.

With the liquid crystal exposure apparatus according to the fourth embodiment described so far, the apparatus exhibits a working effect equivalent to the liquid crystal exposure apparatus according to the second embodiment described earlier.

Modified Example of the Fourth Embodiment

This modified example describes a case when a head unit having an identical structure (or a structure symmetrical in the vertical direction of the page surface) as one of the head units 60 is used as the other head unit 60 positioned on the +Y side, in the liquid crystal exposure apparatus according to the fourth embodiment.

In this case, similarly to the description above, eight heads are grouped into four heads each being arranged on the same straight line in the Y-axis direction; heads of a first group, and heads of a second group.

A case will be considered of restoring the heads of a first group and re-starting measurement with these heads when the heads face scale 152 again, after the heads of the first group no longer face any of the scales and can no longer perform measurement.

In this case, at the point before measurement is re-started by the heads of the first group, the positions (X, Y, θz) of substrate holder 34 are being continuously measured and controlled by three heads of the heads of the second group. Therefore, main controller 90, as is described earlier, at the point when the pair of head units 60 crosses over adjacent two scales 152 arranged on each of the +Y side and the −Y side and the heads of the first group and the heads of the second group face one and the other of the adjacent two scales 152, respectively, calculates initial values of each of the heads of the first group, however, in this case, the main controller cannot calculate the initial values of all four heads of the first group at the same time. This is because if the heads to be restored for measurement were three (the number of X heads and Y heads added), when the initial values of the measurement values of the three heads are set in the procedure described earlier, by solving the simultaneous equations described earlier using the initial values as measurement values C1, C2, C3 and the like, the positions (X, Y, θ) of the substrate holder is uniquely decided, which causes no problems in particular. However, simultaneous equations using the affine transformation relation that can uniquely decide the positions (X, Y, θ) of the substrate holder using measurement values of four heads cannot be conceived.

Therefore, in the modified example, the first group to be restored is to be grouped into two groups, each having three heads including different heads and the initial values are calculated and set simultaneously for the three heads for each group in the method described earlier. After the initial values have been set, the measurement values of the three heads of either of the groups may be used for position control of substrate holder 34. Position measurement of substrate holder 34 by the heads of the group not used for position control may be executed in parallel with position control of substrate holder 34. Note that the initial values of each head of the first group to be restored can be sequentially calculated individually, by the method described earlier.

Note that the structures described so far in the first to fourth embodiments can be changed as appropriate. In mask encoder system 48 and substrate encoder system 50 of the first embodiment described above, the arrangement of encoder heads and scales may be reversed. That is, X linear encoder 92x and Y linear encoder 92y for obtaining position information of mask holder 40 may be structured so that encoder heads are attached to mask holder 40 and scales are attached to encoder base 43. Also, X linear encoder 94x and Y linear encoder 94y for obtaining position information of substrate holder 34 may have encoder heads attached to substrate holder 34 and scales attached to Y slide table 62. In this case, the encoder heads attached to substrate holder 34 may be arranged along the X-axis direction in a plurality of numbers, and are preferably structured switchable with one another. Also, the encoder heads provided at substrate holder 34 may be made movable and sensors to measure position information of the encoder heads may be provided, and the scales may be provided at encoder base 43. In this case, the scales provided at encoder base 43 are fixed. Similarly, X linear encoder 96x and Y linear encoder 96y for obtaining position information of Y slide table 62 may have scales attached to Y slide table 62 and encoder heads attached to encoder base 54 (apparatus main section 18). In this case, the encoder heads attached to encoder base 54 may be arranged along the Y-axis direction in a plurality of numbers, and are preferably structured switchable with one another. In the case the encoder heads are fixed to substrate holder 34 and encoder base 54, the scales fixed to Y slide table 62 may be used in common.

Also, in substrate encoder system 50, while the case has been described where a plurality of scales 52 are fixed extending in the X-axis direction on the substrate stage device 20 side and a plurality of scales 56 are fixed extending in the Y-axis direction on the apparatus main section 18 (encoder base 54) side, the substrate encoder system is not limited to this, and a plurality of scales extending in the Y-axis direction may be fixed on the substrate stage device 20 side and a plurality of scales extending in the X-axis direction may be fixed on the apparatus main section 18 side. In this case, head unit 60 is moved in the X-axis direction while substrate holder 34 is being moved in exposure operation and the like of substrate P.

Also, while the case has been described in which in mask encoder system 48, threes scales 46 are arranged separate in the X-axis direction, and in substrate encoder system 50, two scales 52 are arranged separate in the Y-axis direction and five scales 56 are arranged separate in the X-axis direction, the number of scales is not limited to this, and may be appropriately changed according to the size of mask M and substrate P, or movement strokes. Also, the plurality of scales may not necessarily have to be arranged separate, and a longer single scale (in the case of the embodiment above, a scale about three times the length of scale 46, a scale about two times the length of scale 52, and a scale about five times the length of scale 56) may be used. Also, in a scale group (row of scales) in which a plurality of scales arranged in the X-axis direction is continuously arranged with gaps of a predetermined spacing in between on substrate holder 34, the length in the X-axis direction of one scale (pattern for X-axis measurement) may be a length that can be continuously measured only by a length of one shot area (the length in which a device pattern is irradiated and formed on a substrate when exposure is performed while moving the substrate on the substrate holder in the X-axis direction). This makes position measurement (position control) of substrate P (substrate holder) during scanning exposure easy, since relay control of heads with respect to the plurality of scales does not have to be performed during the scanning exposure of one shot area. Also, a plurality of scales having different lengths may be used, and the number of scales structuring the grating section does not matter, as long as each of the grating sections includes a plurality of grating areas arranged side by side in the X-axis direction or the Y-axis direction.

Also, in the case of arranging a scale group (row of scales) in which a plurality of scales arranged in the X-axis direction is continuously arranged with gaps of a predetermined spacing in between on substrate holder 34 in a plurality of rows at different positions (e.g. a position on one side (+Y side) and a position on the other side (−Y side) with respect to projection optical system 16) separate from each other in the Y axis direction, a structure may be employed so that the plurality of scale groups (plurality of rows of scales) can be used differently depending on arrangement of shots (shot map) on the substrate. For example, by making the whole length of the plurality of rows of scales different from one another between the rows of scales, the scales are applicable to different shot maps, and are also applicable to changes in the number of shot areas formed on the substrate, as in the case of a four-piece setting and the case of a six-piece setting. Also, the scales arranged on one side of projection optical system 16 and the scales arranged on the other side may have different lengths. Also, along with this arrangement, if position of gaps of each row of scales are made to be at different positions in the X-axis direction, the heads corresponding to each of the plurality of rows of scales do not move off away from the measurement range simultaneously, which allows the number of sensors considered as an undefined value in linkage process to be reduced and the linkage process to be performed with high precision.

Also, in the first embodiment described above, while the case has been described where X scales and Y scales are formed independently on the surface of each of the scales 46, 52, and 56, the embodiment is not limited to this, and a scale having a two-dimensional grating formed may be used, similarly to the second or fourth embodiments described earlier. In this case, an XY two-dimensional head can also be used as the encoder head. Also, while the case has been described where the encoder system of a diffraction interference method is used, the encoder is not limited to this, and other encoders such as the so-called pick-up system or a magnetic system may also be used, and the so-called scan encoder whose details are disclosed in, for example, U.S. Pat. No. 6,639,686 may also be used. Also, position information of Y slide table 62 may be obtained by a measurement system other than the encoder system (an optical interferometer system).

Note that in the second to fourth embodiments and the modified example (hereinafter shortly referred to as the fourth embodiment) described above, while the case has been described in which at least four heads are provided, in such a case, the number of scales 152 structuring the grating section does not matter, as long as the grating section includes a plurality of grating areas arranged side by side in the first direction. The plurality of grating areas does not necessarily have to be arranged on both one side and the other side in the Y-axis direction with substrate P of substrate holder 34 in between, and may be arranged only on one side.

To continuously control the positions (X, Y, θz) of substrate holder 34 during the exposure operation of substrate P, the following conditions need to be satisfied.

That is, while a measurement beam of one head of the at least four heads moves off of the plurality of grating areas (two-dimensional grating RG described earlier), along with at least the three heads remaining irradiate at least one of the plurality of grating areas with the measurement beams, by movement of substrate holder 34 in the X-axis direction (the first direction), the one head described above whose measurement beam moves off of the plurality of grating areas is switched in the at least four heads described above. In this case, the at least four heads include; two heads whose positions (irradiation positions) of the measurement beams in the X-axis direction (the first direction) are different from each other, and two heads whose positions of the measurement beams in the Y-axis direction (the second direction) are different from at least one of the two heads along with positions (irradiation positions) of the measurement beams in the X-axis direction (the first direction) being different from each other, and the two heads irradiate measurement beams in the X-axis direction at a spacing wider than the spacing of a pair of adjacent grating areas of the plurality of grating areas.

Note that the grating areas (two-dimensional grating RG) arranged side by side in the X-axis direction may be arranged in the Y-axis direction in three or more rows. In the fourth embodiment described above, instead of the five scales 152 on the −Y side, a structure may be employed in which two rows of grating areas (two-dimensional gratings RG) adjacent in the Y-axis direction are provided, consisting of 10 grating areas (two-dimensional gratings RG) having an area which is half of each of the five scales 152 in the Y-axis direction, and heads 66e and 66f can be made to face two-dimensional grating RG at one of the rows, and heads 66c and 66d can be made to face two-dimensional grating RG at the other of the rows. Also, in the modified example of the fourth embodiment described above, also for the five scales 152 on the +Y side, a structure may be employed in which two rows of grating areas (two-dimensional gratings RG) adjacent in the Y-axis direction are provided, consisting of 10 grating areas similar to the description above, and a pair of heads can be made to face two-dimensional grating RG at one of the rows, and the remaining pair of heads can be made to face two-dimensional grating RG at the other of the rows.

Note that in the second to fourth embodiments described above, when substrate holder 34 moves in the X-axis direction (the first direction), it is important to set position or spacing, or position and spacing and the like of at least one of scales and heads, so that at least among the four heads mutually, measurement beams not being irradiated on (move off of the grating areas of) any of the two-dimensional grating RG, that is, measurement with the heads being non-measurable (non-measurement section) does not overlap for any two heads. For example, in a scale group (row of scales) in which a plurality of scales arranged in the X-axis direction is continuously arranged with gaps of a predetermined spacing in between on substrate holder 34, the distance between the plurality of scales (in other words, the length of gap), the length of one scale, and two heads (heads arranged opposed to each other in one head unit 60, e.g. two heads 66x as is shown in FIG. 5) that relatively move with respect to the row of scales are arranged to satisfy a relation of "length of one scale>distance between heads arranged opposed to each other>distance between scales." This relation is satisfied not only by the scales provided on substrate holder 34 and the corresponding head units 60, but also by scales 56 provided on encoder base 54 and the corresponding head units 60. Also, in each of the embodiments described above (e.g., refer to FIG. 5), while the pair of X heads 66x and the pair of Y heads 66y are each arranged lined in the X-axis direction to form pairs (X heads 66x and Y heads 66y are arranged at the same position in the X-axis direction), the pairs may be arranged so that the heads are relatively shifted in the X-axis direction. Also, in a scale group (row of scales) in which a plurality of scales arranged in the X-axis direction is continuously arranged with gaps of a predetermined spacing in between on substrate holder 34, while the length of the scale was the same for each of the scales continuously arranged in the embodiment above, scales having a length different from one another may be continuously arranged. For example, in a row of scales on substrate holder 34, the scales arranged in the center may be physically longer than the scales (scales arranged at each edge in the row of scales) arranged at both ends in the X-axis direction.

Note that in the second and the fourth embodiment described above, instead of each X head 66x measuring position information of substrate holder 34, an encoder head (XZ head) whose measurement direction is in the X-axis direction and the Z-axis direction may be used, together with an encoder head (YZ head) whose measurement direction is in the Y-axis direction and the Z-axis direction. As these heads, a sensor head having a structure similar to the displacement measurement sensor head disclosed in U.S. Pat. No. 7,561,280 can be used. In such a case, on switching and linkage process of the heads described earlier, adding to the linkage process performed to secure continuity of measurement results of the position of substrate holder 34 in directions of three degrees of freedom (X, Y, θz) in the XY plane by performing a predetermined calculation using measurement values of three heads used for position control of substrate holder 34 before switching, main controller 90 may also perform the linkage process to secure continuity of measurement results of the position of substrate holder 34 in the remaining directions of three degrees of freedom (Z, θx, θy) by a similar method described earlier. Specifically, taking the second embodiment representatively as an example, main controller 90 may acquire correction information for controlling the movement of substrate holder 34 in the remaining directions of three degrees of freedom (Z, θx, θy) using one head whose measurement beam moves off of one two-dimensional grating RG (grating area) and moves to irradiate another two-dimensional grating RG (grating area) of the four heads 66a, 66b, 66c, and 66d, based on measurement information in the Z-axis direction (a third direction) by the remaining three heads or position information of substrate holder 34 in the remaining directions of three degrees of freedom (Z, θx, θy) measured by the remaining three heads.

Note that in the second and the fourth embodiment, while the initial value of another head to be switched is to be set when a measurement beam moves off of one scale and moves to irradiate another scale, the embodiment is not limited to this, and correction information for controlling the substrate holder may be acquired using another head, such as correction information of the measurement values of another head. In the correction information to control the movement of the substrate holder using another head, the initial value is naturally included, but the information is not limited to this, and as long as the information may be used so that the another head can start the measurement again, the information may also be an offset value from the values to be measured after re-starting the measurement.

Also, in the first to fourth embodiments described above, the XZ head described earlier may be used instead of each X head of mask encoder system 48, along with using the YZ head described earlier instead of each Y head. Or, in the first to fourth embodiments described above, mask encoder system 48 may be structured so that a plurality of heads can move relatively with respect to scales 46 in the Y-axis direction, similar to the encoder for position measurement of substrate holder 34 of substrate encoder system 50. Also, instead of scales 46, a scale on which a two-dimensional grating RG similar to scale 152 described earlier is formed may be used.

Similarly, in the first to fourth embodiments described above, the XZ head described earlier may be used instead of each X head 64x, along with using the YZ head described earlier instead of each Y head 64y. In such a case, also instead of scales 56, a scale may be used, having a two-dimensional grating RG formed similar to scale 152 described earlier. In such a case, with a pair of XZ heads and a pair of YZ heads and an encoder system that these heads can face, position information of at least one of rotation (θz) and tilt (at least one of θx and θy) of a plurality of heads 66x and 66y may be measured.

Note that while a grating is formed (the surface is a grating surface) on the surface of scales 46, 52, 56, 152 and the like, for example, a cover member (such as glass or a thin film) that covers the grating may be provided so that the grating surface is provided inside the scale.

Note that in the description so far, while the case has been described in which the measurement direction within the XY plane of each head that the mask encoder system and the substrate encoder system are equipped with is the X-axis direction or the Y-axis direction, the embodiments are not limited to this, and in the case of the second to fourth embodiments, instead of the two-dimensional grating RG, a two-dimensional grating may be used that intersects in the X-axis direction and the Y-axis direction and also has periodic directions in two directions (called αdirection and β direction for convenience) orthogonal to each other, and corresponding to this, as each head described earlier, heads with measurement directions in the αdirection (and the Z-axis direction) or the β direction (and the Z-axis direction) may be used. Also, in the first embodiment described earlier, instead of each X scale and Y scale, for example, a one-dimensional grating whose periodic direction is in the αdirection or β direction may be used, and corresponding to this, as each head described earlier, heads with measurement directions in the αdirection (and the Z-axis direction) or the (direction (and the Z-axis direction) may be used.

Note that in the second to fourth embodiments described above, the first grating group may be structured by the row of X scales described earlier and the second grating group may be structured by the row of Y scales described earlier, and corresponding to this, a plurality of X heads (or XZ heads) that can face the X scales may be arranged at a predetermined spacing (spacing wider than the spacing between adjacent X scales) along with a plurality of Y heads (or YZ heads) that can face the Y scales being arranged at a predetermined spacing (spacing wider than the spacing between adjacent Y scales).

Note that in the first to fourth embodiments described above, as each scale arranged side by side in the X-axis direction or the Y-axis direction, a plurality of scales of different lengths may naturally be used. In this case, when two or more rows of scales having the same or orthogonal periodic directions are provided side by side, scales may be chosen with lengths that can be set so that the spacing between the scales do not overlap one another. That is, the arrangement spacing of the space between the scales structuring one row of scales does not have to be an equal spacing.

Note that in the first to fourth embodiments described above, while encoders for movable heads only have to measure position information of at least the movement direction (the Y-axis direction in the embodiments described above), the encoders may also measure position information of at least one direction (at least one of X, Z, θx, θy, and θz) different from the movement direction. For example, position information in the X-axis direction of a head (X head) whose measurement direction is in the X-axis direction may also be measured, and with this X information and measurement information of the X head, position information in the X-axis direction may be obtained. However, with the head (Y head) whose measurement direction is in the Y-axis direction, position information in the X-axis direction orthogonal to the measurement direction does not have to be used. Similarly, with the X head, position information in the Y-axis direction orthogonal to the measurement direction does not have to be used. In short, position information of substrate holder 34 in the measurement direction may be obtained, measuring position information in at least one direction different from the measurement direction of the heads, and by using this measurement information and measurement information of the heads. Also, for example, position information (rotation information) of the movable head in the θz direction may be measured using two measurement beams having different positions in the X-axis direction, and by using this rotation information with measurement information of the X head and the Y head, position information in the X-axis direction and the Y-axis direction may be obtained. In this case, by arranging two of one of the X heads and Y heads and one of the other of the X heads and Y heads so that the two heads having the same measurement direction are not arranged at the same position in the direction orthogonal to the measurement direction, position information in the X direction, the Y direction, and the θz direction can be measured. The other head preferably irradiates a position different from the two heads with the measurement beam. Moreover, if the heads of encoders for movable heads is an XZ head or a YZ head, by arranging, for example, two of one of the XZ heads and the YZ heads and the other of the XZ heads and the YZ heads so that the heads are not located on the same straight line, not only Z information but also position information (tilt information) in the θx direction and the θy direction can be measured. Position information in the X-axis direction and the Y-axis direction may be obtained by at least one of the position information in the θx direction and the θy direction and the measurement information of the X heads and Y heads. Similarly, with XZ heads or YZ heads, position information in a direction different from the Z-axis direction of the movable heads may also be measured, and position information in the Z-axis direction may be obtained with this measurement information and measurement information of the movable heads.

Note that when the scales of the encoders measuring the position information of the movable heads is a single scale (grating area), XYθz and Zθxθy may be measured by three heads, however, in the case a plurality of scales (grating areas) are arranged separately, two each of X heads and Y heads, or two each of XZ heads and YZ heads should be arranged and the spacing in the X-axis direction should be set so that the non-measurement period among the four heads do not overlap one another. While this explanation was made on the premise that the grating area is arranged parallel to the XY plane, this also can be applied similarly to a scale having a grating area parallel to the YZ plane.

Also, in the first to fourth embodiments described above, while the encoder was used as the measurement device for measuring position information of the movable heads, devices other than the encoder, such as, for example, an interferometer, a laser distance meter, or an ultrasonic range meter may also be used. In this case, for example, a reflection surface may be provided at the movable head (or its holding section) and a measurement beam parallel to the Y-axis direction should be irradiated on the reflection surface. Especially when the movable head is moved only in the Y-axis direction, the reflection surface does not have to be large, which makes it easy to locally air-condition the optical path of the interferometer beam to reduce air fluctuation.

Also, in the first to fourth embodiments described above, while the movable heads that irradiate the scales of the substrate holder with measurement beams are arranged one each in the Y-axis direction on both sides of the projection system, a plurality of movable heads may each be arranged. For example, if adjacent movable heads (measurement beams) are arranged so that the measurement period of a plurality of movable heads partly overlaps in the Y-axis direction, the plurality of movable heads can continue to measure position information even when the substrate holder moves in the Y-axis direction. In this case, linkage process becomes necessary among the plurality of movable heads. Therefore, measurement information of a plurality of heads arranged only on one side of the ±Y side of the projection system irradiating measurement beams on at least one scale may be used to acquire correction information related to another head whose measurement beam is within the scale, or measurement information of not only the heads arranged on only one side of the ±Y side but at least one head arranged on the other side may also be used. In short, of the plurality of heads each arranged on the ±Y side, measurement information of at least three heads irradiating measurement beams on the scale may preferably be used.

Also, with substrate encoder system 50 of the first to fourth embodiments described above, while a plurality of scales (grating areas) is arranged separately in the scanning direction (the X-axis direction) in which substrate P is moved on scanning exposure, along with a plurality of heads being movable in the stepping direction (the Y-axis direction), conversely, the plurality of scales may be arranged in the stepping direction (the Y-axis direction) along with the plurality of heads being movable in the scanning direction (the X-axis direction).

Also, in the first to fourth embodiments described above, the heads of mask encoder system 48 and encoder system 50 do not necessarily have to have the whole optical system that irradiates a scale with a beam from the light source, and may have a part of the light source, such as for example, only the light-emitting section.

Also, in the second to fourth embodiments described above, the heads of the pair of head units 60 are not limited to the arrangement in FIG. 17 (X heads and Y heads are arranged on the ±Y sides, respectively, and the arrangement of the X head and Y head is opposite in the X-axis direction on one side and the other side of the ±Y sides), and for example, X heads and Y heads may be arranged on the ±Y sides, respectively, and on one side and the other side of the ±Y sides, the arrangement of the X head and Y head may be the same in the X-axis direction. However, in the case the X position of two Y heads is the same, when measurement of one of the two X heads is cut off, then the θz information can no longer be measured, therefore, the X position of the two Y heads should preferably be different.

Also, in the first to fourth embodiments described above, when the scales (scale members, grating section) irradiated with the measurement beams from the heads of the encoder system are provided at the projection optical system 16 side, the scales provided are not limited to only a part of apparatus main section 18 (frame member) supporting projection optical system 16, and may be provided at the barrel part of projection optical system 16.

Figure 12A:
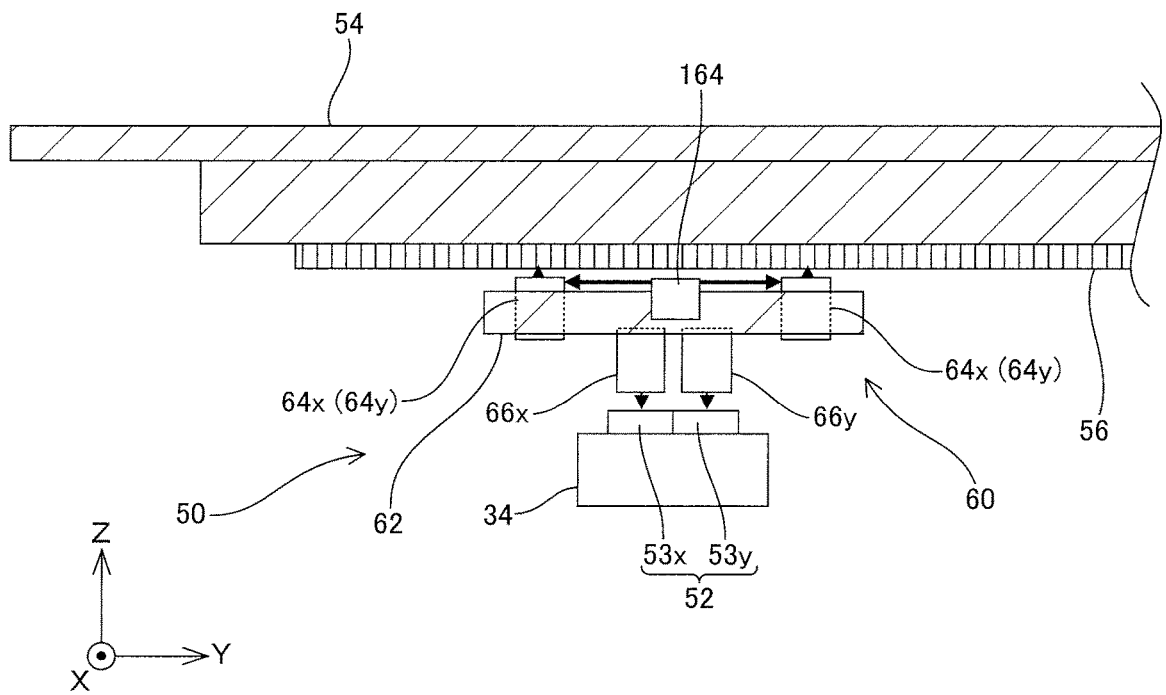
FIGS. 12A and 12B are views (No. 1 and No. 2) used to explain a structure of a measurement system for obtaining the distance between a pair of heads.
Figure 12B:
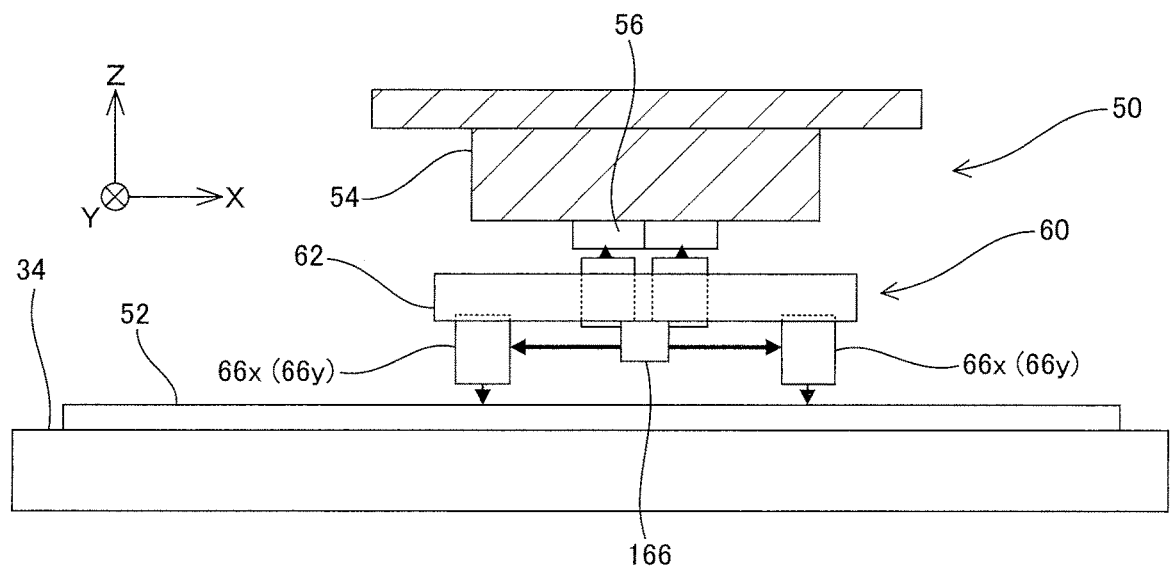

Also, as is shown in FIGS. 12A and 12B, the distance between the pairs of encoder heads that head unit 60 has (namely, each of the pair of X heads 64x, the pair of X heads 66x, the pair of Y heads 64y, and the pair of Y heads 66y) may be measured with sensors 164 and 166, and the output of substrate encoder system 50 may be corrected using the measurement values. While the type of sensors 164 and 166 is not limited in particular, a laser interferometer or the like can be used. In substrate encoder system 50, while the linkage process of the outputs of the pair of encoder heads is performed as is described above, in this linkage process, the premise is that the spacing between the pair of encoder heads is known and is invariable. Therefore, while Y slide table 62 to which each of the heads is attached is formed of a material that is scarcely affected by thermal expansion or the like, as in the modified example, even if Y slide table 62 is deformed (spacing between the pair of encoder heads change) due to measuring the spacing between the encoder heads, position information of substrate P can be obtained with high precision. Similarly, also in mask encoder system 48, the distance between the pair of encoder heads (namely, the pair of X heads 49x and the pair of Y heads 49y) may be calculated, and the output of mask encoder system 48 may be corrected using the measurement values. Also, relative positional relation may be measured for all heads (a total of eight heads in the embodiment) that head unit 60 has (the pair of heads 66x and the pair of heads 66y facing downward, and the pair of heads 64x and the pair of heads 64y facing upward), and the measurement values may be corrected.

Also, a calibration operation may be performed as appropriate (each time substrate exchange is performed) to measure the distance between the pairs of encoder heads that head unit 60 has (namely, each of the pair of X heads 64x, the pair of X heads 66x, the pair of Y heads 64y, and the pair of Y heads 66y) may be calculated, as is described above. Also, aside from the calibration point for performing measurement of the spacing between the heads described above, a calibration point may be provided to perform origin positioning of the output of each of mask encoder system 48 and substrate encoder system 50. The mark used for positioning on performing the origin positioning may be arranged on an extended line (outer side) of the plurality of scales 46 and 52, or may be formed within scales 46 and 52.

Figure 13A:
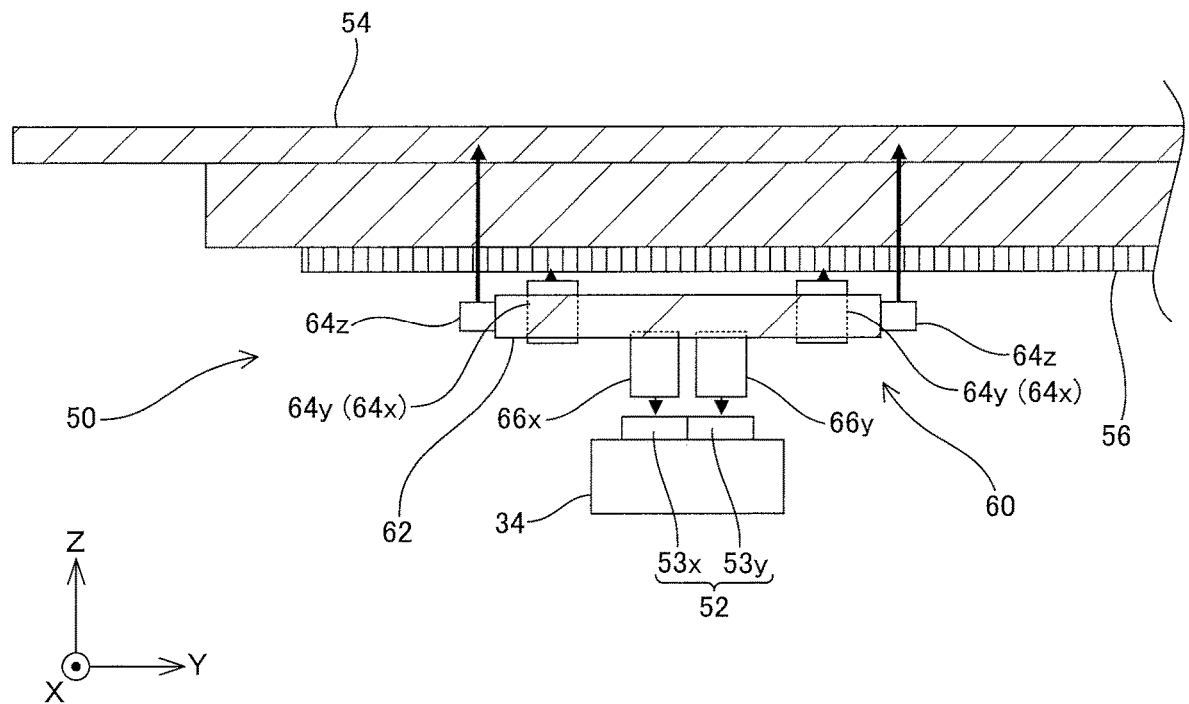
FIGS. 13A and 13B are views (No. 1 and No. 2) used to explain a structure of a measurement system for obtaining tilt amount of a Y slide table.

Also, tilt (tilt in the θx and θy directions) amount of Y slide table 62 to which each of the encoder heads 64x, 64y, 66x, and 66y is attached with respect to the horizontal plane may be obtained, and the output of substrate encoder system 50 may be corrected according to the tilt amount (namely, inclining amount of the optical axis of each of the heads 64x, 64y, 66x, and 66y). As the measurement system, as is shown in FIG. 13A, a measurement system can be used in which a plurality of Z sensors 64z is attached to Y slide table 62, and the tilt amount of Y slide table 62 is obtained with encoder base 54 (or upper mount section 18A) serving as a reference.

Figure 13B:
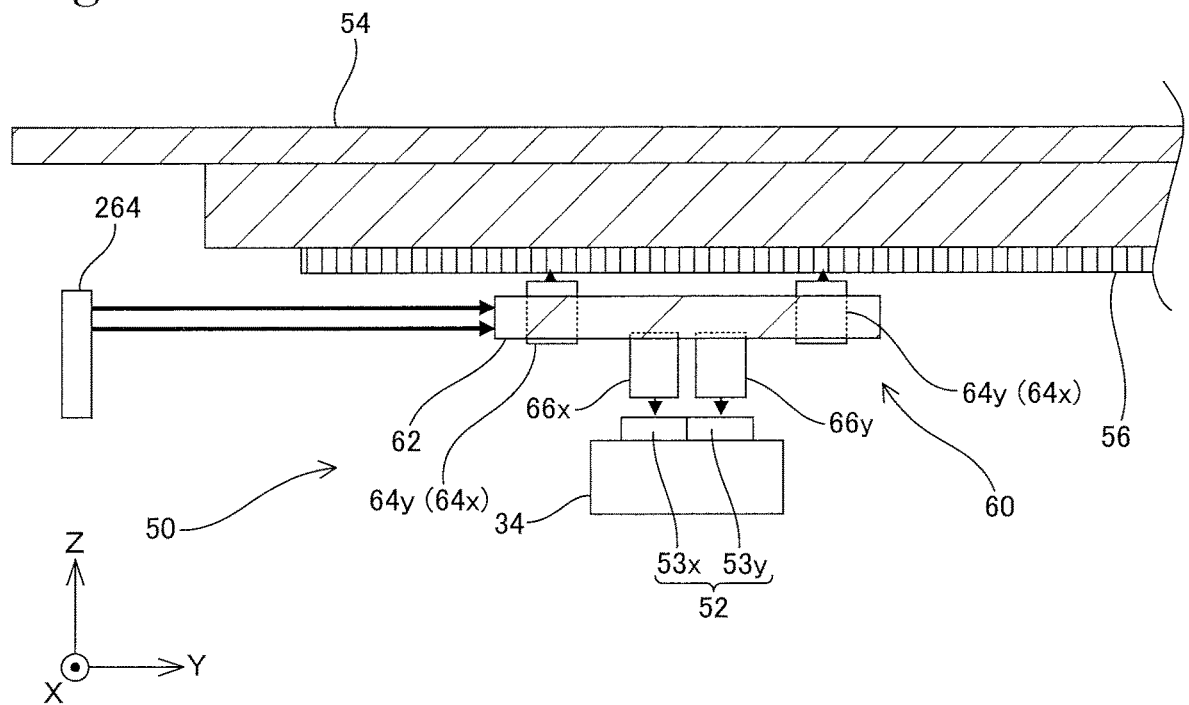

Z sensor 64z may be a laser interferometer, a TOF sensor, or a sensor used for measuring distance. Also, as is shown in FIG. 13B, a two-axis laser interferometer 264 may be provided so that tilt amount of Y slide table 62 (amount of inclination in the θx and θy directions) and rotation amount (rotation amount in the θz direction) may be obtained. Also, tilt amount of each of the heads 64x, 64y, 66x, and 66y may be measured individually, using a gyro sensor or the like.

Also, while encoder base 54 having the plurality of scales 56 was structured to be directly attached to the lower surface of upper mount section 18a (optical surface plate), the structure is not limited to this, and a predetermined base member may be arranged in a suspended manner in a state arranged separate to the lower surface of upper mount section 18a, and encoder base 54 may be attached to the base member.

Also, substrate stage device 20 only has to drive at least substrate P along a horizontal plane in long strokes, and in some cases, does not have to perform fine positioning in directions of six degrees of freedom. The substrate encoder system according to each of the embodiments described above can be suitably applied, even to such a two-dimensional stage device.

Also, while the linkage process of heads in the first embodiment described above was performed using the output (measurement information) itself of the heads, the embodiment is not limited to this, and the linkage process may be performed using position information of the measurement target (mask stage 40, head unit 60, substrate holder 34) obtained based on the output of the heads.

Also, in the embodiment above, while the two rows of scales were formed by the plurality of scales 46 provided on one side and the other side of mask M in the Y-axis direction, the embodiment is not limited to this, and the row of scales may be a single row (a structure in which scales 46 are provided only on one side of mask M in the Y-axis direction). In this case, while only one head unit 44 has to be provided, the number and arrangement of the plurality of heads that the one head unit 44 has should be set so that even when a measurement beam from a part of the plurality of heads moves off of the scales, at least three heads of the remaining heads constantly face the scales. Also, each of the heads should be arranged so that in the at least three heads, a head whose measurement direction is different is included (so that two X heads and one Y head, or one X head and two Y heads constantly face the scales). Similarly with substrate holder 34, the row of scales may be a single row. In this case, only one head unit 60 has to be provided, corresponding to the single row of scales. Specifically, in FIG. 18, a structure may be employed in which five scales 152 are arranged at a predetermined spacing in the X-axis direction only on the +Y side of substrate P, along with all heads 66a to 66e fixed to one head unit 60 arranged above scales 152 so that all the heads can face scales 152.

Also, while mask stage device 14 in the embodiment described above employed a structure of moving in long strokes only in the X-axis direction, the embodiment is not limited to this, and the stage device may be structured to move also in predetermined long strokes in the Y-axis direction, along with the X-axis direction. In this case, similarly to head unit 60 (refer to FIG. 4A and the like) used for position measurement of the substrate, head unit 44 (refer to FIG. 2B) is preferably structured so that head unit 44 can move synchronously with mask holder 40 in the Y-axis direction so that the measurement beams from heads 49x and 49y do not move off from the corresponding scales 47x and 47y. In this case, position information of head unit 44 within the XY plane should be measured by an encoder system having a structure (including linkage process of heads between scales) similar to the position measurement system of head unit 60.

Also, in the embodiment described above, while scales 52 extending in the X-axis direction were fixed to substrate holder 34 and scales 56 extending in the Y-axis direction were fixed to encoder base 54, the directions may be opposite. Specifically, an example is given in which a structure may be employed where scales extending in the Y-axis direction are fixed to substrate holder 34, and head unit 60 moves in long strokes in the X-axis direction synchronously with substrate holder 34 at the time of scanning operation. In this case, at the time of Y stepping operation of substrate holder 34, head unit 60 is to be in a stationary state.

Also, in the embodiment described above, while the structure of providing scales 52 on substrate holder 34 is employed, the scales may be formed directly on substrate P on exposure processing. For example, the scales may be formed on scribe lines between shot areas. This allows measurement of scales formed on the substrate to be performed, and based on the results of position measurement, nonlinear component errors for each of the shot areas on the substrate can be obtained, and overlay accuracy upon exposure can also be improved, based on the errors.

Also, in the embodiment described above, while there is a case when head unit 60 is described to move synchronously with substrate holder 34, this means that head unit 60 is moved in a state where relative positional relation with respect to substrate holder 34 is basically maintained, and is not limited to the case in which head unit 60 and substrate holder 34 are moved in a state where positional relation, movement direction, and movement speed between head unit 60 and substrate holder 34 are strictly coincident.

Also, in substrate encoder system 50 according to each of the embodiments, scales used for substrate exchange may be provided at substrate stage device 20 or at another stage device to acquire position information of substrate stage device 20 moving to a substrate exchange position between the substrate loader, and heads facing downward (such as X head 66x) may be used to acquire position information of substrate stage device 20. Also, heads facing upward (such as X head 64x) may be used to measure scales used for substrate exchange provided at encoder base 54 and to acquire position information of substrate stage device 20. Or, position information of substrate stage device 20 may be acquired by providing heads used for substrate exchange at substrate stage device 20 or another stage device and measuring scales 56 or the scales used for substrate exchange. Note that the heads used for substrate exchange may be provided movable or fixed, with respect to substrate stage device 20 or to the another stage device.

Also, in mask encoder system 48 according to each of the embodiments, scales used for mask exchange may be provided at mask stage device 14 or at another stage device to acquire position information of mask stage device 14 moving to a mask exchange position between the mask loader, and head unit 44 may be used to acquire position information of mask stage device 14.

Note that in the first to fourth embodiments described above, while the substrate position measurement system was structured with Z-tilt position measurement system 98 and substrate encoder system 50, for example, the substrate position measurement system may be structured only by substrate encoder system 50 by using XZ, YZ heads instead of X, Y heads.

Also, in the first to fourth embodiments described above, separately from the pair of head units 60 of substrate encoder system 50, at least one head arranged away from head unit 60 in the X-axis direction may be provided. For example, movable head units the same as each of the head units 60 may be provided at the ±Y side with respect to the mark detection system (alignment system) arranged apart from projection optical system 16 in the X-axis direction that detects alignment marks of substrate P, and in the detection operation of substrate marks, position information of substrate holder 34 may be measured using the pair of head units arranged at the ±Y side of the mark detection system. In this case, it becomes possible to continue measurement of position information of substrate holder 34 by substrate encoder system 50 (another pair of head units), even if all measurement beams from the pair of head units 60 move off of scales 152 in the mark detection operation, and the degree of freedom on designing the exposure apparatus, such as the position of the mark detection system, can be increased. Note that by arranging the substrate position measurement system for measuring position information of substrate P in the Z-axis direction near the mark detection system, measurement of position information of substrate holder 34 by substrate encoder system 50 becomes possible also in the detection operation of the Z position of the substrate. Or, the substrate position measurement system may be arranged near projection optical system 16, and position information of substrate holder 34 may be measured with the pair of head units 60 in the detection operation of the Z position of the substrate. Also, in the embodiment, when substrate holder 34 is arranged at a substrate exchange position set away from projection optical system 16, the measurement beams of all heads of the pair of head units 60 move off of scales 152. Therefore, at least one head facing at least one scale of the plurality of scales 152 of substrate holder 34 arranged at the substrate exchange position may be provided, and position information of substrate holder 34 can be measured by substrate encoder system 50 also on the substrate exchange operation. Here, before substrate holder 34 reaches the substrate exchange position, or in other words, in the case the measurement beams of all heads of the pair of head units 60 move off of scales 152 before at least one head arranged at the substrate exchange position faces scale 152, at least one head may be added and arranged along the moving route of substrate holder 34 so that measurement of position information of substrate holder 34 by substrate encoder system 50 can be continued. Note that in the case of using the at least one head provided separately from the pair of head units 60, the linkage process described earlier may be performed using the measurement information of the pair of head units 60. Also, the position of the at least one head facing at least one scale of the plurality of scales 152 of substrate holder 34 arranged at the substrate exchange position described above may be fixed (a fixed type head), or may be provided movable (a movable type head) so that the measurement beam does not move off of the scale similarly to each of the embodiments described above.

Also, the illumination light may be an ultraviolet light such as an ArF excimer laser beam (wavelength 193 nm) or a KrF excimer laser beam (wavelength 248 nm), or a vacuum ultraviolet light such as an F2 laser beam (wavelength 157 nm). Also, as the illumination light, a harmonic wave may be used, which is a single-wavelength laser beam in the infrared or visual region oscillated from a DFB semiconductor laser or a fiber laser as vacuum ultraviolet light that is amplified by a fiber amplifier doped by, e.g. erbium (or both erbium and ytterbium), and then is subject to wavelength conversion into ultraviolet light using a nonlinear crystal. Also, a solid laser (wavelengths: 355 nm, 266 nm) may also be used.

Also, while the case has been described where projection optical system 16 is a projection optical system of a multiple lens method equipped with a plurality of optical systems, the number of projection optical systems is not limited to this, and one or more will be fine. Also, the projection optical system is not limited to the projection optical system of a multiple lens method, and may also be an Offner type projection optical system which uses a large mirror. Also, as projection optical system 16, a magnifying system or a reduction system may also be used.

Also, the exposure apparatus is not limited to the exposure apparatus for liquid crystals which transfers the liquid crystal display device pattern onto a square-shaped glass plate, and may also be widely applied to an exposure apparatus for manufacturing organic EL (Electro-Luminescence) panels, an exposure apparatus for manufacturing semiconductors, or to an exposure apparatus for manufacturing thin film magnetic heads, micromachines, and DNA chips. Also, the above embodiments can be applied not only to an exposure apparatus for manufacturing microdevices such as semiconductors, but also to an exposure apparatus that transfers a circuit pattern onto a glass substrate or a silicon wafer to manufacture a reticle or a mask used in an optical exposure apparatus, an EUV exposure apparatus, an X-ray exposure apparatus, and an electron-beam exposure apparatus.

Also, the object subject to exposure is not limited to a glass plate, and may also be other objects such as a wafer, a ceramic substrate, a film member, or a mask blanks. Also, in the case the exposure object is a substrate for a flat panel display, the thickness of the substrate is not limited in particular, and includes a film-like substrate (a sheet-like member having flexibility). Note that the exposure apparatus of the embodiment is especially effective in the case when the exposure object is a substrate whose length of a side or diagonal length is 500 mm or more.

Electronic devices such as liquid crystal display devices (or semiconductor devices) are manufactured through the steps such as; a step for performing function/performance design of a device, a step for making a mask (or a reticle) on the basis of this design step, a step for making a glass substrate (or a wafer), a lithography step for transferring a pattern of a mask (reticle) onto the glass substrate by the exposure apparatus and the exposure method described in each of the above embodiments, a development step for developing the glass substrate which has been exposed, an etching step for removing by etching an exposed member of an area other than the area where the resist remains, a resist removing step for removing the resist that is no longer necessary since etching has been completed, a device assembly step, and an inspection step. In this case, in the lithography step, because the device pattern is formed on the glass substrate by carrying out the exposure method previously described using the exposure apparatus of the embodiments described above, a highly integrated device can be manufactured with good productivity.

Note that the disclosures of U.S. Patent Application Publications and U.S. Patents related to the exposure apparatus and the like quoted in each of the embodiments above, in their entirety, are incorporated herein by reference as a part of the present specification.

INDUSTRIAL APPLICABILITY

As is described so far, the exposure apparatus and the exposure method of the present invention is suitable for performing exposure by irradiating and object with an illumination light in a lithography process. Also, the flat panel display manufacturing method of the present invention is suitable for producing flat panel displays.

REFERENCE SIGNS LIST

10 . . . liquid crystal exposure apparatus,
14 . . . mask stage device,
20 . . . substrate stage device,
34 . . . substrate holder,
40 . . . mask holder,
44 . . . head unit,
46 . . . scale,
48 . . . mask encoder system,
50 . . . substrate encoder system,
52 . . . scale,
56 . . . scale,
60 . . . head unit,
90 . . . main controller,
M . . . mask,
P . . . substrate.

The invention claimed is:

1. An exposure apparatus that irradiates an object with an illumination light via an optical system, the apparatus comprising:
a first movable body that is disposed below the optical system and holds the object;
a first drive system capable of moving the first movable body in a first direction and a second direction orthogonal to each other within a predetermined plane orthogonal to an optical axis of the optical system;
a second movable body that is disposed between the optical system and the first movable body in a third direction orthogonal to the first direction and to the second direction;
a measurement system that has a grating member with a plurality of grating areas disposed mutually spaced apart in the first direction and a plurality of heads each irradiating the grating member with a measurement beam, one of the grating member and the plurality of heads being provided at the first movable body, the other of the grating member and the plurality of heads being provided at the second movable body, the measurement system measuring first position information of the first movable body relative to the second movable body based on measurement information of a head, of the plurality of heads, that irradiates at least one of the plurality of grating areas with the measurement beam;
a second drive system capable of moving the second movable body in the second direction;
a frame member that supports the optical system;
a measurement device that measures second position information of the second movable body relative to the frame member in the second direction; and
a control system that controls a position of the first movable body relative to the frame member by controlling the first drive system based on position information including the first position information measured by the measurement system and the second position information measured by the measurement device, wherein
during movement of the first movable body relative to the second movable body in the first direction, the measurement beam of each of the plurality of heads moves off from one grating area of the plurality of grating areas and moves to irradiate another grating area adjacent to the one grating area.

2. The exposure apparatus according to claim 1, wherein in the measurement device, one of a scale member and a head member is provided at the second movable body and the other of the scale member and the head member is provided to face the second movable body, and the measurement device measures the second position information of the second movable body by irradiating the scale member with a measurement beam via the head member.

3. The exposure apparatus according to claim 2, wherein
the other of the scale member and the head member is provided at the frame member.

4. The exposure apparatus according to claim 2, wherein during the movement of the first movable body relative to the second movable body in the first direction, the head member faces the frame member.

5. The exposure apparatus according to claim 4, wherein during movement of the second movable body relative to the frame member in the second direction, the measurement beam of the head member moves off from one scale member of the scale members and moves to irradiate another scale member adjacent to the one scale member.

6. The exposure apparatus according to claim 5, wherein during the movement of the second movable body relative to the frame member in the second direction, the head faces the grating member.

7. A flat panel display manufacturing method, comprising:
exposing a substrate using the exposure apparatus according to claim 1; and
developing the substrate that has been exposed.

* * * * *